United States Patent
Suzuki et al.

(10) Patent No.: US 7,170,342 B2
(45) Date of Patent: Jan. 30, 2007

(54) LINEAR POWER AMPLIFICATION METHOD AND LINEAR POWER AMPLIFIER

(75) Inventors: Yasunori Suzuki, Yokohama (JP); Shinji Mizuta, Yokohama (JP); Tetsuo Hirota, Kanazawa (JP); Yasushi Yamao, Yokosuka (JP)

(73) Assignee: NTT DoCoMo, Inc., Tokyo (JP)

( * ) Notice: Subject to any disclaimer, the term of this patent is extended or adjusted under 35 U.S.C. 154(b) by 172 days.

(21) Appl. No.: 10/730,141

(22) Filed: Dec. 9, 2003

(65) Prior Publication Data

US 2004/0116083 A1  Jun. 17, 2004

(30) Foreign Application Priority Data

| Dec. 10, 2002 | (JP) | ............................ 2002-358604 |
| Feb. 6, 2003 | (JP) | ............................ 2003-029988 |
| Feb. 6, 2003 | (JP) | ............................ 2003-029992 |
| Mar. 24, 2003 | (JP) | ............................ 2003-079282 |
| Jul. 29, 2003 | (JP) | ............................ 2003-203127 |

(51) Int. Cl.
*H03F 1/30* (2006.01)
*H03F 3/66* (2006.01)

(52) U.S. Cl. ........................................ 330/149; 330/52
(58) Field of Classification Search ................ None
See application file for complete search history.

(56) References Cited

U.S. PATENT DOCUMENTS

| 6,472,934 B1 * | 10/2002 | Pehlke ........................ 330/10 |
| 6,549,067 B1 | 4/2003 | Kenington .................... 330/52 |
| 6,577,192 B2 * | 6/2003 | Maniwa et al. ............. 330/149 |
| 6,731,168 B2 * | 5/2004 | Hedberg et al. ............ 330/149 |

(Continued)

FOREIGN PATENT DOCUMENTS

CN    1349679 A    5/2002

(Continued)

OTHER PUBLICATIONS

Henri Girard, et al., "A New Baseband Linearizer for More Efficient Utilization of Earth Station Amplifiers Used for QPSK Transmission", IEEE Journal on Selected Areas in Communications, vol. SAC-1, No. 1, Jan. 1983, pp. 46-56.

(Continued)

*Primary Examiner*—Robert Pascal
*Assistant Examiner*—Krista Flanagan
(74) *Attorney, Agent, or Firm*—Oblon, Spivak, McClelland, Maier & Neustadt, P.C.

(57) ABSTRACT

A combined signal of a digital pilot signal and a digital transmission signal is applied to a digital predistorter (20), wherein it is added with odd-order distortions based on a power series model to generate a predistorted signal, then the predistorted signal is converted by a DA converter (31) to an analog signal, then the analog signal is upconverted by a frequency upconverting part (33) to a send frequency band, and the upconverted signal is output after being amplified by a power amplifier (37). A pilot signal component is extracted from the power amplifier output, then odd-order distortion components of the power series model are extracted by a digital predistorter control part (50) from the pilot signal component, and the odd-order distortions in the digital predistorter (20) are controlled to decrease the levels of the distortion components.

35 Claims, 31 Drawing Sheets

U.S. PATENT DOCUMENTS

| | | | |
|---|---|---|---|
| 6,853,246 B2* | 2/2005 | Bauder et al. | 330/149 |
| 6,934,341 B2* | 8/2005 | Sahlman | 375/297 |
| 2004/0189378 A1* | 9/2004 | Suzuki et al. | 330/52 |

FOREIGN PATENT DOCUMENTS

| | | |
|---|---|---|
| EP | 1 193 866 | 4/2002 |
| GB | 2 335 812 | 9/1999 |
| JP | 56-85909 | 7/1981 |
| JP | 1-117462 | 5/1989 |
| JP | 3-27605 | 2/1991 |
| JP | 6-86380 | 3/1994 |
| JP | 7-7333 | 1/1995 |
| JP | 10-327209 | 12/1998 |
| JP | 11-4123 | 1/1999 |
| JP | 11-17462 | 1/1999 |
| JP | 11-103218 | 4/1999 |
| JP | 11-154880 | 6/1999 |
| JP | 2000-196367 | 7/2000 |
| JP | 2000-209295 | 7/2000 |
| JP | 2001-268150 | 9/2001 |
| JP | 2002-57533 | 2/2002 |
| JP | 2002-64340 | 2/2002 |
| WO | WO 00/48308 | 8/2000 |
| WO | WO 00/60732 | 10/2000 |

OTHER PUBLICATIONS

Lars Sundstroem, et al., "Quantization Analysis and Design of a Digital Predistortion Linearizer for RF Power Amplifiers", IEEE Transactions on Vehicular Technology, vol. 45, No. 4, Nov. 1996, pp. 707-719.

Yasuyuki Oishi, et al., "Highly Efficient Power Amplifier for IMT-2000 BTS Equipment", Fujitsu Sci. Tech. J., vol. 38, No. 2, Dec. 2002, pp. 201-208.

Toshio Nojima, et al., Cuber Predistortion Linearizer for Relay Equipment in 800 MHz Band Land Mobile Telephone System, IEEE Transaction on Vehicular Technionogy, vol. VT-34, No. 4, Nov. 1985, pp. 169-177.

Tri. T Ha, "Solid-State Microwave Amplifier Design: Chapter 6—Signal Distortion Characterizations and Microwave Power Combining Techniques", GTE International Systems Corporation (Krieger Publishing Company, Malabar, Florida) 1991, 202-283.

J. A. Higgins, et al., "Analysis and Improvement of Intermodulation Distortion in GaAs Power FET's", IEEE Transactions on Microwave Theory and Techniques, vol. MTT-28, No. 1, Jan. 1980, pp. 9-17.

* cited by examiner

LINEAR POWER AMPLIFICATION METHOD AND LINEAR POWER AMPLIFIER

BACKGROUND OF THE INVENTION

The present invention relates to a linear power amplification method and a linear power amplifier for use in a radio communication transmitter, for instance.

One of nonlinear distortion compensating schemes for microwave power amplifiers is a predistortion scheme using digital signal processing (hereinafter referred to as a digital distortion scheme) (for instance, H. Girard and K. Feher, "A new baseband linearizer for more efficient utilization of earth station amplifiers used for QPSK transmission," IEEE J. on Selected Areas in Commun. VOL. SAC-1, NO. 1, January 1983). A feature of the digital predistortion scheme resides in obviating the necessity of using complex analog circuitry by implementing the operation of a predistorter through digital signal processing. Conventional linear amplifiers are formed primarily by analog circuits such as a feedforward amplifier and a negative feedback amplifier. The predistorter is also implemented in analog form (for example, Nojima, Okamoto, and Ohyama, "Predistortion Nonlinear Compensator for Microwave SSB-AM System," Transactions of IEICE of Japan, '84/1 VOL. J67-B NO. 1, pp. 78–85).

Linearization technology using these analog circuits, however, generally calls for sophisticated adjustment techniques. Furthermore, miniaturization and economization of transmitters including a modulation circuit require simple configuration of analog circuits. In this respect, the digital predistorter, which implements linearization through digital signal processing, is advantageous over the conventional predistorter that employs analog circuits. Moreover, an amplifier using the predistorter is capable of achieving high efficiency amplification since it has no analog circuit for linearization, such as an auxiliary amplifier used in the feedforward amplifier.

A known configuration of the digital predistorter uses a lookup table for pre-linearization of nonlinear characteristics of amplifiers (for example, L. Sundstrom, IEEE, M. Faulkner, and M. Johansson, "Quantization analysis and design of a digital predistortion linearizer for RF power amplifiers," IEEE Trans. Vech. Tech., VOL. 45, NO. 4, pp707–719, November 1996). The digital predistorter using the lookup table updates set values in the lookup table by feeding back amplifier output signals so that distortion components go down below a preset value. It is known in the art that distortions can thus be compensated by digital signal processing and that the compensated amount of distortion is approximately 15 dB or below (Y. Oishi, N. Tozawa, and H. Suzuki, "Highly Efficient Power Amplifier for IMT-2000 BTS Equipment," FUJITSU Sci. Tech. J., 38, 2, p. 201–208, December 2002). To maximize the efficiency of amplification by the power amplifier, it is necessary to compress the output backoff of the amplifier by increasing the amount of distortion to be compensated for. FIG. 1 shows the relationship between the output backoff from a 1-dB gain compression point and the efficiency of amplification. The condition for review is an ideal class "B" bias. From FIG. 1, it will be seen that greater amplification efficiency can be achieved by increasing the amount of distortion to be compensated for to such an extent as to enable compression of the output backoff.

FIG. 2 shows the relationships between the distortion reduction and amplitude and phase deviations of a third-order distortion component. To achieve distortion compensation performance at least above 30 dB, a digital predistorter is needed which yields an amplitude deviation within ±0.2 dB and a phase deviation within ±2 deg. As will be seen from FIG. 2, the digital predistorter is required to attain predetermined amplitude and phase deviations in accordance with secular and temperature variations as well.

To realize distortion compensation (distortion improvement) in excess of a value attainable at present, the conventional lookup table type digital predistorter needs to be equipped, as will be understood from FIG. 3, with a high-precision lookup table for maintaining the distortion compensation at a high level. Further, it is necessary to provide a control route which, when a nonlinear characteristic of the power amplifier slightly changes with a temperature deviation or secular variation, monitors the amplifier output signal and corrects the lookup table accordingly.

On the digital predistorter using the lookup table, however, the relationships between distortion components and values set in the lookup table have not been clarified nor has been presented any concrete method for correcting a slight variation in the nonlinear characteristic of the amplifier that is caused by a secular or temperature change, for instance.

One approach to high-precision compensation for distortion components is a predistorter based on a power series model. Such a predistorter has been implemented so far using analog circuits, and its distortion improvement performance is above 30 dB (for instance, T. Nojima and T. Konno, "Cuber predistortion linearizer for relay equipment in 800 MHz band land mobile telephone system," IEEE Trans. Vech. Tech., VOL. VT-34, NO.4, pp169–177, November 1985). It is known in the art that the power series model is one that models nonlinear characteristics of the amplifier with high precision (for example, Tri T. Ha, "Solid-State Microwave Amplifier Design," Chapter 6, Krieger Publishing Company, 1991). With the distortion compensation scheme of the digital predistorter using the power series model, signals for correcting coefficients of respective orders need to be extracted from the amplifier output signal. In British Patent Application Publication GB2335812A there is described the extraction of such correction signals by removing distortion component of the fundamental wave and higher orders from the transmission signal. A scheme for more easy extraction of the correction signals of the power series model is to use two carriers of the same levels as pilot signals. (see the afore-mentioned document by T. Nojima and T. Konno).

There have been proposed improving the frequency dependence of the nonlinear characteristic of the power amplifier as well as compensation for its temperature dependence. With a view to implementing excellent compensation for distortion in a wideband signal by the conventional predistorter, Japanese Patent Application Publication No. 11-17462 proposes reduction of the path difference between the main signal path and the distorted signal path, and Japanese Patent Application Publication No. 7-7333 proposes the connection of a phase equalizer to the input signal line. The reason for using such schemes is to cause the distortion generated by the predistorter to vary with a fixed gain and in a fixed phase over a wide frequency band.

However, widening of the frequency band for amplification provides increased frequency deviation in the gain and phase characteristics of the power amplifier as shown in FIG. 3, for instance,—this exerts nonnegligible influence on signal amplification. On this account, only by fixedly varying the amplitude and phase of the distortion over the entire frequency band, it is impossible that the distortion by the predistorter remains over the entire frequency band at a level for canceling the distortion by the power amplifier and opposite thereto in phase. Accordingly, to implement high-precision distortion compensation, it is necessary that frequency dependent amplitude and phase characteristics of the distortion by the predistorter be varied in such a manner as to cancel frequency deviations of gain and phase characteristics of the power amplifier. Japanese Patent Application Publication No. 10-327209 proposes the use of an equalizer to vary the frequency-amplitude and frequency-phase characteristics of the distortion generated by the predistorter.

For example, in the conventional predistorter shown in Japanese Patent Application Publication No. 2002-64340, the output from an analog distorter is adjusted in amplitude and phase at the higher- and lower-frequency sides of the fundamental wave output signal independently of each other to impart frequency characteristics to the distortion for compensation. In Japanese Patent Application Publication No. 2002-57533 an amplitude-frequency characteristic adjusting circuit composed of a band-pass filter and a vector adjuster is connected to the output side of an analog distorter so that the distortion for compensation has a frequency characteristic.

In the case of extracting an intermodulation distortion component of the amplifier output by a narrow-band filter and correcting each order coefficient of the analog predistorter, the coefficient can easily be corrected in a sufficiently short time for the transmission signal in a pilot signal feedback route in the analog predistorter. In contrast to the analog predistorter, the lookup table type digital predistorter involves digitization of the pilot signal monitored from the amplifier output, giving rise to a problem of delay in the feedback route.

In the analog predistorter the pilot signal is generated by an analog oscillator, whereas in the digital predistorter the pilot signal needs to be generated in the base band through digital signal processing. No concrete techniques or schemes have been proposed so far for signal conversion of the pilot signal and the transmission signal in the digital predistorter and for their analog-to-digital conversion.

In other words, it is still unclear how to configure the digital predistorter that uses the pilot signal. There is a demand for a simple configuration of the digital predistorter that achieves a high degree of distortion compensation and always performs distortion compensation according to secular and temperature variations.

The scheme of varying the frequency characteristic of the distortion generated by the predistorter through use of an equalizer, described in the afore-mentioned Japanese Patent Application Publication No. 10-327209, is to make uniform the frequency characteristics of the feedback route that controls the predistorter. This scheme does not take into consideration the frequency deviations of the gain and phase characteristics in the power amplifier. Accordingly, there arises the necessity for a predistorter capable of adjusting the frequency-amplitude and frequency-phase characteristics of the distortion generated by the predistorter in such a manner as to cancel the frequency deviations of the gain and phase characteristics in he power amplifier.

When the input signal is one that has discrete spectra on the frequency axis as in the case of using two carriers of the same amplitude, it is effective to impart the frequency characteristic to the distortion component by adjusting its amplitude and phase on the higher- and lower-frequency sides of the fundamental wave signal as proposed in the afore-mentioned Japanese Patent Application Publication No. 2002-64340. With this method, however, when the input signal has a continuous spectrum on the frequency axis like a modulated wave signal, it is impossible to provide the distortion component with such frequency characteristics that it continuously varies on the frequency axis. In the afore-mentioned Japanese Patent Application Publication No. 2002-57533 many band-pass filters and vector adjusters need to be prepared for imparting frequency characteristics to high-order distortions for compensation, too. Besides, it is also still unclear how to implement the frequency characteristics of compensating distortions for canceling the frequency characteristics of distortion component generated by the power amplifier. The predistorters disclosed in the afore-mentioned Patent Application Publication Nos. 2002-64340 and 2002-57533 are predistorters formed by analog elements. In this instance, implementation of the frequency characteristics for the compensating distortions calls for taking into account the frequency characteristics of the entire transmission system including the distorter, the vector adjuster and so on, as well as the frequency characteristics of the power amplifier.

SUMMARY OF THE INVENTION

A primary object of the present invention is to provide a linear power amplification method and a linear power amplifier which are not much affected by secular and temperature changes and achieve excellent distortion compensation performance.

The linear power amplifier according to the present invention comprises:

a digital predistorter supplied with a digital transmission signal, for predistorting said digital transmission signal by use of a power series model to generate a predistorted signal;

a digital-to-analog converter for converting said predistorted signal from said digital predistorter into an analog predistorted signal;

a frequency upconverting part for upconverting said analog predistorted signal to a transmit frequency band;

a power amplifier for power-amplifying said upconverted signal;

a frequency downconverting part for downconverting a portion of the output from said power amplifier to output a downconverted signal; and a digital predistorter control part for extracting distortion components of the same odd orders as those of said power series model and for controlling coefficients of said predistorter in a manner to lower the levels of said odd-order distortion components.

Since the odd-order distortion components of the power series model to be generated in the digital predistorter are directly controlled to reduce the levels of the extracted distortion components, a distortion correction with small secular and temperature variations can be achieved.

The linear power amplification method according to the present invention comprises the steps of:

(a) inputting a digital pilot signal to a digital predistorter to generate a predistorted signal added with odd-order distortion components of a number predetermined by a power series model;

(b) converting said predistorted signal to an analog predistorted signal;

(c) upconverting said analog predistorted signal to a transmit frequency band by use of a predetermined carrier frequency;

(d) power-amplifying said upconverted signal;

(e) downconverting a portion of said power-amplified output signal to extract odd-order distortion components; and (f) controlling coefficients of said predistorter so that the level ratio of said odd-order distortion component to a transmission signal becomes smaller than a predetermined value.

DETAILED DESCRIPTION OF THE PREFERRED EMBODIMENTS

Basic Constitution of the Invention

Figure 4:
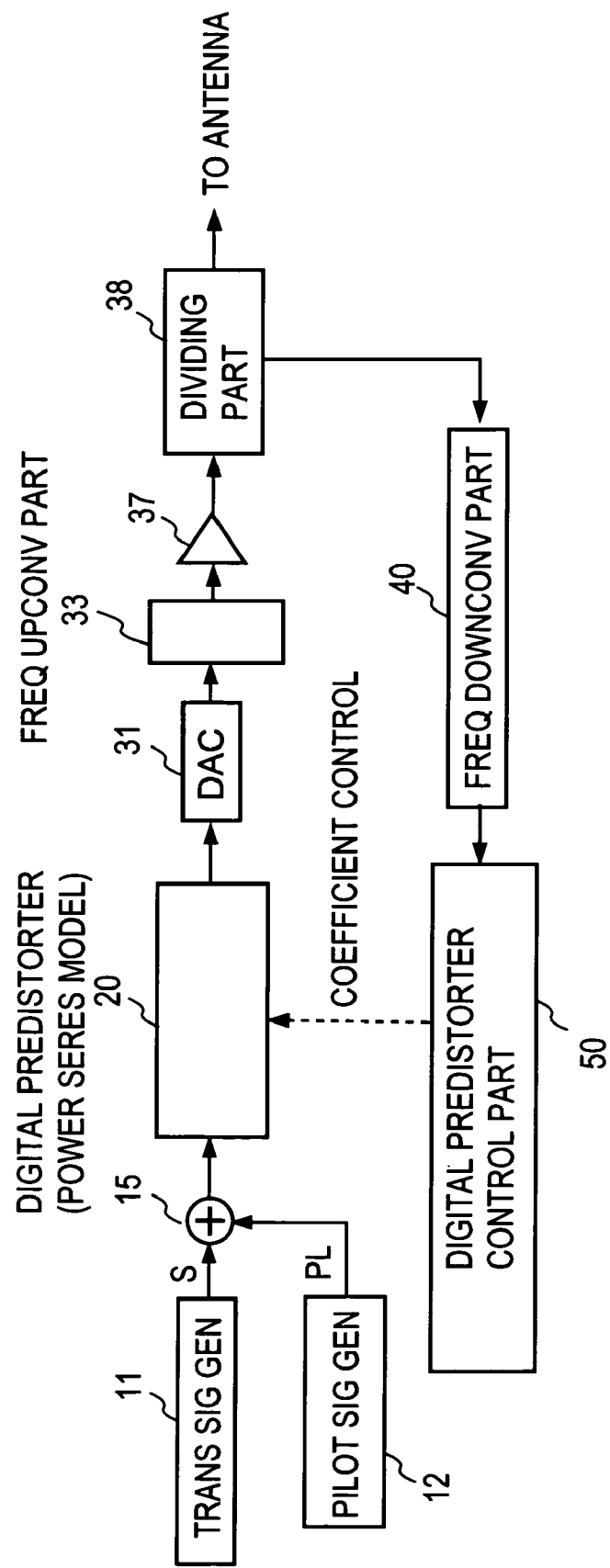
FIG. 4 is a block diagram illustrating a basic configuration of the linear power amplifier according to the present invention.

FIG. 4 illustrates a basic constitution of the linear power amplifier according to the present invention. A transmission signal S and a pilot signal PL are generated through different digital signal processing by a transmission signal generator 11 and a pilot signal generator 12, respectively, and they are added together by an adder 15, the adder output being provided to a digital predistorter 20. The transmission signal S may be either a baseband or IF signal; but it will hereinafter be assumed as a baseband signal unless otherwise specified. The digital predistorter 20, based on a power series model, performs digital signal processing for predistorting the input signal that is a combined signal of the transmission signal S and the pilot signal PL.

The output signal from the digital predistorter 20 is converted to an analog signal by a digital-to-analog (DA) converter 31 that has a working speed in a band at least twice higher than the band of the combined signal of the pilot signal PL and the transmission signal S. The analog signal is frequency converted by a frequency upconverting part 33 to a high-frequency signal of the transmit frequency band, and the frequency-converted signal is fed to a power amplifier 37. The output signal from the power amplifier 37 is divided by a power dividing part 38 into two, one of which is provided to a frequency downconverting part 40 and the other of which is provided as a linear amplifier output to, for example, an antenna. The one divided portion of power is downconverted in the frequency downconverting part 40, thereafter being fed to a digital predistorter control part 50. The control part 50 extracts an odd-order distortion component of the pilot signal from the downconverted signal, and uses the extracted distortion component to correct coefficients of the digital predistorter 20.

Since the digital predistorter 20 using the pilot signal does not correct the coefficients by use of correction data read out of a memory but instead directly corrects the coefficients by use of the detected distortion component in such a manner as to reduce the distortion component as referred to above, the coefficient correction is free from the influence of secular and temperature variations. Further, as regards a pilot signal feedback time, since the band of the pilot signal is narrower than the band of the transmission signal, the delay time of the digital predistorter in the present invention can be extended longer than the delay time in a conventional digital predistorter. Accordingly, the feedback time does not matter even in the feedback route in which the pilot signal is downconverted as shown in FIG. 4.

First Embodiment

Figure 5:
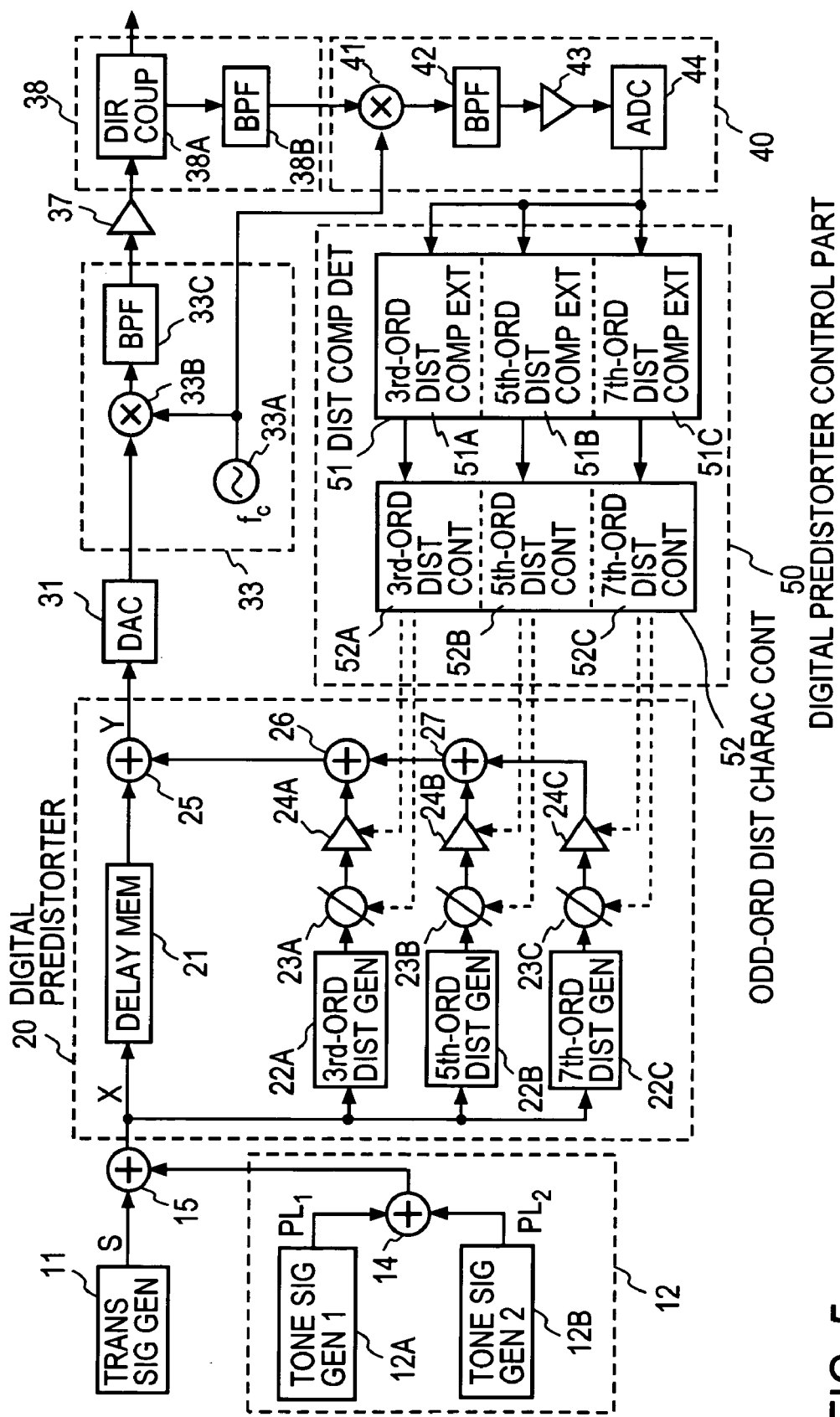
FIG. 5 is a block diagram depicting a first embodiment of the linear power amplifier according to the present invention.

FIG. 5 illustrates a first embodiment of a linear power amplifier embodying the digital predistortion scheme according to the present invention. The pilot signal used in this embodiment is two tone signals $PL_1$ and $PL_2$ of the same level. The linear power amplifier of this embodiment comprises: a pilot signal generator 12 composed of tone signal generators 12A and 12B for generating the tone signals $PL_1$ and $PL_2$ through digital signal processing, and a digital adder 14; a digital predistorter 20; a DA converter 31; a frequency upconverting part 33 composed of a local oscillator 33A, a mixer 33B, and a band-pass filter 33C; a power amplifier 37; a directional coupler 38A and a pilot signal extracting band-pass filter 38B that constitute a dividing part 38; a frequency downconverting part 40 composed of a mixer 41, a band-pass filter 42, an amplifier 43, and an analog-to-digital (AD) converter 44; and a digital predistorter control part 50. The digital predistorter 20 is shown to handle distortions of up to the seventh order, but the number of orders may be chosen as desired according to the device configuration used. While in practice a low-pass filter for aliasing cutting use is connected to the output side of the DA converter 31, it is not related directly to the present invention and hence is not shown.

The digital predistorter 20 using a power series model is configured to add output signals from a delay path which passes therethrough the fundamental wave component of the transmission signal and the path for generating each odd-order distortion by use of the power series. That is, the fundamental wave component passes through a delaying memory 21 which provides coincidence between the delay times of the delay path and the distortion generation path. Distortion components of the respective odd orders are produced by distortion generators 22A, 22B and 22C, gain adjusters 24A, 24B and 24C for amplitude adjustment use, and phase adjusters 23A, 23B and 23C for phase adjustment use. The odd-order distortion generators 22A, 22B and 22C each perform processing of raising the input combined signal of the transmission signal A and the pilot signals $PL_1$ and $PL_2$ to the corresponding odd-order power. For instance, letting X represent the sum of the transmission signal S and the pilot signals $PL_1$ and $PL_2$, the third-order distortion generator raises X to 3rd power. The phase- and amplitude-adjusted odd-order distortion components are added together by adders 26 and 27, then the added output is further added by an adder 25 to the delayed fundamental wave component from the delaying memory 21, and the added output is applied as a predistorted signal Y from the digital predistorter 20 to the DA converter 31.

The DA converter 31 converts the predistorted signal Y to an analog signal, which is applied to the mixer 33B, wherein it is mixed with a local signal (a carrier signal) of a frequency $f_c$ fed from the local oscillator 33A. The mixed output is provided to the band-pass filter 33C to extract a signal of the transmit frequency band, which is applied to the power amplifier 37. The output high-frequency signal from the power amplifier 37 is transmitted via the directional coupler 38A.

A portion of the transmit output of the high-frequency signal is taken out by the directional coupler 38A and is applied to the band-pass filter 38B to extract a pilot signal component (composed of pilot signals and higher order distortions). The thus extracted pilot signal component is mixed by the mixer 41 with the carrier signal from the local oscillator 33A, and the mixer output is applied to the band-pass filter 42 to detect a downconverted pilot signal component, which is amplified by the amplifier 43. The amplified pilot signal component is converted by the DA converter 44 to a digital signal, which is provided to the digital predistorter control part 50.

The digital predistorter control part 50 comprises a distortion component detecting part 51 and an odd-order distortion characteristic control part 52. The distortion component detecting part 51 is made up of third-, fifth- and seventh-order distortion component extractors 51A, 51B and 51C. The odd-order distortion characteristic control part 52 is made up of third-, fifth- and seventh-order distortion controllers 52A, 52B and 52C. The odd-order distortion component extractors 51A, 51B and 51C can be formed, for example, by band-pass filters, by which third-, fifth- and seventh-order distortion components are extracted. The odd-order distortion controllers 52A, 52B and 52C control the phase adjusters 23A, 23B, 23C and the gain adjusters 24A, 24B, 24C that adjust the phases and amplitudes of the outputs from the distortion component generators 22A, 22B and 22C corresponding to the controllers, respectively.

Since the pilot signals $PL_1$ and $PL_2$ used are tone signals of the same level (CW signals), odd-order distortion components appearing in the vicinities of the tone signals are extracted at the output of the power amplifier 37 by the odd-order distortion component extractors 51A, 51B and 51C. While the digital predistorter control part 50 in this embodiment is implemented by digital signal processing, a similar configuration may be implemented by analog circuits.

Figure 6:
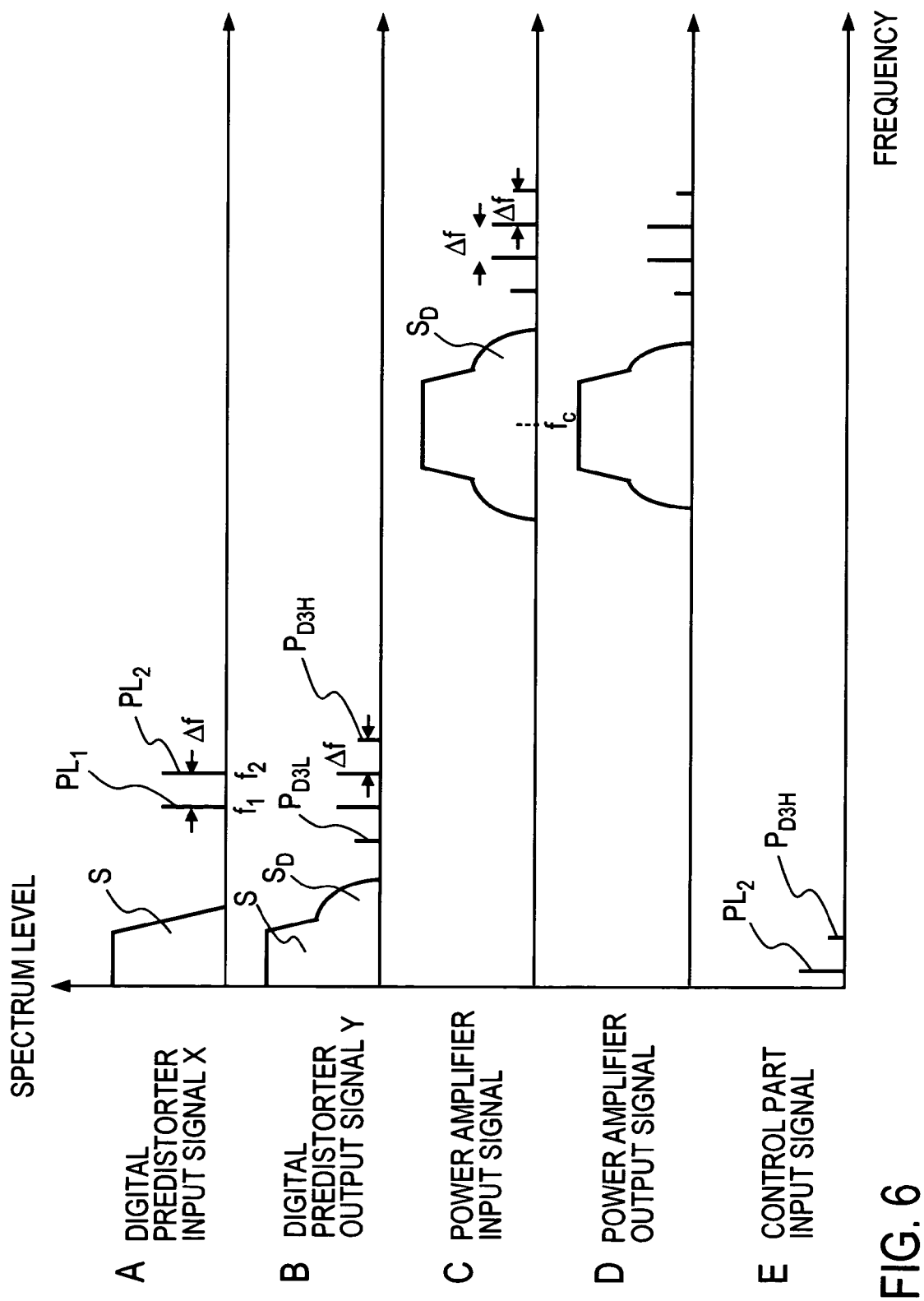
FIG. 6 is a diagram schematically showing spectra of signals at respective parts in FIG. 5.

FIG. 6 shows, in the form of signal spectra, how to inject and extract the pilot signals $PL_1$ and $PL_2$ in this embodiment. The input signal X to the digital predistorter 20 contains the transmission signal S of the baseband and the pilot signals $PL_1$ and $PL_2$ that are tone signals of the same level. The pilot signals $PL_1$ and $PL_2$ of frequencies $f_1$ an $f_2$ are injected into the adjacent band of the transmission signal S as shown in FIG. 6-Row A. The two pilot signals $PL_1$ and $PL_2$ are set with a frequency interval $\Delta f = f_2 - f_1$ which is sufficiently narrower than the modulated signal bandwidth of the transmission signal S. The output signal Y from the digital predistorter 20 contains predistorted components $S_D$, $P_{D3L}$ and $P_{D3H}$ resulting from predistortion of the transmission signal S and the pilot signals $PL_1$ and $PL_2$, as shown in FIG. 6-Row B. Here are exemplified the third-order distortion components; for example, the fifth-order distortion components of the pilot signals $PL_1$ and $PL_2$ are a component higher than $P_{D3H}$ by $\Delta f$ and a component lower than $P_{D3L}$ by $\Delta f$, but they are not shown. The seventh-order distortion components are generated further outside than the fifth-order distortion components by $\Delta f$, but they are not shown, either.

The input signal to the power amplifier 37 is a signal that the output signal Y from the digital predistorter 20 was upconverted in the frequency upconverting part 33 by the carrier frequency $f_c$ as depicted in FIG. 6-Row C. In this case, the predistorted components generated by the digital predistorter 20 are so set as to compensate for distortions over the entire transmission route. Accordingly, no problem arises from a mismatch between the predistorted components in the input signal to the power amplifier 37 and the predistorted components in the output signal of the digital predistorter 20. But the difference is very small since intennodulation distortions in the transmit route mostly occur in the power amplifier 37 at the final stage of the route. As shown in FIG. 6-Row D, the output signal from the power amplifier 37 is a signal with distortions suppressed by the digital predistorter 20, that is, a distortion-compensated signal.

The pilot signal component containing the distortion components is extracted by the directional coupler 38A and the band-pass filter 38B. The extracted pilot signal component is downconverted by the mixer 41 with the local oscillation signal from the local oscillator 33. The input signal to the control part 50, shown in FIG. 6-Row E, is a digitized version of the downconverted signal by the AD converter 44, For example, when distortion compensation for the third-order distortion components $P_{D3H}$ and $P_{D3L}$ is insufficient at the output of the power amplifier 37, they remain unremoved to such an extent as not to be negligible. In the control part 50 one of the third-order distortion components, $P_{D3H}$ in this case, is extracted by the third-order distortion component extractor 51A. The third distortion controller 52A uses the extracted tone signal to control the phase and amplitude of the output from the third distortion signal generator 22A by the phase adjuster 23A and the gain adjuster 24A until the compensated amount of distortion reaches such a value that the adjacent channel leakage power ratio (i.e., the level ratio of the distortion component to the transmission signal) goes down below a predetermined value at the output of the power amplifier 37. To perform this, various optimal algorithms can be used.

Figure 7:
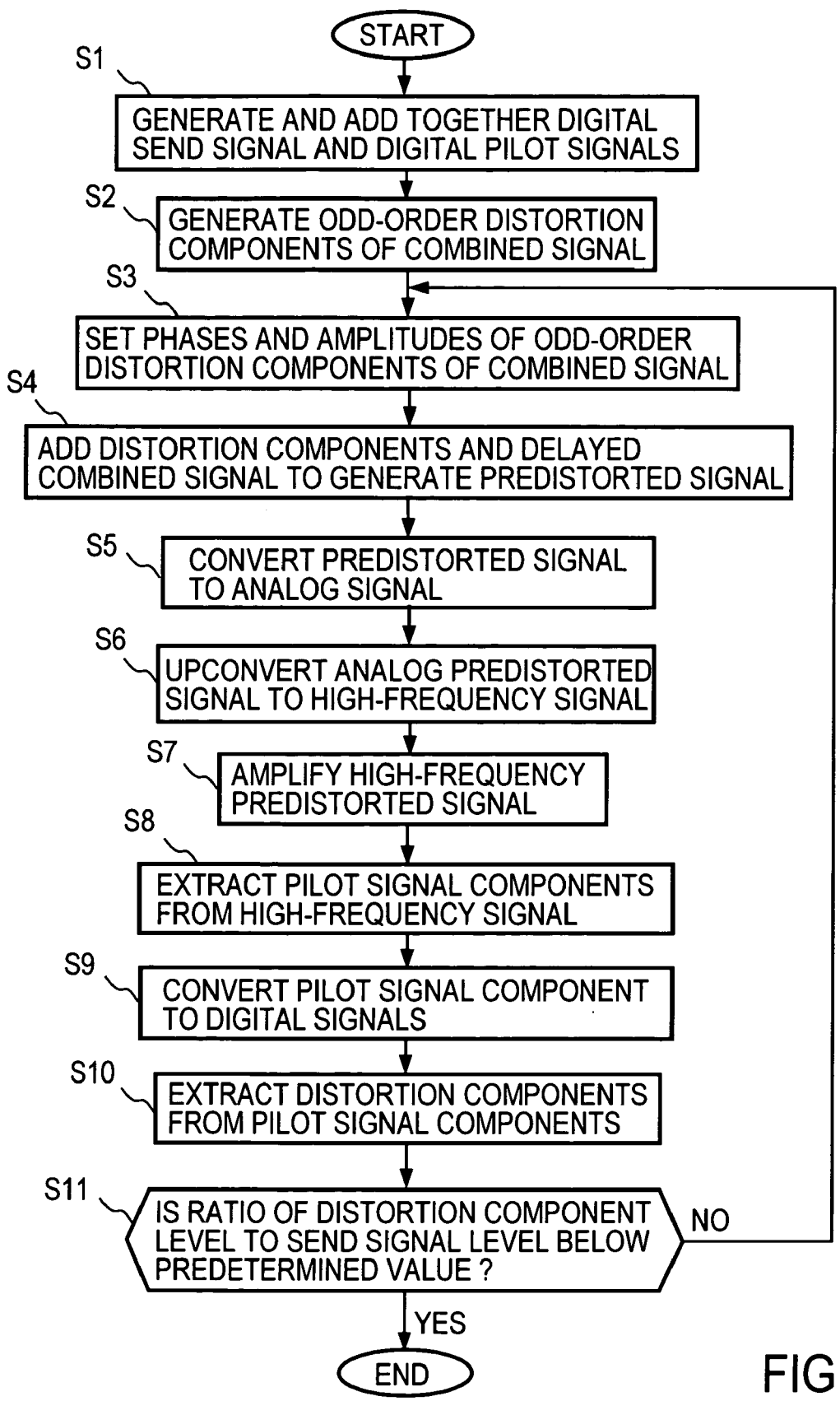
FIG. 7 is a flowchart showing the procedure for implementing the linear power amplification method according to the present invention.

FIG. 7 is a flowchart showing a linear power amplification procedure including the steps for setting coefficients in the digital predistorter 20 by controlling the phases of the phase adjusters 23A, 23B, 23C and the gains of the gain adjusters 24A, 24B, 24C.

Step S1: Generate digital pilot signals $PL_1$ and $PL_2$, and add them with a digital transmission signal S to obtain a combined signal.

Step S2: Generate odd-order distortion components for the digital combined signal.

Step S3: Set the phases and amplitudes of the odd-order distortion components.

Step S4: Add the distortion components and the delayed fundamental wave component to generate a predistorted signal.

Step S5: Convert the predistorted signal to an analog signal.

Step S6: Upconvert the analog predistorted signal to a high-frequency signal.

Step S7: Power amplify the high-frequency predistorted signal by a power amplifier.

Step S8: Extract the pilot signal components from the amplified high-frequency signal and downconvert them.

Step S9: Convert the downconverted pilot signal components to digital form.

Step S10: Extract distortion components from the digital pilot signal components.

Step S11: Make a check to see if the ratio of the distortion component level to the transmission signal level is below a predetermined value, and if so, end the procedure, and if not, return to step S3 and repeat steps S3 through S11.

Second Embodiment

Figure 8:
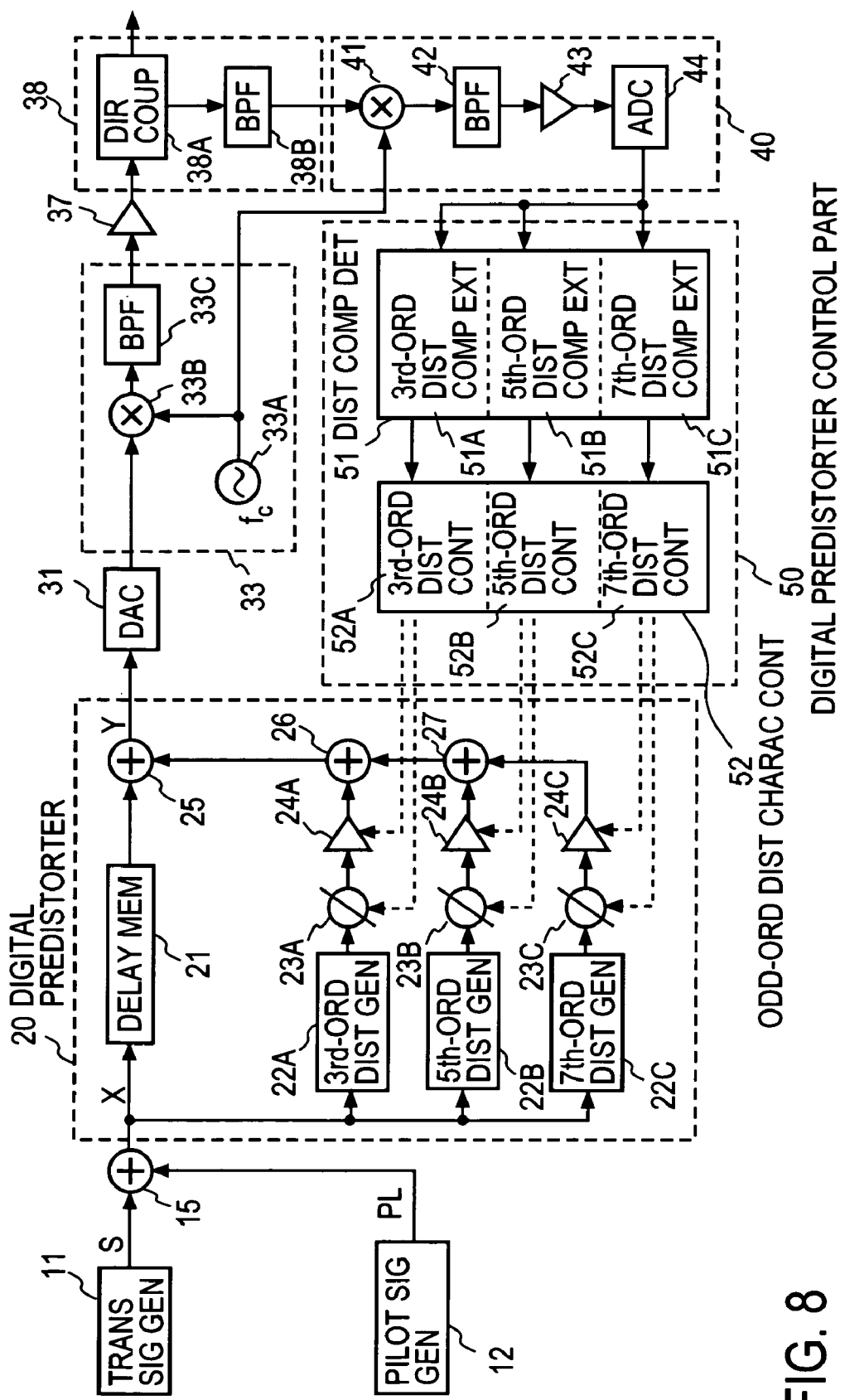
FIG. 8 is a block diagram depicting a second embodiment of the linear power amplifier according to the present invention.

FIG. 8 illustrates in block form a second embodiment of the present invention, which is a modified form of the first embodiment. The illustrated embodiment employs one modulated wave signal as the pilot signal instead of using the two tone signals, and is identical in construction with the first embodiment except the configuration of the pilot signal generator 12. And this embodiment is also identical in operation with the first embodiment.

Figure 9:
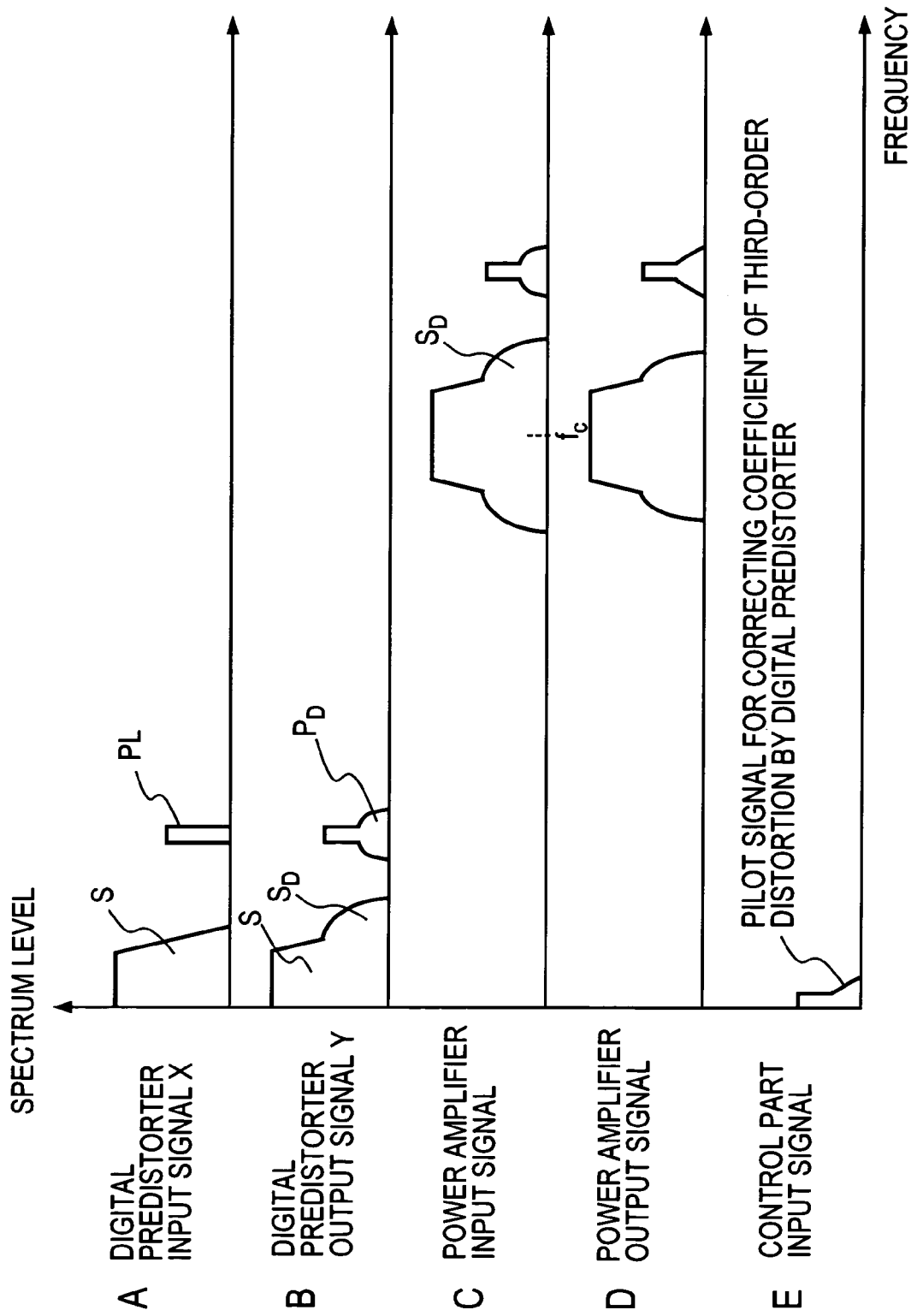
FIG. 9 is a diagram schematically showing spectra of signals at respective parts in FIG. 8.

FIG. 9 shows, in the form of signal spectra, the injection and extraction of the pilot signal PL in the second embodiment. Rows A and B schematically show spectra of the input signal X to and the output signal Y from the digital predistorter 20, Rows C and D spectra of the input signal to and the output signal from the power amplifier 37, and Row E spectrum of the input signal to the control part 50. The spectra shown in FIG. 9 are identical with those in FIG. 6 except that the pilot signal PL in the second embodiment is a modulated signal. The pilot signal PL is a modulated signal having a bandwidth, which is distorted by the digital predistorter 20 and has its spectrum spread on both sides accordingly as indicated by $P_D$. As compared with the pilot signals $PL_1$ and $PL_2$ which are tone signals, the detection sensitivity of the pilot signal PL in this embodiment is increased by a decoding circuit which performs error correction or the like in the receiver. The application of a spreading code to the pilot signal permits extraction of a pilot signal below the lowest receiving sensitivity of the receiver.

Third Embodiment

Figure 10:
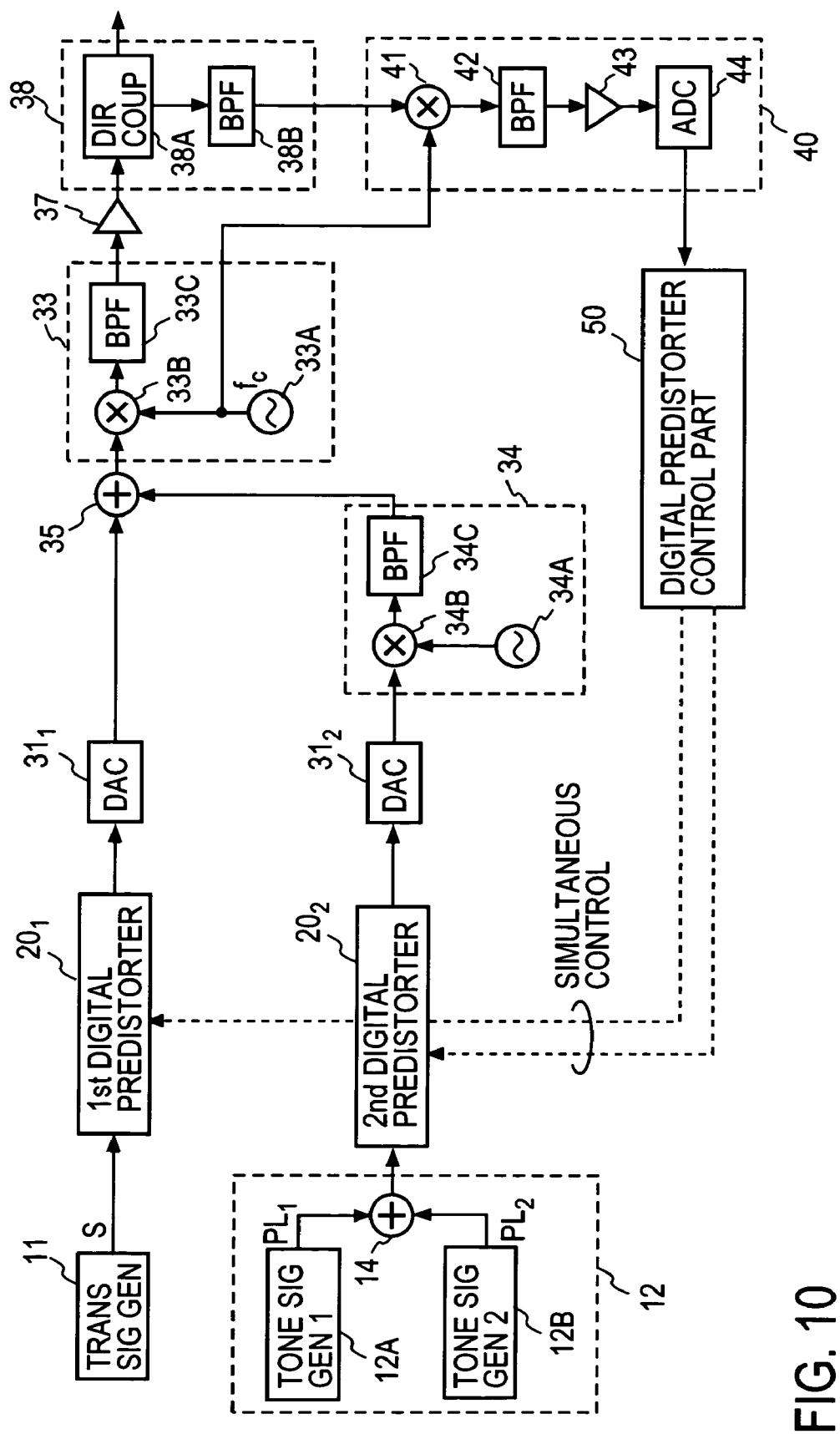
FIG. 10 is a block diagram depicting a third embodiment of the linear power amplifier according to the present invention.

FIG. 10 illustrates in block form a third embodiment of the present invention, which differs from the first and second embodiments in that predistorters $20_1$, $20_2$ and DA converters $31_1$ and $31_2$ provided separately for the pilot signal and the transmission signal. The digital predistorters $20_1$, $20_2$ and the digital predistorter control part 50 therefor are identical in construction with those in the first and second embodiments.

In this embodiment there are newly provided a frequency upconverting part 34 composed of a local oscillator 34A, a mixer 34B and a band-pass filter 34C, for frequency converting the output from the second digital predistorter $20_2$ to a band different from that of the transmission signal S. This embodiment contemplates widening the band of the transmission signal. The first and second embodiments permits reduction of computational complexities for predistortion, generation and injection of the pilot signals and digital signal processing, but widening the band of the transmission signal is likely to cause shortage of the capacity of the DA converter 31. Further, since the pilot signal is injected into a band different from that of the transmission signal S, the DA converter 31 is required to be capable of performing digital-to-analog conversion of signals in bands above that of the transmission signal. In this respect, the third embodiment uses different digital predistorters $20_1$, $20_2$ and different DA converters $31_1$, $31_2$ for the transmission signal and the pilot signal, respectively. The provision of such independent digital-to-analog conversion routes offers increased flexibility in widening of the transmission signal or signal conversion for over sampling. The first and second digital predistorters $20_1$ and $20_2$ synchronously correct coefficients of each odd order under the control of the digital predistorter control part 50.

Fourth Embodiment

Figure 11:
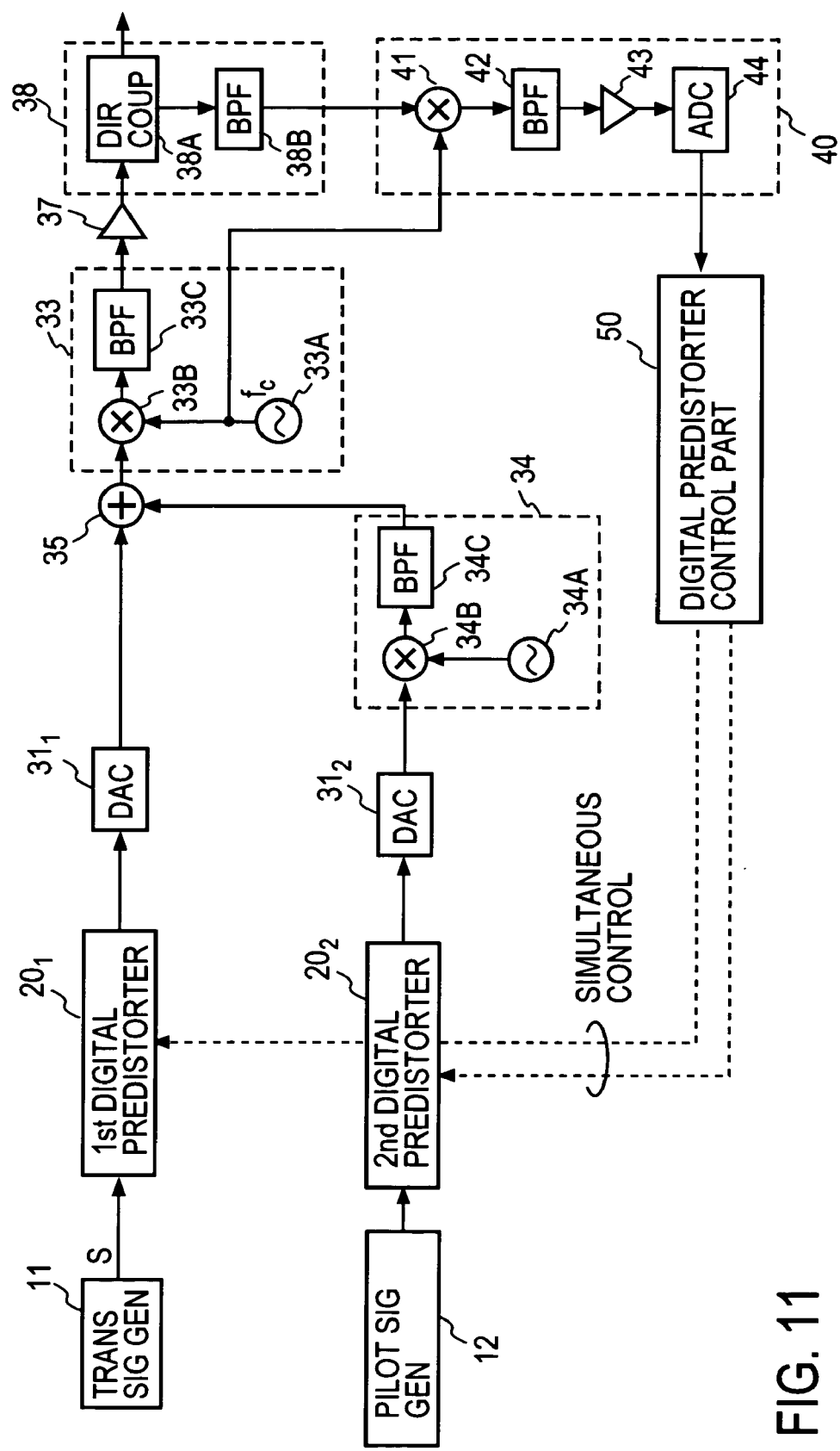
FIG. 11 is a block diagram depicting a fourth embodiment of the linear power amplifier according to the present invention.

FIG. 11 illustrates in block form a fourth embodiment of the present invention, in which the pilot signal generator 12 in the fourth embodiment of FIG. 10 has the same configuration as that of the pilot signal generator 12 for generating a modulated signal in the FIG. 8 embodiment. This embodiment is also identical in operation with the third embodiment. As compared with the pilot signals $PL_1$ and $PL_2$ which are tone signals, the detection sensitivity of the pilot signal PL in this embodiment is increased by a decoding circuit which performs error correction or the like in the receiver. The application of a spreading code to the pilot signal permits extraction of a pilot signal below the lowest receiving sensitivity of the receiver.

Figure 12:
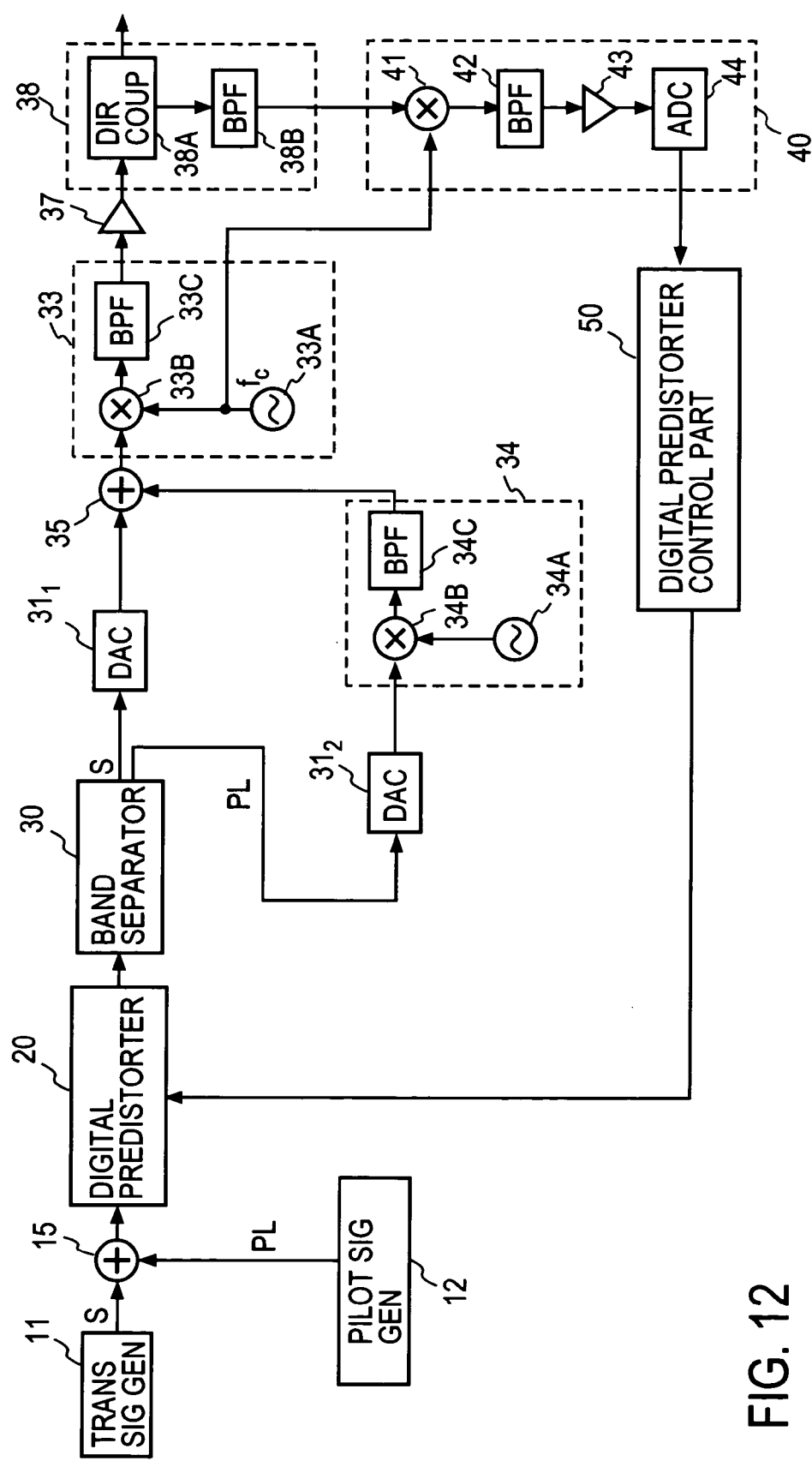
FIG. 12 is a block diagram depicting a modified form of each of the third and fourth embodiments of the linear power amplifier according to the present invention.

In the third and fourth embodiments of FIGS. 10 and 11, the first and second digital predistorters $20_1$ and $20_2$ may also be replaced with one digital predistorter. In such an instance, a band separator 30 is provided, as shown in FIG. 12, which performs signal processing for separating the transmission signal and the pilot signal at the output of the digital predistorter 20 through utilization of the difference in band between the transmission signal and the pilot signal. The transmission signal S and the pilot signal PL thus separated are processed in the respective routes in the same manner as in FIGS. 10 and 11.

Figure 13:
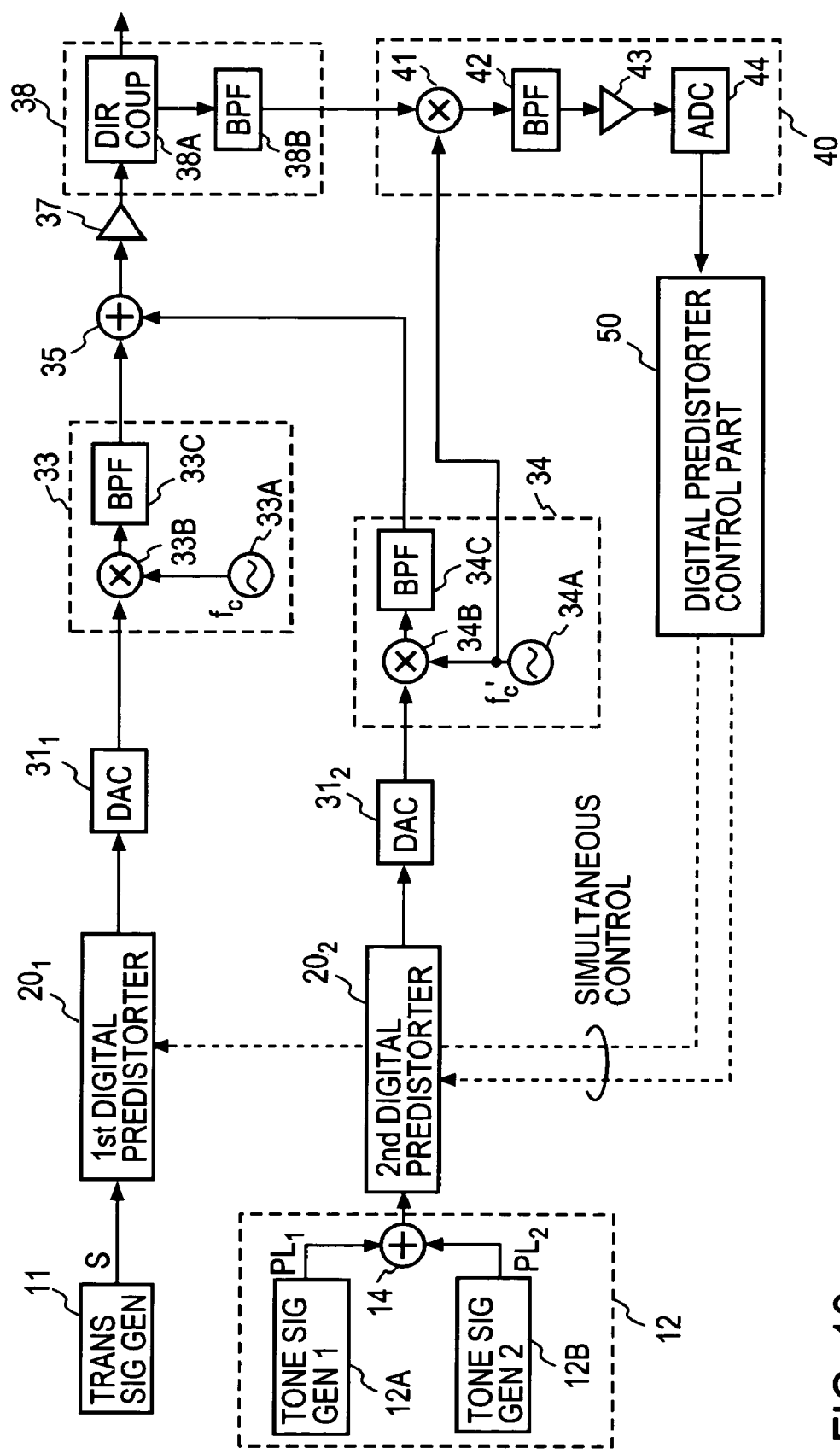
FIG. 13 is a block diagram showing a modified form of the FIG. 10 embodiment.

In the embodiments of FIGS. 10, 11 and 12 the transmission signal and the pilot signal are predistorted and converted from digital to analog form separately of each other, and the predistorted pilot signal is upconverted and combined with the predistorted transmission signal. FIG. 13 shows a modified form of the FIG. 10 embodiment. In this embodiment the predistorted transmission signal upconverted in the frequency upconverting part 33 by use of the carrier frequency $f_c$ and the predistorted pilot signal upconverted in the frequency upconverting part 34 by use of a carrier frequency $f_c'$ different from the above-mentioned carrier frequency $f_c$ are combined by an adder 35, and the combined signal is applied to the amplifier 37. Further, the carrier signal of the carrier frequency $f_c'$ from th local oscillator 34A is applied to the mixer 41 of the pilot signal component detecting part 40 to detect the pilot signal component. The illustrated modification is identical in construction and in operation with the FIG. 10 embodiment except the above.

Figure 14:
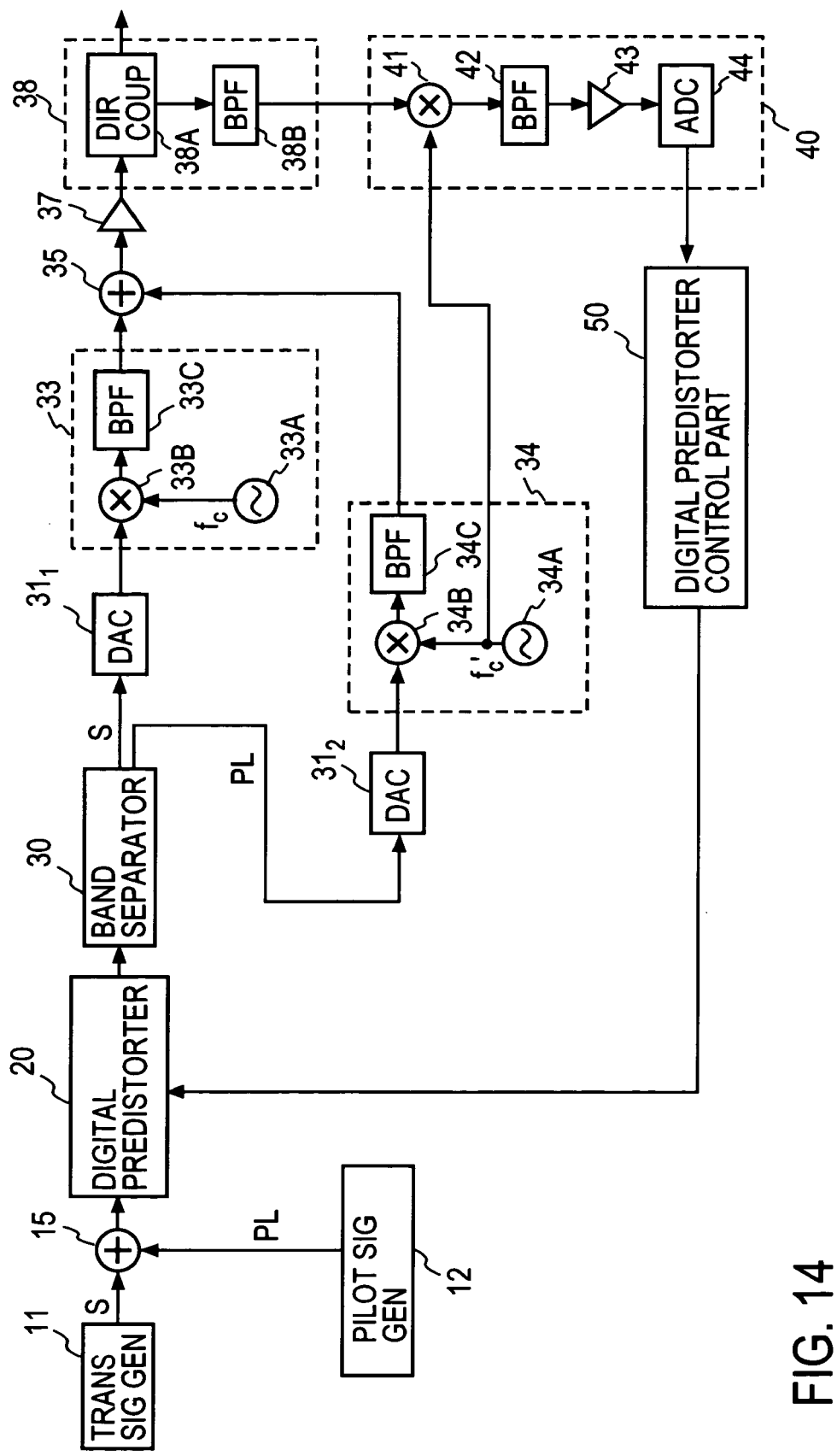
FIG. 14 is a block diagram showing a modified form of the FIG. 12 embodiment.

It is apparent that the embodiments of FIGS. 11 and 12 can also be modified as in the case of FIG. 13. For example, in the FIG. 11 embodiment the pilot signal generator 12 the pilot signal generator 12 for generating two tone signals in FIG. 13 is replaced with a pilot signal generator for generating a modified signal of a band narrower than that of the transmission signal. In the case of the FIG. 12 embodiment the circuit arrangement following the band separator 30 needs only to be the same as shown in FIG. 14; no description will be repeated in this respect.

Figure 15:
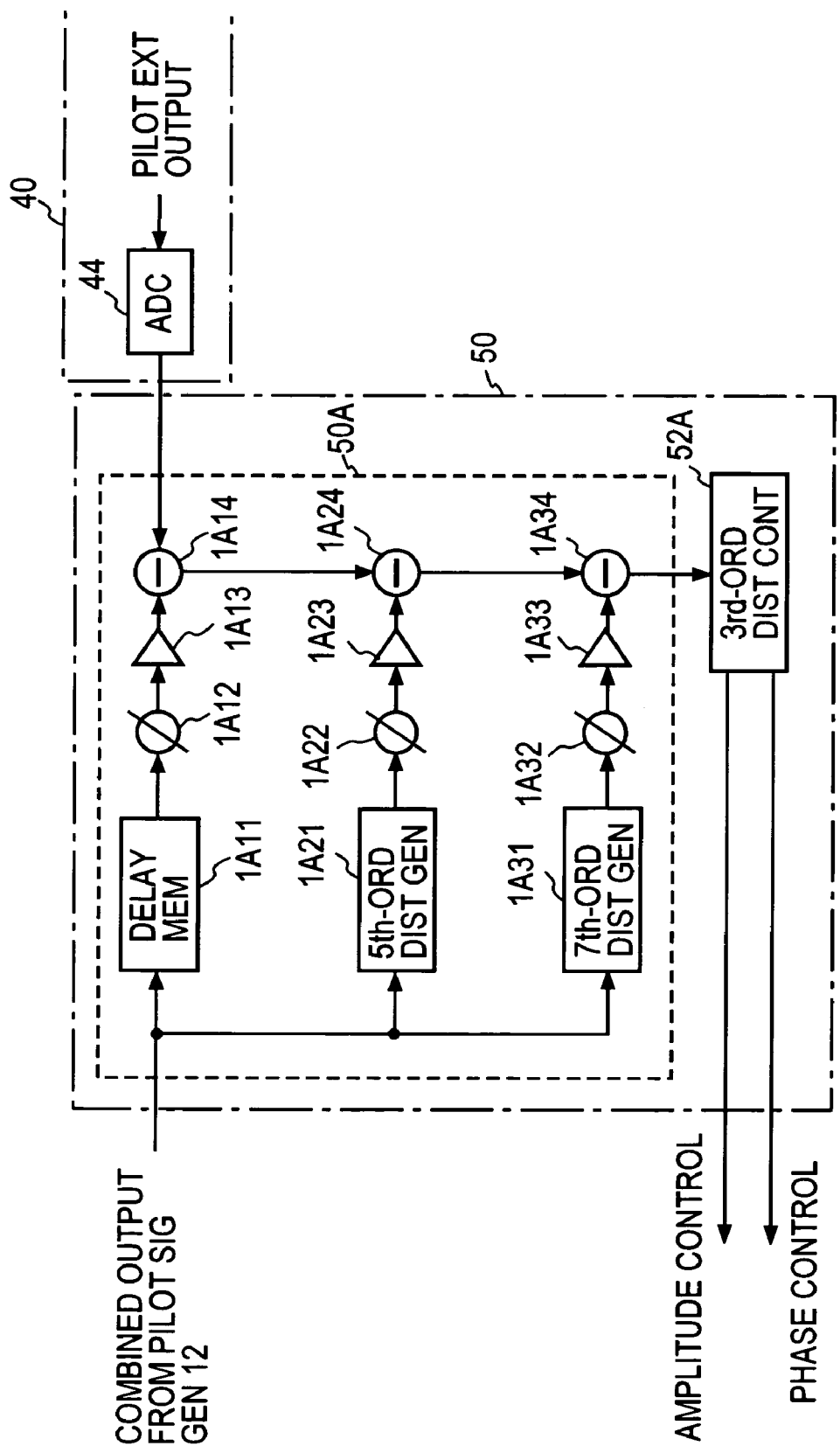
FIG. 15 is a block diagram illustrating another example of a digital predistorter control part.

FIG. 15 shows, by way of example, a circuit configuration for increasing the pilot signal detecting sensitivity of the digital predistorter control part 50 in the first to fourth embodiments and in their modifications. In this case, however, the pilot signal generator 12 is one that combines two tone signals into the pilot signal as referred to previously in respect of FIG. 5. The FIG. 15 example is directed only to the third-order distortion.

The digital predistorter control part 50 comprises a third-order distortion component extractor 50A and a third-order distortion controller 52A. The third-order distortion component extractor 50A comprises: a delay memory 1A11, a phase adjuster 1A12 and a gain adjuster 1A13 which constitute a fundamental wave generating path; a fifth-order distortion generator 1A21, a phase adjuster 1A22 and a gain adjuster 1A23 which constitute a fifth-order distortion generating path; a seventh-order distortion generator 1A31, a phase adjuster 1A32 and a gain adjuster 1A33 which constitute a seventh-order distortion generating path; and subtractors 1A14, 1A24 and 1A34.

From the pilot signal component fed from the pilot signal generator 12 are generated a delayed fundamental wave component, a fifth-order distortion component and a seventh-order distortion component through the fundamental wave path, the fifth-order distortion generating path and the seventh-order distortion generating path, respectively. The delayed fundamental wave component, fifth-order distortion component and seventh-order distortion component of the pilot signal are sequentially subtracted by the subtractors 1A14, 1A24 and 1A34, respectively, from the pilot signal component detected in the frequency downconverting part 40, by which the third-order distortion component is left remaining, and the third-order distortion component is provided to the third-order distortion controller 52A. Based on the third-order distortion component fed thereto, the third-order distortion controller 52A controls the phase adjuster 23A and the gain adjuster 24A of the digital predistorter 20 as is the case with the third-order distortion controller 52A in FIG. 5.

To reduce residues of the delayed fundamental wave component, the fifth distortion component and the seventh-order distortion component after the subtraction, the control part 50 of FIG. 15 adjusts the phases and amplitudes of the respective components by the phase adjusters 1A12, 1A22, 1A32 and the gain adjusters 1A13, 1A23, 1A33. These adjustments need only to be made at the time of device initialization because implementation of the digital predistorter control part 50 of FIG. 15 by digital signal processing does not cause any changes in electrical characteristics due to aging or temperature. With the same configuration as that of the digital predistorter control part 50 in FIG. 8, it is possible to extract the fifth- or seventh-order distortion component. The same goes for the case where the pilot signal is a modulated signal.

Fifth Embodiment

Figure 16A:
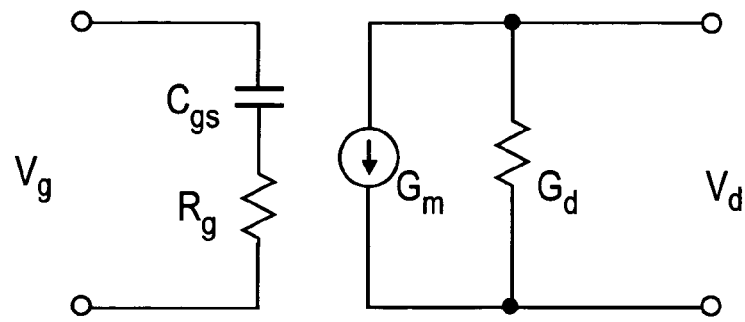
FIG. 16A is a diagram depicting an equivalent circuit of a FET.

An equivalent circuit of an intrinsic region of a common FET (Field Effect Transistor) used in the power amplifier can be expressed, for example, as shown in FIG. 16A, in which $C_{gs}$ represents the gate-source interterminal capacitance, $R_g$ the gate resistance, $G_m$ the transconductance, and $G_d$ the drain conductance. The intermodulation distortion in FET is modeled in the form of power series of $C_{gs}$, $G_m$ and $G_d$ from the FIG. 16A equivalent circuit of the intrinsic region (see, for example, J. A. Higgins and R. L. Kuvas, "Analysis and improvement of intermodulation distortion in GaAs power FET's," IEEE Transaction on Microwave Theory and Techniques, VOL. MTT-28, NO. 1, pp. 9–17, January 1980). Letting an instantaneous gate voltage be represented by $V_g$ and an instantaneous drain voltage by $V_d$, $$C_m(V_g) = G_{m1} + G_{m2}V_g + G_{m3}V_g^2 + G_{m4}V_g^3 + G_{m5}V_g^4 + \quad (1)$$

$$G_d(V_d) = G_{d1} + G_{d2}V_d + G_{d3}V_d^2 + G_{d4}V_d^3 + G_{d5}V_d^4 + \quad (2)$$

$$C_{gs}(V_g) = C_{g1} + C_{g2}V_g + C_{g3}V_g^2 + C_{g4}V_g^3 + C_{g5}V_g^4 + \quad (3)$$

From the above it is understood that the intermodulation distortion in FET occurs at the gate and the drain.

Figure 16B:
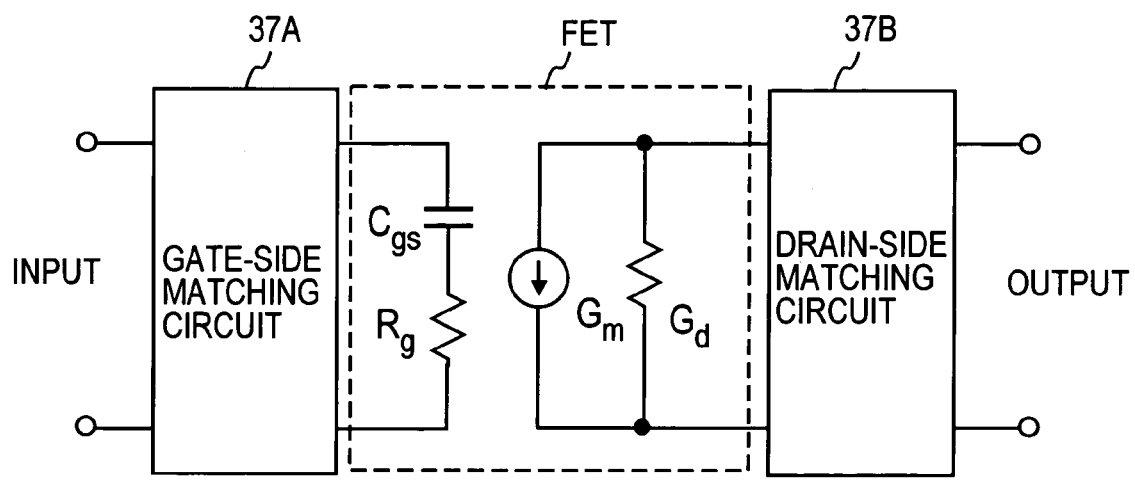
FIG. 16B is a diagram depicting an equivalent circuit of an amplifier using a FET.

The amplifier can be expressed in the form of such a circuit network as shown in FIG. 16B by use of FET equivalent circuit of FIG. 16A. The circuit network is composed of a gate-side matching circuit 37A, FET and a drain-side matching circuit 37A. The matching circuits 37A and 37B have different frequency characteristics. Because of this, the intermodulation distortion of the amplifier is affected by the frequency characteristics of the both gate- and drain-side matching circuits 37A and 37B. But the frequency characteristics in this case are not so wide in bandwidth as the operating frequency of FET, and they are limited to the bandwidth for amplification by the amplifier.

In the conventional power series type predistorter by digital signal processing, no consideration is given to the frequency characteristics of the intermodulation distortion in FET (see, for instance, UK Patent Application GB2335812A).

With a view to achieving a high degree of distortion suppression over a wide band, this embodiment compensates for the intermodulation distortion taking into account the frequency characteristics of the gate-side matching circuit 37A and the frequency characteristics of the drain-side matching circuit 37B separately of each other. What is important in FIG. 16B is that the input signal to the amplifier is influenced by the frequency characteristics of the gate-side matching circuit 37A and then applied to the FET equivalent circuit, wherein the intermodulation distortion is generated. That is, the input signal to which causes the intermodulation distortion is attributable comes under the influence of the frequency characteristics of the gate-side matching circuit 37A. Similarly, the frequency characteristics of the drain-side matching circuit 37B affects the distortion generated by FET.

Accordingly, to compensate for the frequency characteristics of the distortion generated by FET, a frequency characteristic compensator is provided at the input side of each odd-order distortion generator in the power series predistorter, by which it is possible to compensate for the frequency characteristics of the distortion in conformity to the gate-side frequency characteristics of the amplifier. That is, the provision of the frequency characteristic compensator at the input side of each odd-order distortion generator implements the frequency characteristics that compensate for the frequency characteristics of the gate-side matching circuit 37A at the output of the power amplifier.

Similarly, by placing a frequency characteristic compensator at the output side of each odd-order distortion generator in the digital predistorter, it is possible to provide compensation for the frequency characteristics of the distortion that conforms to the drain-side frequency characteristics of the amplifier. That is, the provision of the frequency characteristic compensator at the output side of each odd-order distortion generator implements the frequency characteristics that compensate for the frequency characteristics of the drain-side matching circuit 37B at the output of the power amplifier. That is, the provision of the frequency characteristic compensator at the output side of each odd-order distortion generator implements the frequency characteristics that compensate for the frequency characteristics of the drain-side matching circuit 37B at the output of the power amplifier.

For example, the frequency characteristics T(f) of the intermodulation distortion by the gate-side matching circuit are expressed by the following equation (4) using Eq. (3).

$$T(f)C_{gs}(V_g) = T_1(f)C_{g1} + T_2(f)C_{g2}V_g + T_3(f)C_{g3}V_g^2 + T_4(f)C_{g4}V_g^3 + T_5(f)C_{g5}V_g^4 \quad (4)$$

From Eq. 84) it will be seen that the digital signal processing type predistorter needs to compensate for the frequency characteristics for each odd-order distortion generator. The same goes for the drain side. Further, the intermodulation distortions occur simultaneously at the gate-side and drain-side of FET, and the power series type predistorter configuration differ with the magnitude of each of the intermodulation distortions defined by Eqs. (1) to (3). The frequency characteristics of the intermodulation distortion by the amplifier described above in respect of FIG. 3 can be considered to be a combined version of the gate-side and drain-side frequency characteristics. The frequency characteristic compensator is provided so that frequency characteristics inverse to the combined frequency characteristics is imparted to the output from each odd-order distortion generator. The frequency characteristic compensator is placed at that one of the input and output terminal sides of FET at which the intermodulation distortion is dominant, or at either side. When it is disposed only at the output or input side of the odd-order distortion generator, the frequency characteristic compensator for compensating for the combined frequency characteristics of the intermodulation distortion cannot always achieve satisfactory compensation; in some cases, however, the compensation performance can be improved by placing the compensator at either of the input and output sides of the odd-order distortion generator.

In this embodiment, the frequency dependence of the distortion suppression by the digital signal processing type predistorter is improved by using a frequency characteristic compensator which compensates for only the frequency characteristics of the gate-side matching circuit 37A and/or frequency characteristic compensator which compensates for the frequency characteristics of both the gate- and drain-side matching circuits 37A and 37B.

Figure 17:
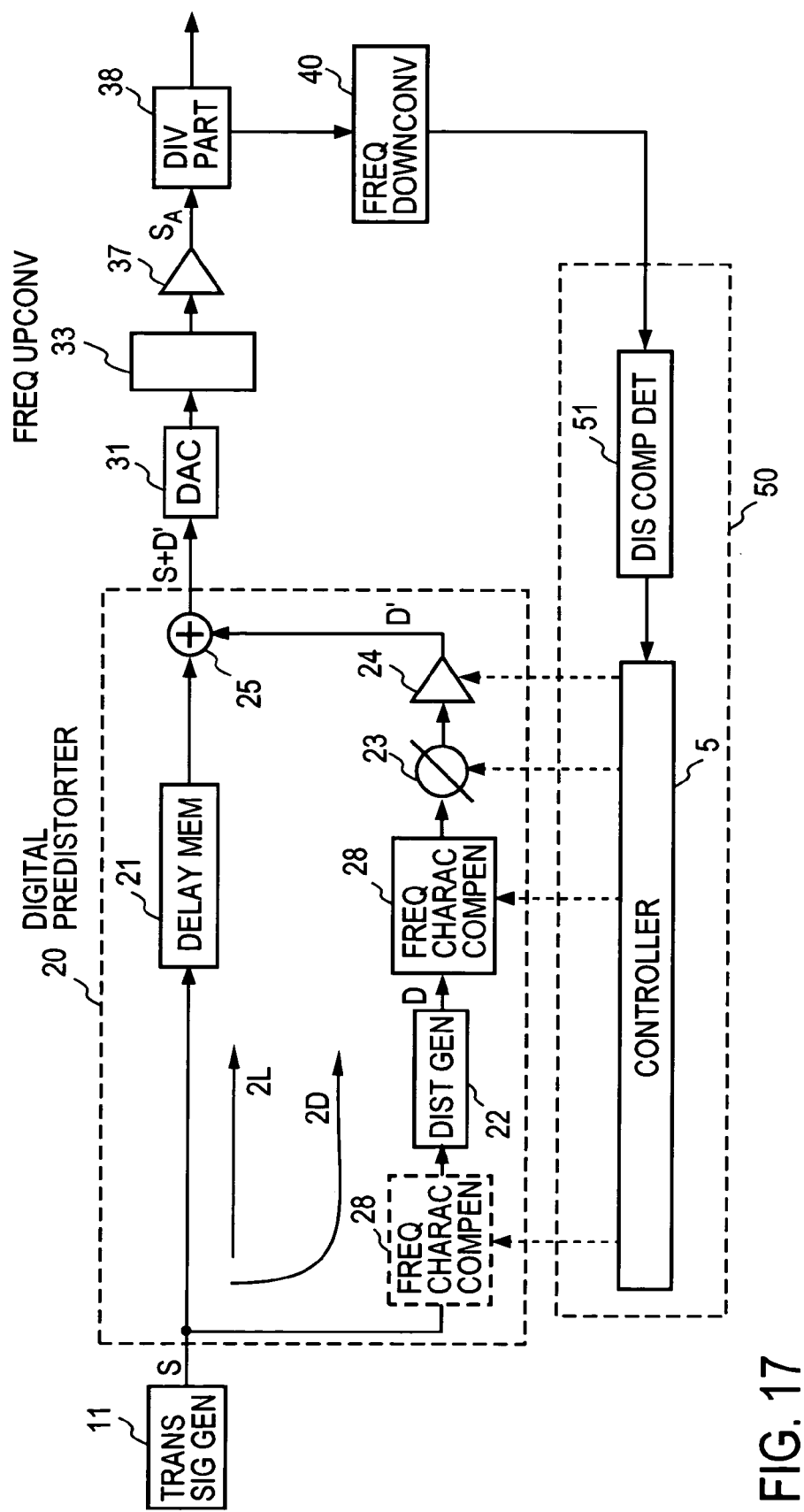
FIG. 17 is a block diagram illustrating a basic configuration of a fifth embodiment of the linear power amplifier according to the present invention.

FIG. 17 illustrates in block form a basic configuration of the fifth embodiment according to the present invention. The basic configuration includes: a digital predistorter 20 for predistorting the transmission signal S from the transmission signal generator 11; a DA converter 31 for converting the predistorted output to an analog transmission signal; a frequency upconverting part 33 for upconverting the analog transmission signal to a high-frequency transmission signal; a power amplifier 37 for amplifying the upconverted transmission signal; and a dividing part 38 for dividing the amplified output into two; a frequency downconverting part 40 for downconverting one of the two divided outputs; a distortion component detecting part 51 for detecting an odd-order distortion component from the downconverted signal; and a controller 5 for controlling a phase adjuster 23 and a gain adjuster 24 based on the detected odd-order distortion component. The distortion component detecting part 51 and the controller 5 constitute the digital predistorter control part 50.

Figure 1:
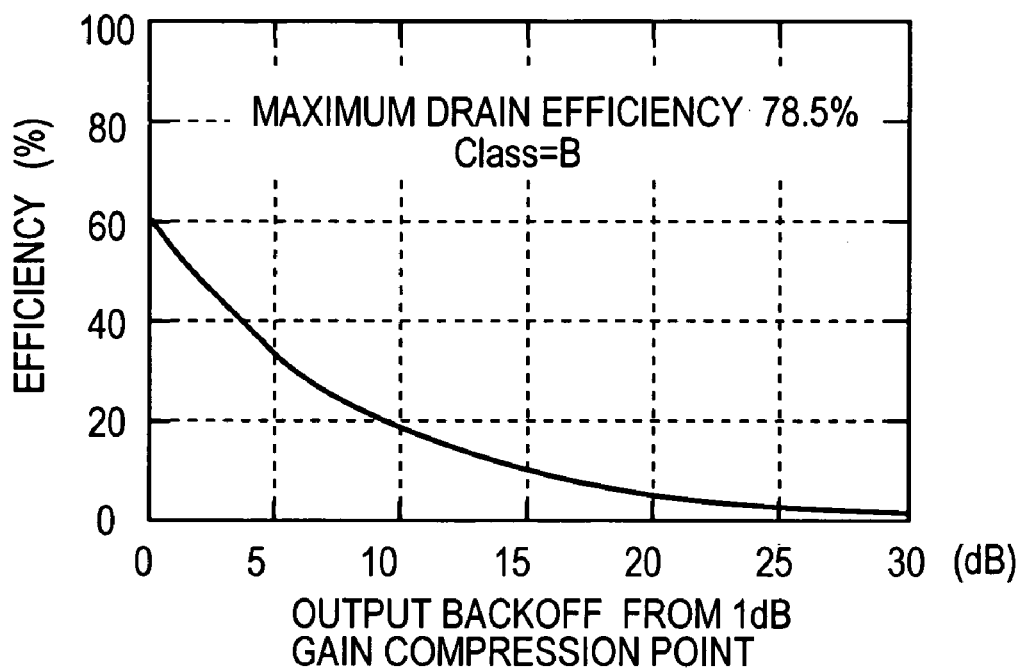
FIG. 1 is a graph showing the relationship between amplification efficiency and an output backoff from a 1 dB gain compression point.
Figure 2:
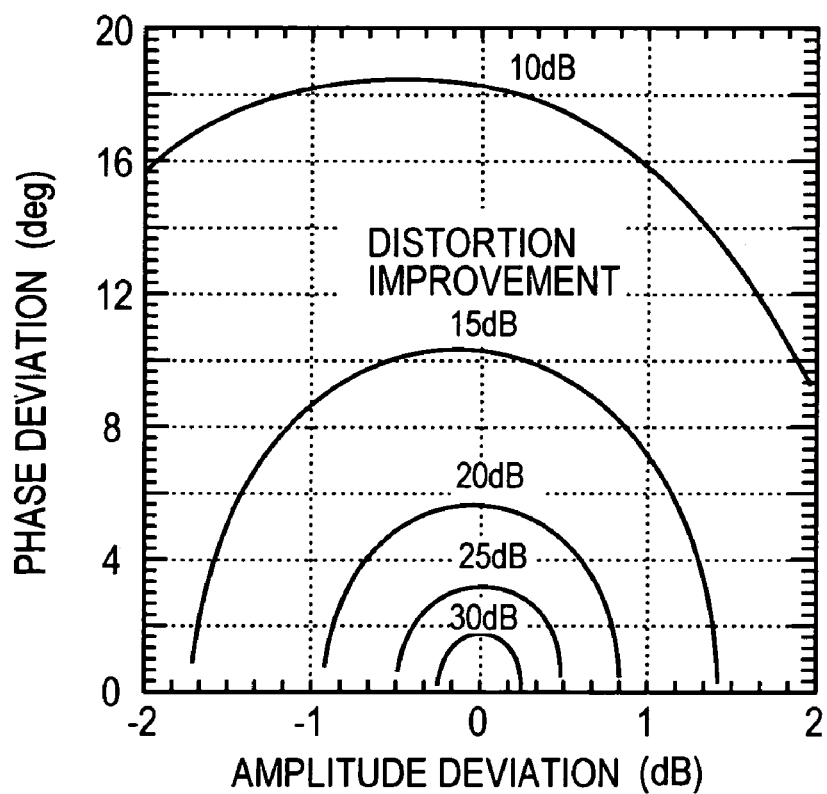
FIG. 2 is a graph showing the relationships between amplitude and phase deviations in respect of a third-order distortion component.
Figure 3:
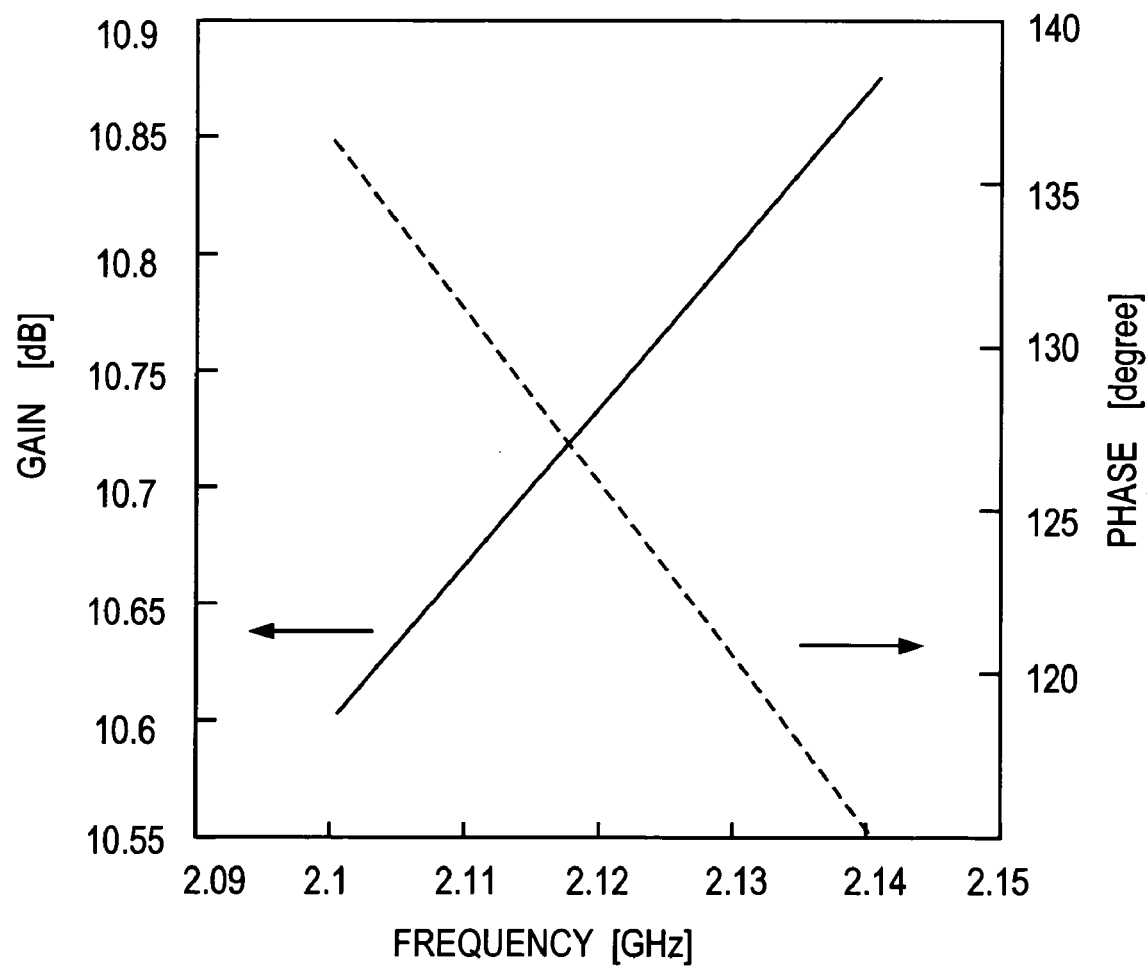
FIG. 3 is a graph showing examples of frequency dependent amplitude and phase of a power amplifier.

Moreover, in the digital predistorter 20 there is placed at the output side of a distortion generator 22 a frequency characteristic compensator 28 by which a characteristic inverse to the frequency characteristic of the power amplifier 37, shown in FIG. 3, is imparted to the distortion generated by the distortion generator 22, and the frequency characteristics for the distortion is controlled by he controller 5.

The input signal S from the transmission signal generator 11 is branched to a linear transfer path 2L and a distortion generating path 2D of the predistorter 20. The power-series-model distortion generator 22 generates an odd-order distortion signal D by use of the input signal branched to the distortion generating path 2D. The frequency characteristic compensator 28 adjusts frequency dependent amplitude and phase characteristics of the distortion signal D to be inverse to the frequency characteristics of the amplifier 37. The output from the frequency characteristic compensator 28 is adjusted in phase and in gain by the phase adjuster 23 and the gain adjuster 24 to yield an adjusted distortion signal D', which applied to the combiner 25. The signal branched to the linear transfer path 2L is provided to the delay memory 21, wherein the amount of delay is corrected relative to the signal on the distortion generating path 2D. The combiner 25 combines the signals S and D' from the linear transfer path 2L and the distortion generating path 2D.

In this configuration, too, in order to maintain a high degree of distortion compensation for a characteristic change of the power amplifier 37 by a temperature change or aging, the output from the power amplifier 37 is monitored by he distortion compensation detecting part 51 via the dividing part 38, and upon detecting a reduction in the distortion compression effect by the distortion component detecting part 51, the controller 5 changes parameters of the phase adjuster 23, the gain adjuster 24 and the frequency characteristic compensator 28. This ensures constant maintenance of a high degree of distortion compensation. Incidentally, as will be understood from the description given of FIGS. 16A and 16B, the frequency characteristic compensator 28 may be provided at the input side of the distortion generator 22 or at either of the input and output sides thereof as indicated by the broken line in FIG. 17.

Figure 18:
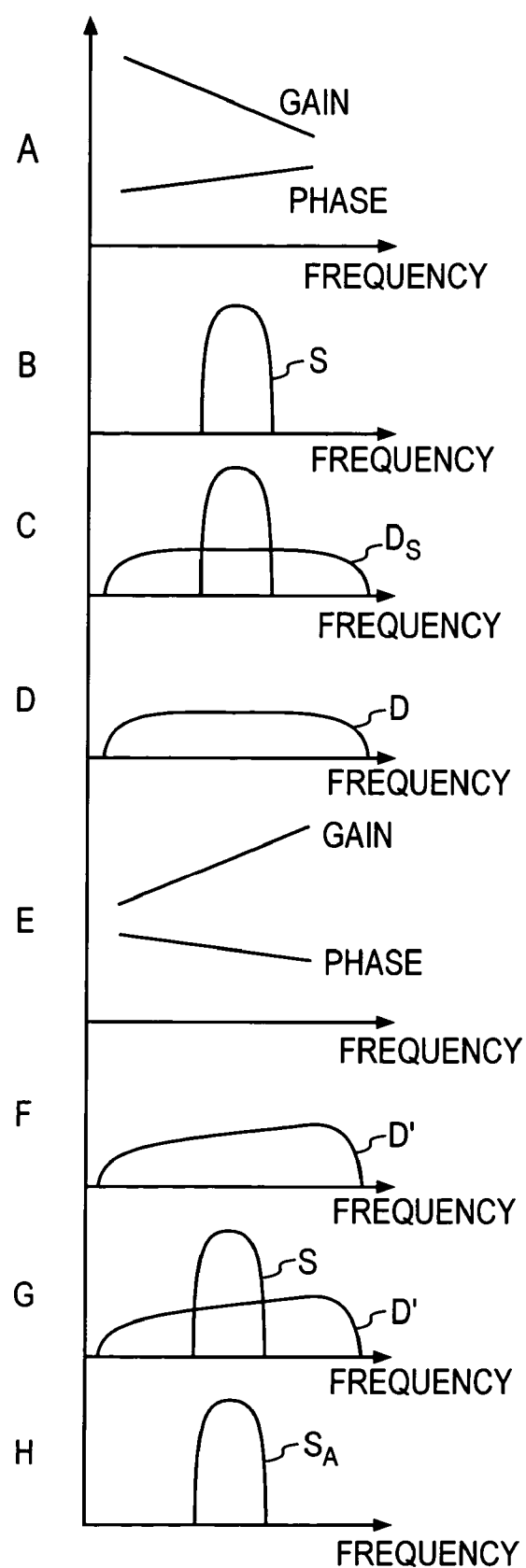
FIG. 18 is a graph for explaining the operation of the fifth embodiment.

Turning now to FIG. 18, a description will be given of the principle on which high-precision distortion compensation can be implemented by the frequency characteristic compensator 28 in FIG. 17. Assume that when supplied with the input signal S shown on Row B, the power amplifier 37 of the frequency characteristics shown on Row A generates such a distortion $D_S$ as shown on Row C. To cancel such a distortion $D_S$, the frequency characteristics of the frequency characteristic compensator 28 are rendered inverse to the frequency characteristics of the power amplifier 37 as shown on Row B, by which the frequency dependent amplitude and phase characteristics of the distortion D by the distortion generator 22 shown on Row D are adjusted to obtain a distortion D' shown on Row F. The gain adjuster 24 adjusts the gain of the distortion produced by the distortion generator so that it has a level at which the distortion $D_S$ generated by the power amplifier 37 can be canceled, and the phase adjuster 23 adjusts the frequency characteristics of the frequency characteristic compensator 28 to be inverse to the frequency characteristics of the power amplifier 37. D' indicates the adjusted characteristics. As a result, the output S+D' from the combiner 25 is a combined version of the frequency-characteristic-compensated distortion D' and the signal S as shown on Row G. The combined signal S+D' applied via the DA converter 31 to the power amplifier 37, by which the frequency characteristics of the power amplifier 37 can be cancelled; accordingly, in the output $S_A$ from the power amplifier 37 there is cancelled the distortion as shown on Row H.

Figure 19:
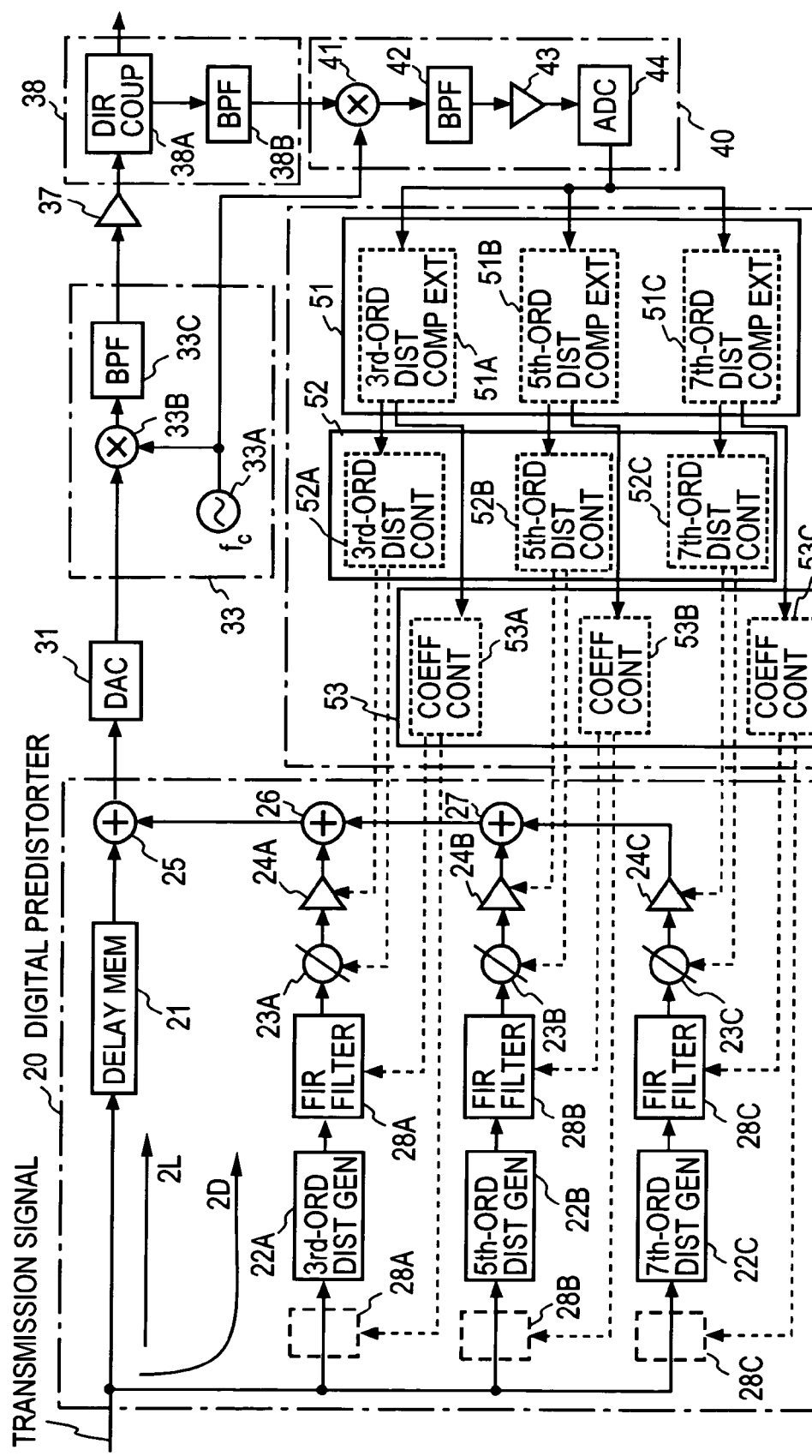
FIG. 19 is a block diagram showing a concrete example of the fifth embodiment.

FIG. 19 illustrates in block form a concrete embodiment based on the basic configuration depicted in FIG. 17. This embodiment comprises: a digital predistorter 20; a DA converter 31; a frequency upconverting part 33 composed of a local oscillator 33A, a mixer 33B and a band-pass filter 33C; a power amplifier 37; a directional coupler 38A and a signal extracting band-pass filter 38B forming a signal extracting part 38; a mixer 41 and a band-pass filter 42 forming a frequency downconverting part 40; and a digital distorter control part 50. The frequency downconverting part 40 includes an AD converter 44 for converting a downconverted extracted signal to a digital signal. The digital predistorter 20 is shown to handle the third, fifth and seventh-order distortion components, but the number of orders may be chosen as desired according to the device configuration used.

The digital predistorter 20 using a power series model is configured to add output signals from a delay path which passes therethrough the fundamental wave component of the transmission signal and the path for generating each odd-order distortion by use of the power series. The odd-order distortion generators 22A, 22B and 22C each perform processing of raising the input transmission signal to the corresponding odd-order power. For instance, letting x represent the transmission signal, the third-order distortion generator raises x to 3rd power. The frequency characteristic compensators 28A, 28B and 28C are FIR (Finite Impulse Response) filters, and their coefficients are set and controlled by the coefficient controllers 53A, 53B and 53C. The output distortion signals from the distortion generators 22A, 22B and 22C are input to the FIR filters 28A, 28B and 28C, by which frequency dependent amplitude and phase characteristics of the distortion signals can be varied.

The output signal from the power amplifier 37 is extracted by the directional coupler 38A and the band-pass filter 38B, and the extracted signal is downconverted by the frequency downconverting part 40. The input signal to the digital predistorter control part 50 is a digitized version of the downconverted signal by the AD converter 44. The digital predistorter control part 50 is made up of odd-order distortion component extractors 51A, 51B and 51C each formed by a distortion component extracting band-pass filter; distortion controllers 52A, 52B and 52C corresponding to the respective odd-order distortion components; and coefficient controllers 53A, 53B and 53C for controlling the coefficients of the FIR filters 28A, 28B and 28C of the respective odd orders. The odd-order distortion controllers 52A, 52B and 52C each control the corresponding ones of the gain adjusters 24A, 24B, 24C and the phase adjusters 23A, 23B, 23C for the outputs from the distortion generators 22A, 22B and 22C in the digital predistorter 20. Incidentally, the odd-order distortion controllers 52A, 52B, 52C and the coefficient controllers 53A, 53B, 53C constitute the distortion characteristic controller 5 in FIG. 17.

The FIR coefficient controllers 53A, 53B and 53C for the respective odd orders each control the coefficients of the corresponding one of the FIR filters 28A, 28B and 28C. The odd-order distortion component extractors 51A, 51B and 51C each extract the corresponding one of the odd-order distortion component signal by a band-pass filter or the like. The odd-order distortion controllers 52A, 52B and 52C use the extracted signals to control, based on the outputs from the odd-order distortion generators 22A, 22B and 22C, the gain adjusters 52A, 52B, 52C and the phase adjusters 23A, 23B, 23C until the compensated amount of distortion reaches such a value that the adjacent channel leakage power ratio (i.e., the level ratio of the distortion component to the transmission signal) goes down below a predetermined value at the output of the power amplifier 37. At the same time, the frequency characteristics of the power amplifier 37 are extracted, and the coefficients of the respective FIR filters 28A, 28B and 28C accordingly. The parameter control can be implemented by use of various optimal algorithms. In the embodiment of FIG. 19, too, the FIR filters 28A, 28B and 28C may connected to only to the inputs or both the inputs and outputs of the third- fifth- and seventh-order distortion generators 22A, 22B and 22C as indicated by the broken lines.

Sixth Embodiment

Figure 20:
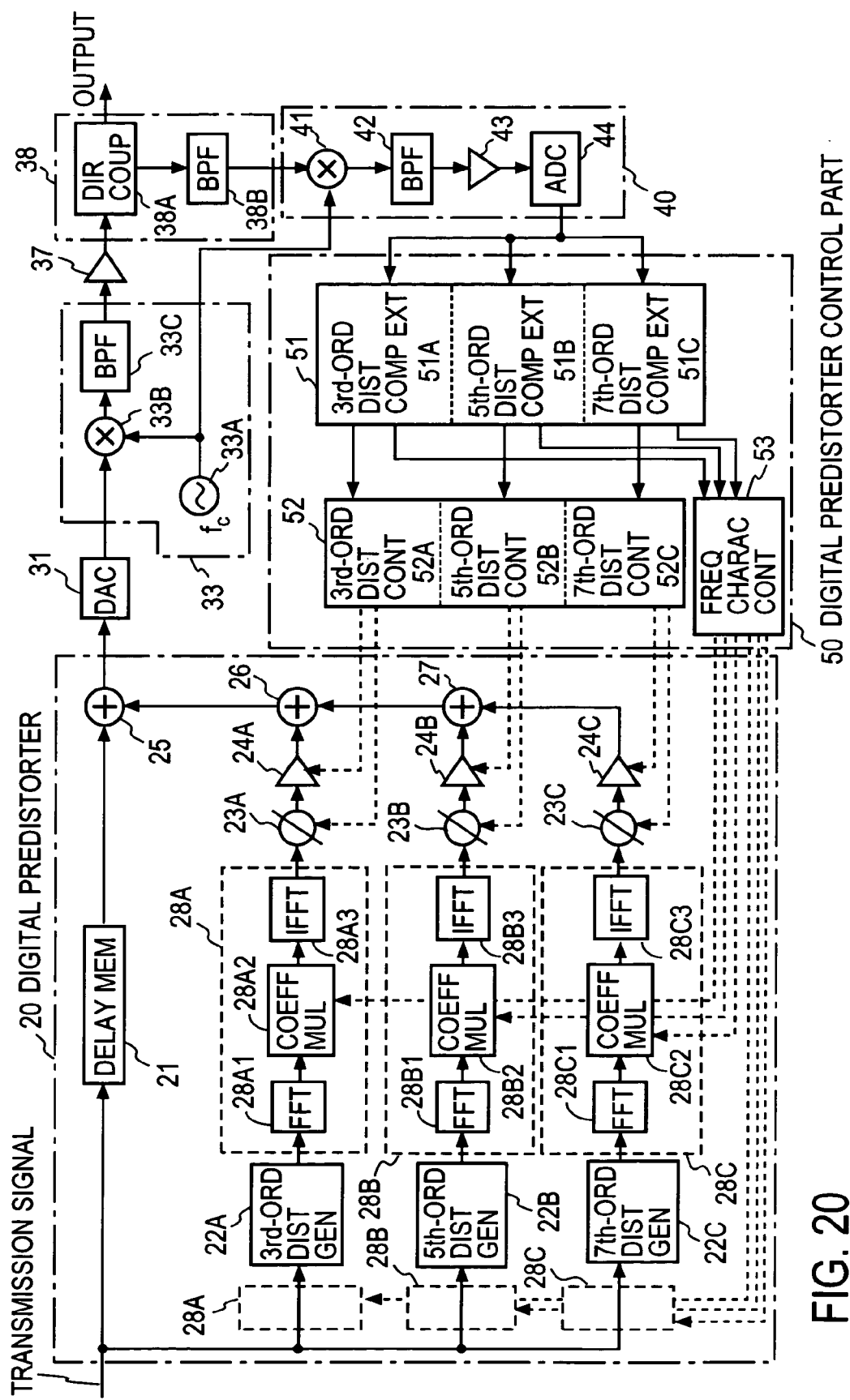
FIG. 20 is a block diagram depicting the configuration of a sixth embodiment of the present invention.

FIG. 20 illustrates in block form an embodiment of a linear power amplifier that uses FFT's as the frequency characteristic compensators 28A, 28B and 28C of the digital predistorter 20. This embodiment is a modified form of the FIG. 19 embodiment, which uses, as each of the frequency characteristic compensators 28A, 28B and 28C (represented by 28A in this case), a set of an FFT (Fast Fourier Transform) part 28A1, a coefficient multiplier 28A2 and an IFFT (Inverse Fast Fourier Transform) part 28A3, instead of using the FIR filter. The same goes for the frequency characteristic compensators 28B and 28C. Except the above this embodiment is identical in construction with the FIG. 19 embodiment. Accordingly, the frequency characteristic control part 53 has the coefficient controllers 53A, 53B and 53C corresponding to the third-, fifth- and seventh-order distortions as is the case wit the frequency characteristic control part 53 in the FIG. 19 embodiment, but they are not shown. The same goes for the embodiments of FIGS. 21, 30 and 31 described later on.

For example, the distortion signal from the third-order distortion generator 22A is applied to the FFT part 28A1, wherein it is Fourier transformed for each of plural samples to frequency domain samples. The amplitude of the sample at each frequency point is multiplied, by the coefficient multiplier 28A2, by the coefficient from the coefficient controller 53A, and the multiplied output is inverse Fast Fourier transformed by the IFFT part 28A3 into a time domain sample. The same goes for the other frequency characteristic compensators 28B and 28C. The frequency characteristic control by FFT is implemented by controlling each multiplication coefficient of FFT as mentioned above. The digital predistorter control part 50 controls the gain adjuster, the phase adjuster and the multiplication coefficient of FFT for each odd order so that the level of the distortion component by the power amplifier 37 relative to the transmission signal goes down below a predetermined value. In this embodiment, too, the frequency characteristic compensators 28A, 28B and 28C may be connected only to the inputs or both of the inputs and outputs of the third-, fifth- and seventh-order distortion generators 22A, 22B and 22C as indicated by the broken lines.

Seventh Embodiment

Figure 21:
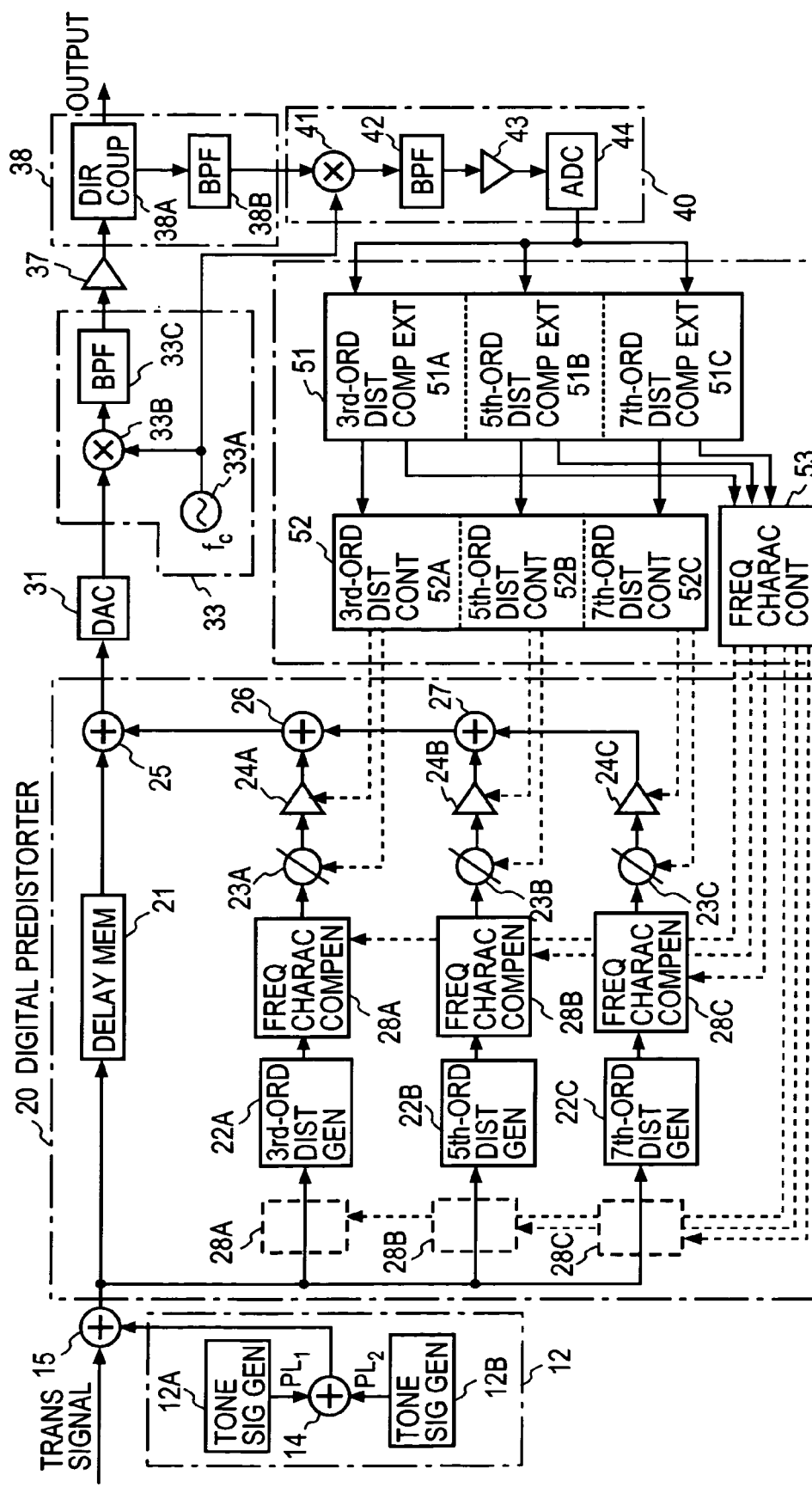
FIG. 21 is a block diagram depicting the configuration of a seventh embodiment of the present invention.

FIG. 21 illustrates in block form a seventh embodiment of the present invention. This embodiment is a modified form of the FIG. 19, which is configured to make an adjustment to the digital predistorter 20 by use of the two pilot signals shown in FIG. 5. The odd-order distortion generators 22A, 22B and 22C of the digital predistorter 20 using a power series model each performs processing of raising the transmission signal and the pilot signal input thereto the corresponding odd order.

The digital predistorter control part 50 is identical in construction with the digital predistorter control part 50 in each of the embodiments of FIGS. 19 and 20. The odd-order distortion controllers 52A, 52B and 52C control the gain adjusters 24A, 24B, 24C and the phase adjusters 23A, 23B, 23C of those of the distortion component generators 22A, 22B and 22C of the digital predistorter 20 which correspond to the controllers 52A, 52B and 52C, respectively. The coefficient controllers 53A, 53B and 53C (not shown) of the frequency characteristic control part 53 control the coefficients of the frequency characteristic compensators 28A, 28B and 28C, respectively. Since two tone signals of the same level as the pilot signal, odd-order distortion components appearing near the tone signals at the output of the power amplifier 37 are extracted by the odd-order distortion component extracting band-pass filters functioning as the distortion component extractors 51A, 51B and 51C of the respective odd orders. While the digital predistorter control part 50 in this embodiment is implemented by digital signal processing, it may also be formed by analog circuits. The frequency characteristic compensation utilizes the distortion components $P_{D3L}$ and $P_{D3H}$ that appear in the bands lower and upper than that of the pilot signal as described previously in respect of FIG. 6.

The frequency characteristic compensators 28A, 28B and 28C may be formed by the FIR filters as in the FIG. 19 embodiment; alternatively, they may each be formed using the FFT parts, the coefficient multiplier and the IFFT part. The frequency characteristic compensation corrects the frequency characteristics by use of the upper and lower distortion signals $P_{D3H}$ and $P_{D3L}$ in FIG. 6. For example, the coefficient controllers 53A, 53B and 53C each interpolate the detected values of the upper and lower distortion components $P_{D3H}$ and $P_{D3L}$ from the corresponding one of the odd-order distortion component extractors 51A, 51B and 51C to thereby estimate the frequency characteristics from a monitor value. The FIR filters or FFT's forming the frequency characteristic compensators 28A, 28B and 28C each set the interpolated value in the corresponding coefficient multiplier. Thereafter each filter or FFT adjusts the multiplication coefficient until a predetermined distortion suppression-frequency characteristic is obtained. The required control can be effected by various optimal algorithms.

Even if modulated waves are used as the pilot signals in place of the tone signals, the same results as mentioned above are obtainable. Furthermore, a different predistorter may also be used for each of the pilot signal and the transmission signal. In this embodiment, too, the frequency characteristic compensators 28A, 28B and 28C may be connected only to the inputs or both of the inputs and outputs of the third-, fifth- and seventh-order distortion generators 22A, 22B and 22C as indicated by the broken lines.

Figure 22:
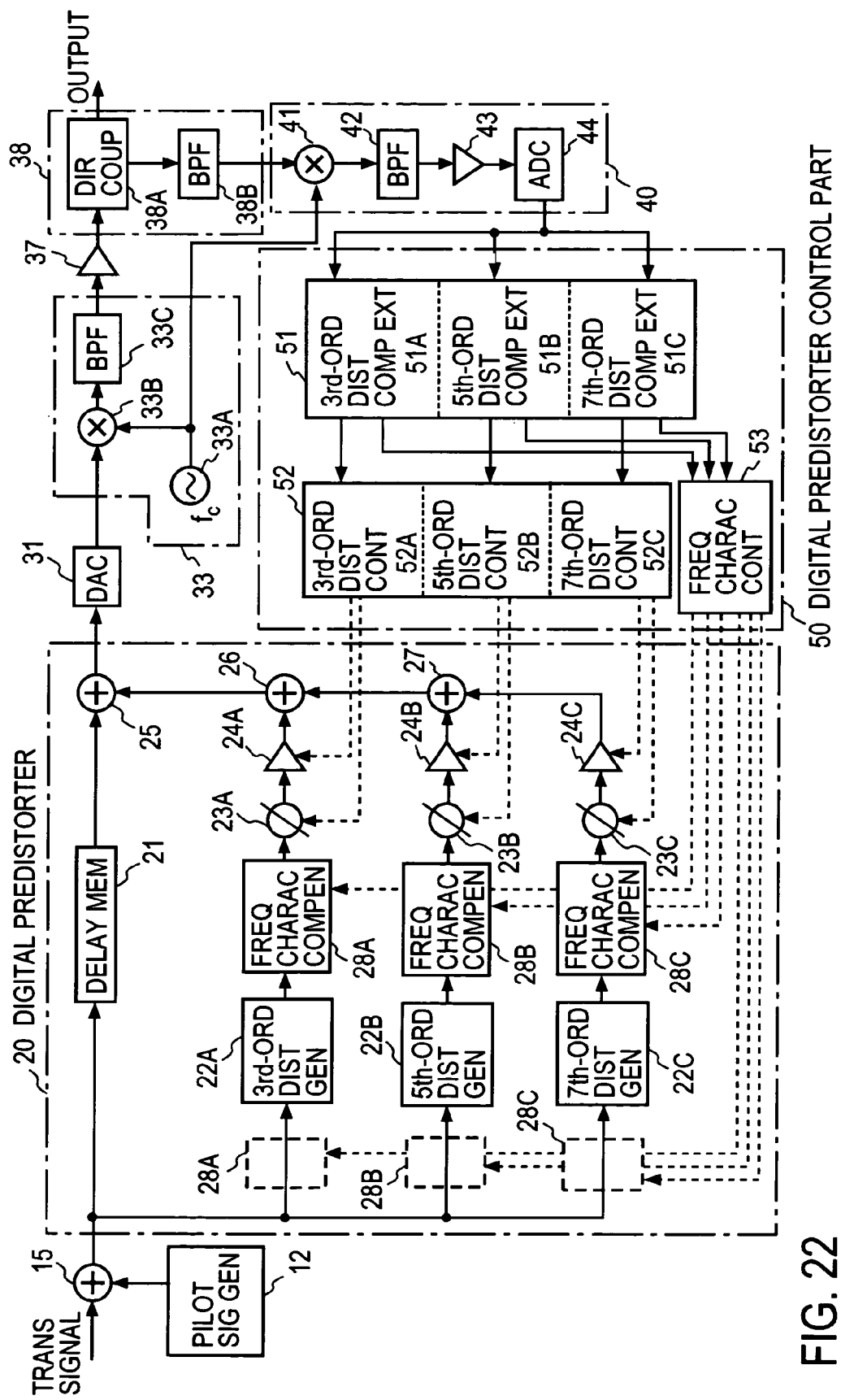
FIG. 22 is a block diagram showing a modified form of the FIG. 21 embodiment in which a pilot signal generator 12 generates a modulation signal as a pilot signal.

FIG. 22 illustrates in block form a modified form of the FIG. 21 embodiment, in which the pilot signal generator 12 generates a modulated signal as in the FIG. 8 embodiment. Since this embodiment is identical in construction with the FIG. 21 embodiment except the above, no description will be repeated. Besides, the digital predistorter in the FIG. 12 embodiment and the digital predistorters $20_1$ and $20_2$ in the embodiments of FIGS. 13 and 14 may also be modified to have the same configuration as that of the digital predistorter 20 shown in FIG. 21, for instance, and the digital predistorter control part 50 in each of the embodiments shown in FIGS. 12, 13 and 14 may also be configured similar to the control part 50 in FIG. 21.

Eighth Embodiment

Figure 23:
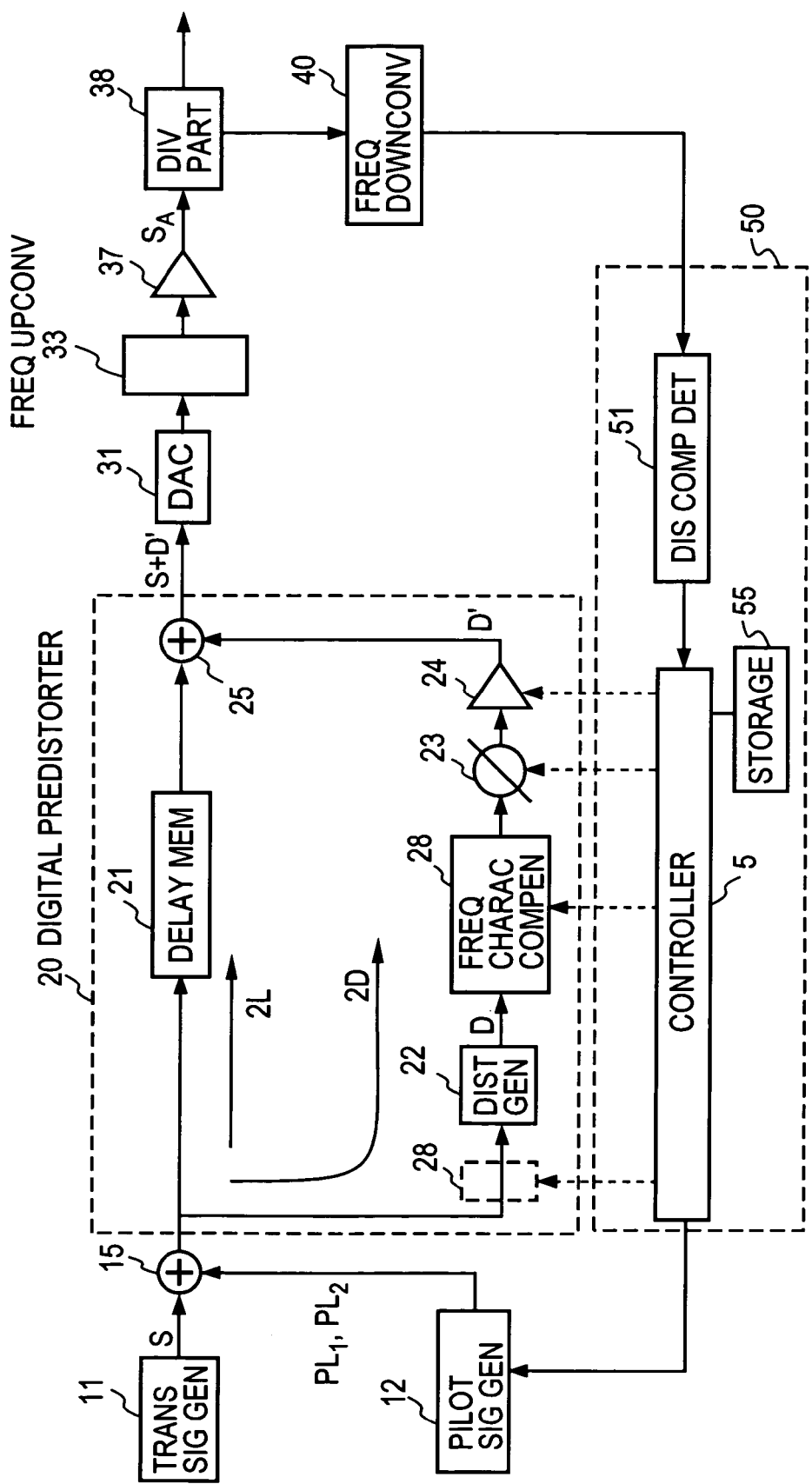
FIG. 23 is a block diagram depicting the configuration of an eighth embodiment of the present invention.

FIG. 23 illustrates in block form a basic configuration of a modification of the FIG. 17 embodiment adapted to adjust the digital predistorter 20 by use of two pilot signals shown in FIG. 5. In this embodiment there are additionally provided a pilot signal generator 12 for generating two pilot signals $PL_1$ and $PL_2$ and an adder 15 for adding together the pilot signals and the transmission signal S, and the controller 5 controls the pilot signal generator 12 to vary the frequency interval between the pilot signals $PL_1$ and $PL_2$ of the same amplitude. In the digital predistorter control part 50 there is provided a storage part 55 for storing the gain and phase obtained from the frequency characteristics of the detected distortion component.

As referred to previously, the transmission signal S may be a baseband signal or IF signal. In the latter case, it is recommended that the frequencies of the pilot signals $PL_1$ and $PL_2$ be set at $f_{IF}-f_i/2$ and $f_{IF}+f_i/2$, respectively, with respect to a predetermined intermediate frequency $f_{IF}$. When the transmission signal S is a baseband signal, a signal $A \cos \pi f_i t$ of an amplitude A and a frequency $f_i/2$ is subjected to quadrature modulation in the frequency upconverting part 33 by use of a carrier signal of a frequency $f_c$; that is, by obtaining the real part of the result of multiplication of $\cos \pi f_i t$ by $(\cos 2\pi f_c t + j \sin 2\pi f_c t)$, the two pilot signals of frequencies $f_{IF}-f_i/2$ and $f_{IF}+f_i/2$ are generated in the transmission frequency band. Accordingly, the pilot signal generator 12 needs only to generate a tone signal of a frequency $f_i/2$ in practice. Since the signal expressed by $\cos \pi f_i t$ can be regarded as having positive and negative frequency components, as given by the following equation $$\cos \pi f_i t = (\exp j\pi f_i t + \exp -j\pi f_i t)/2 \qquad (5)$$

the frequencies of the two pilot signal $PL_1$ and $PL_2$ in the baseband will hereinafter be expressed by $-f_i/2$ and $+f_i/2$, respectively.

The intermodulation distortions, which are created when the pilot signals upconverted in the frequency upconverting part 33 are amplified by the power amplifier 37, are detected in the distortion component detecting part 51 of the digital predistorter control part 50 via the dividing part 38 and the frequency downconverting part 40. The controller 5 adjusts the parameters of the gain adjuster 24, the phase adjuster 23 and the frequency characteristic compensator 28 so that the intermodulation distortions go down below a predetermined value of the adjacent channel leakage power ratio. The use of two pilot signals facilitates extraction of the odd-order distortion components modeled by the power series, allowing ease in adjustment of the frequency characteristic compensator 28, the gain adjuster 24 and the phase adjuster 23 in the digital predistorter 20.

Through variations of the two pilot signal frequencies $-f_i/2$ and $+f_i/2$ by the controller 5, the frequency interval $f_i$ between the two upconverted pilot signals in the transmit frequency band undergoes corresponding variations, causing changes in the frequency of occurrence of each intermodulation distortion on the frequency axis accordingly. Thus, by changing the pilot signal frequencies $-f_i/2$ and $+f_i/2$ at fixed intervals, it is possible to determine the gain and phase of each compensation distortion that achieves a predetermined adjacent channel leakage power ratio for the frequency of occurrence of each resulting intermodulation distortion.

By interpolating gains and phases discretely obtained on the frequency axis by the above method, continuous frequency characteristics for the compensation distortions can be obtained. The thus obtained frequency characteristics are implemented by the frequency characteristic compensator 28 and imparted to the compensation distortions.

Figure 24:
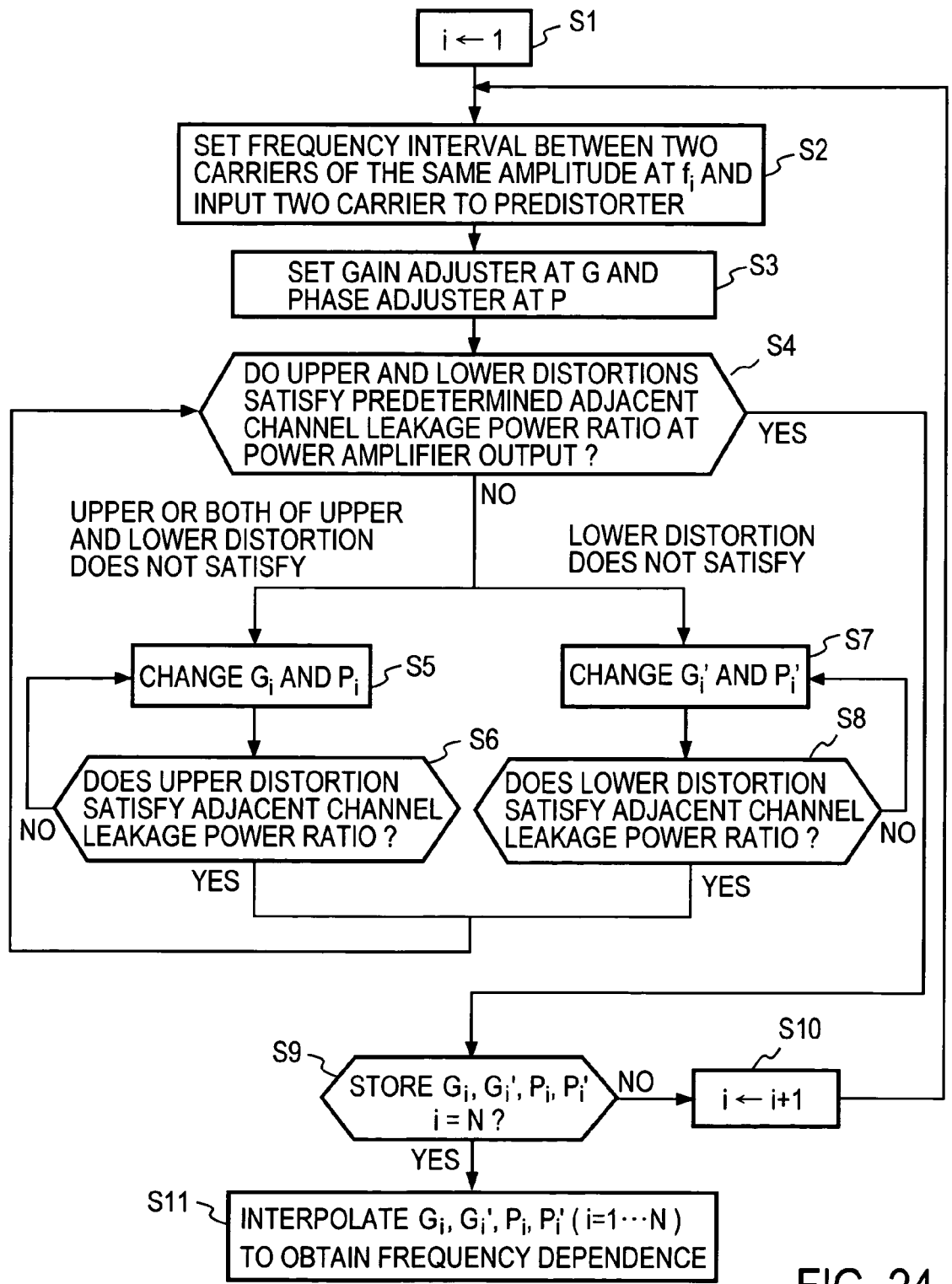
FIG. 24 is a flowchart showing the procedure for calculating characteristics of a frequency characteristic compensator.
Figure 25:
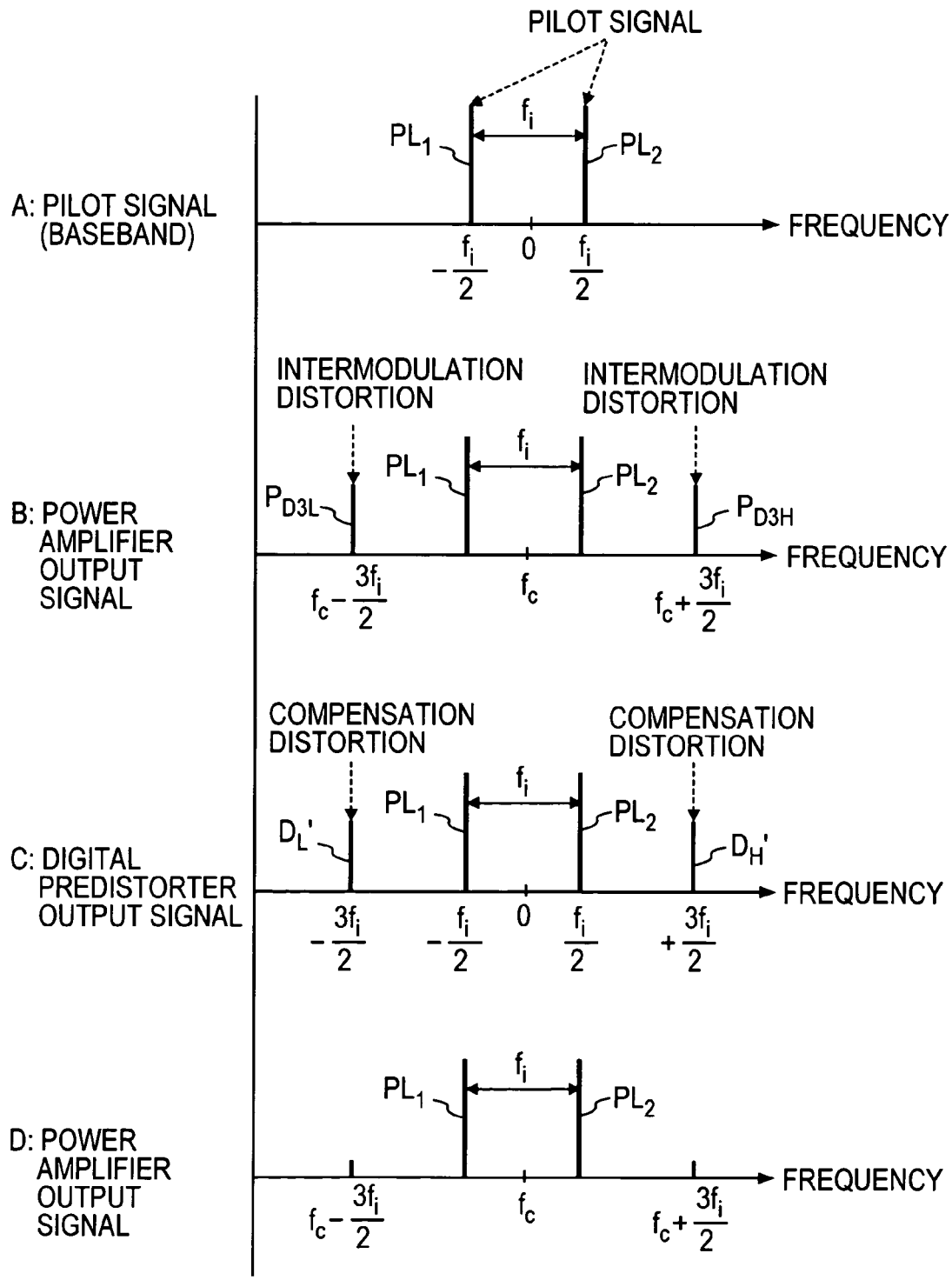
FIG. 25 is a frequency chart for explaining the generation of compensated distortions for a third-order distortion.

FIG. 24 is a flowchart showing the procedure for obtaining the characteristics of the frequency characteristic compensator 28, which will be described below with reference to the frequency diagram of FIG. 25.

Step S1: Initialize the value of a variable i at 1.

Step S2: Generate two digital tone signals of baseband frequencies $-f_i/2$ and $+f_i/2$ (hence, spaced $f_i$ apart) and equal in amplitude as the pilot signals $PL_1$ and $PL_2$ (FIG. 25-Row A). These signal are combined, then the combined signal is upconverted with the center frequency $f_c$ in the frequency upconverting part 33, and when the upconverted signal is input to the power amplifier 37, intermodulation distortions $P_{D3H}$ and $P_{D3L}$ of frequencies $f_c+3f_i/2$ and $f_c-3f_i/2$, for example, expressed by the following equations occur at the output of the power amplifier 37 (Row B):

$$B_{3H} \cos 2\pi(f_c+f_i/2+f_i)t = B_{3H} \cos 2\pi(f_c+3f_i/2)t \qquad (6)$$

$$B_{3L} \cos 2\pi(f_c-f_i/2-f_i)t = B_{3L} \cos 2\pi(f_c-3f_i/2)t \qquad (7)$$

where $B_{3H}$ and $B_{3L}$ represent the amplitudes of distortions at frequencies upper and lower than the carrier frequency $f_c$, respectively.

To cancel the intermodulation distortions $P_{D3H}$ and $P_{D3L}$, the predistorter 20 outputs a signal with compensation distortions $D_L'$ and $_DH'$ added to the pilot signals $PL_1$ and $PL_2$ (Row C). This signal is upconverted in the frequency upconverting part 33, and the upconverted signal is applied to the power amplifier 37. The output signal from the power amplifier 37 becomes a signal compensated for by the digital predistorter 20 (Row D). The gain adjuster 24, the phase adjuster 23 and the frequency characteristic compensator 28 are adjusted in a manner to cancel the intermodulation distortions $P_{D3H}$ and $P_{D3L}$. Incidentally, the gain adjuster 24 impart a fixed gain G to frequency, and the phase adjuster 23 impart a fixed phase change P to frequency.

Step S3: Set the gain G in the gain adjuster 24 and the phase P in the phase adjuster 23. These values may be set as desired, but may preferably be set such that the adjacent channel leakage power ratio becomes relatively small.

Step S4: Extract the third-order intermodulation distortions in the output from the power amplifier 37 by the distortion component detecting part 51, and make a check to see if the upper and lower intermodulation distortions $P_{D3H}$ and $P_{D3L}$ each meet the requirement that the adjacent channel leakage power ratio be smaller than a predetermined value. If only the upper or both the upper and lower distortions do not meet the requirement, go to step S5. When only the lower distortion does not satisfy the requirement, go to step S7, and when either distortion satisfies the requirement, go to step S9.

Step S5: If the upper or both of the upper and lower distortions $P_{D3H}$ and $P_{D3L}$ do not the above-mentioned requirement, the gain $G_i$ and phase $P_i$ corresponding to the frequency $f_c+3f_i/2$ of the frequency characteristic compensator 28 are each varied as predetermined.

Step S6: Make a check to see if the upper distortion $P_{D3H}$ meets the requirement, and if not, return to step S5 and repeat the same processing. When the upper distortion satisfies the requirement, go back to step S4 and make the check again.

Step S7: When only the lower distortion $P_{D3L}$ does not satisfy the requirement, the gain $G_i'$ and phase $P_i'$ corresponding to the frequency $f_c-3f_i/2$ of the frequency characteristic compensator 28 are each varied as predetermined.

Here, assume that the gains $G_i$ and $G_i'$ of the frequency characteristic compensator 28 represent differences from the gain G of the gain adjuster 24 and that the phases $P_i$ and $P_i'$ are differences from the phase change P of the phase adjuster 23.

Step S8: Make a check to see if the lower distortion $P_{D3L}$ meets the requirement, and if not, go back to and repeat step S7. If the distortion meets the requirement, make sure in step S4 that the upper and lower distortions both satisfy the requirement, and go to step S9. Alternatively, skip step S4 and proceed directly to step S9.

Step S9: When the upper and lower distortions $P_{D3H}$ and $P_{D3L}$ both satisfy the requirement that the adjacent channel leakage power ratio be smaller than a predetermined value, store the gains $G_1$, $G_1'$ and the phases $P_1$, $P_1'$ at that time in a storage part 55, and determine if i=N.

Step S10: If not i=N, then increment i by 1 and return to step S2. And set the frequency intervals between the pilot signals set at $f_2$ (in the examples of FIGS. 26A, 26B, 27A and 27B described later on, the frequency spacing $f_i$ decreases with an increase in the variable i), and as is the case with the frequency spacing $f_1$, perform steps S3 through S9 to obtain the gains and phases $G_2$, $G_2'$ and $P_2$, $P_2'$ of the frequency characteristic compensator 28 each of which satisfies the requirement that the adjacent channel leakage power ratio be smaller than a predetermined value, and store them in the storage part 55. In this instance, the values of the gain adjuster 24 and the phase adjuster 23 are fixed at G and P, respectively.

By repeating N rounds of processing while changing the frequency interval between the two pilot signals $PL_1$ and $PL_2$ from i=1 to i=N, $G_1$ to $G_N$, $G_1'$ to $G_N'$, $P_1$ to $P_N$ and $P_1'$ to $P_N'$ are stored in the storage part 55.

Figure 26A:
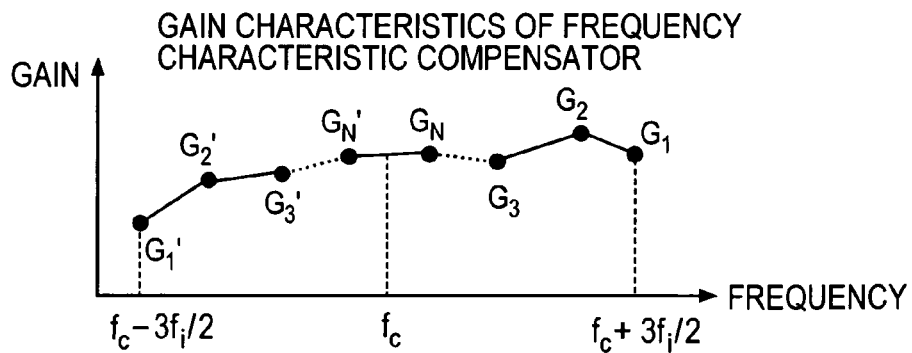
FIG. 26A is a graph showing a grain-frequency characteristic of a frequency characteristic compensator calculated by linear interpolation.
Figure 26B:
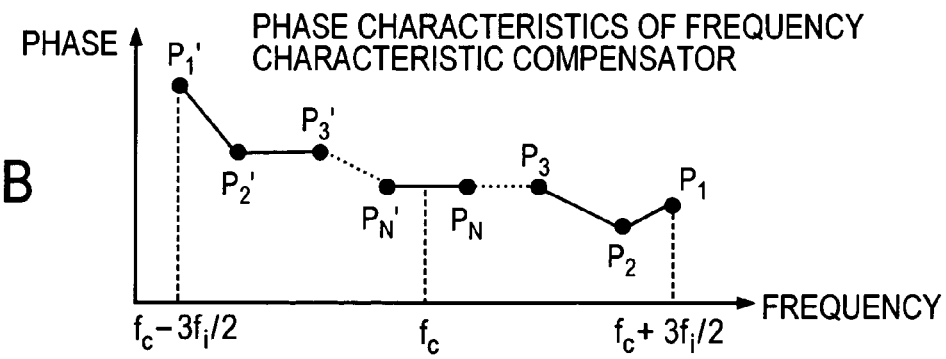
FIG. 26B is a graph showing a phase-frequency characteristic of the frequency characteristic compensator.
Figure 27A:
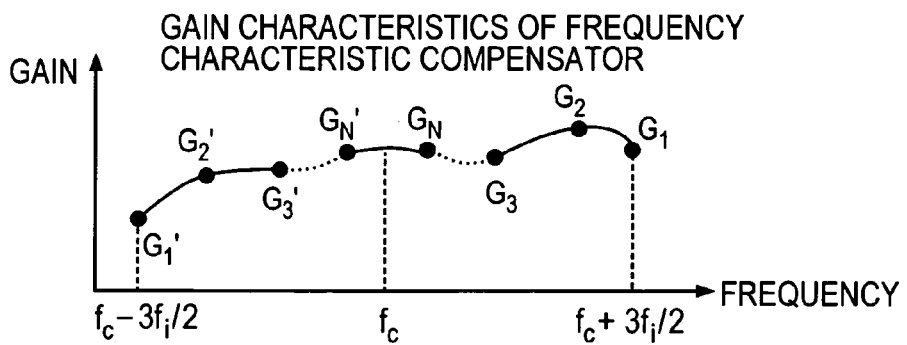
FIG. 27A is a graph showing a gain-frequency characteristic of the frequency characteristic compensator calculated by polynomial interpolation.
Figure 27B:
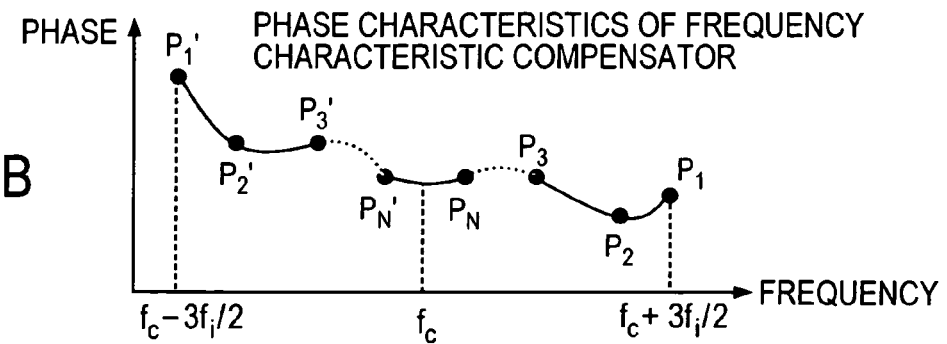
FIG. 27B is a graph showing a determined phase-frequency characteristic of the frequency characteristic compensator.
Figure 28A:
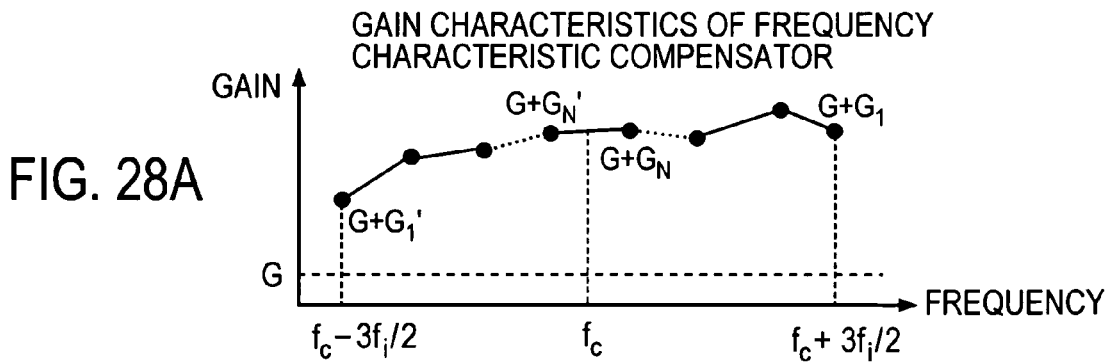
FIG. 28A is a graph showing a combined gain-frequency characteristic of a frequency characteristic compensator and a gain adjuster, calculated by linear interpolation.
Figure 28B:
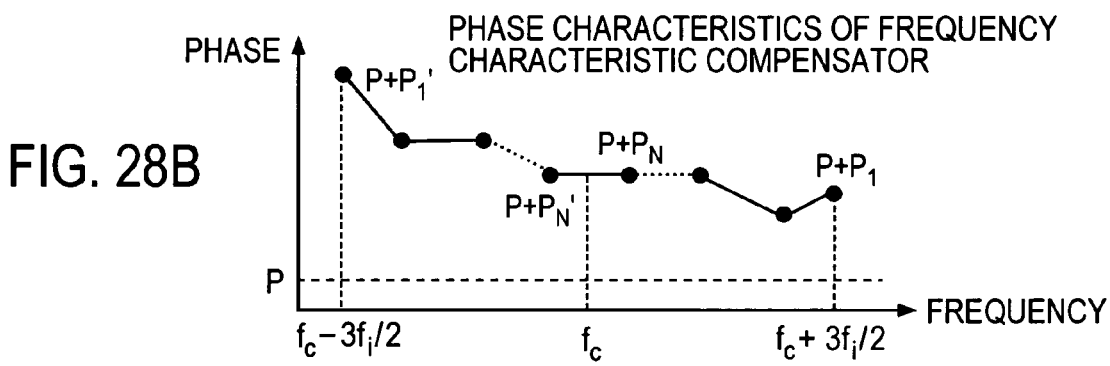
FIG. 28B is a graph showing a combined phase-frequency characteristic of the frequency characteristic compensator and a phase adjuster.
Figure 29A:
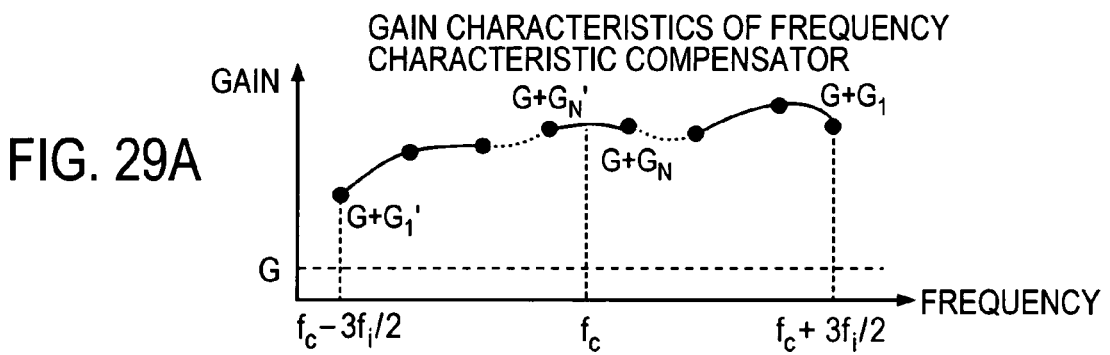
FIG. 29A is a graph showing a combined gain-frequency characteristic of the frequency characteristic compensator and the gain adjuster, calculated by polynomial interpolation.
Figure 29B:
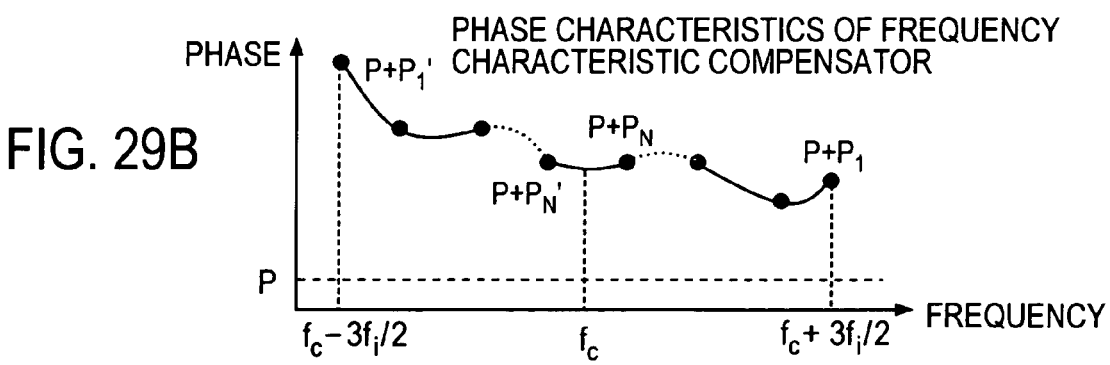
FIG. 29B is a graph showing a combined phase-frequency characteristic of the frequency characteristic compensator and the phase adjuster.

Step S11: Obtain the frequency characteristics for compensation distortion by use of the values $G_1$ to $G_N$, $G_1'$ to $G_N'$, $P_1$ to $P_N$ and $P_1'$ to $P_N'$ obtained as described above. The frequency characteristics can be obtained by interpolating the gains $G_1$ to $G_N$, $G_1'$ to $G_N'$ and the phases $P_1$ to $P_N$ and $P_1'$ to $P_N'$ between point as shown FIG. 26A, 26B, or 27A, 27B. FIGS. 26A and 26B show linear interpolation, and FIGS. 27A and 27B show polynomial interpolation; but other interpolation schemes, such as spline and Lagrangean interpolation schemes can also be used.

By interpolating the discretely obtained gains and phases as mentioned above, the frequency characteristics of the distortion component are implemented by the frequency characteristic compensator 28. The ultimate frequency characteristics for the distortion component are a combined version of the frequency characteristics of the gain adjuster 24, the phase adjuster 23 and the frequency characteristic compensator 28. For higher-precision distortion compensation, the frequency spacing of the pilot signals is further reduced. While the above description has been given of the third-order distortion alone, the above-described method can be used for compensation for fifth- or higher-order distortion as well.

Ninth Embodiment

Figure 30:
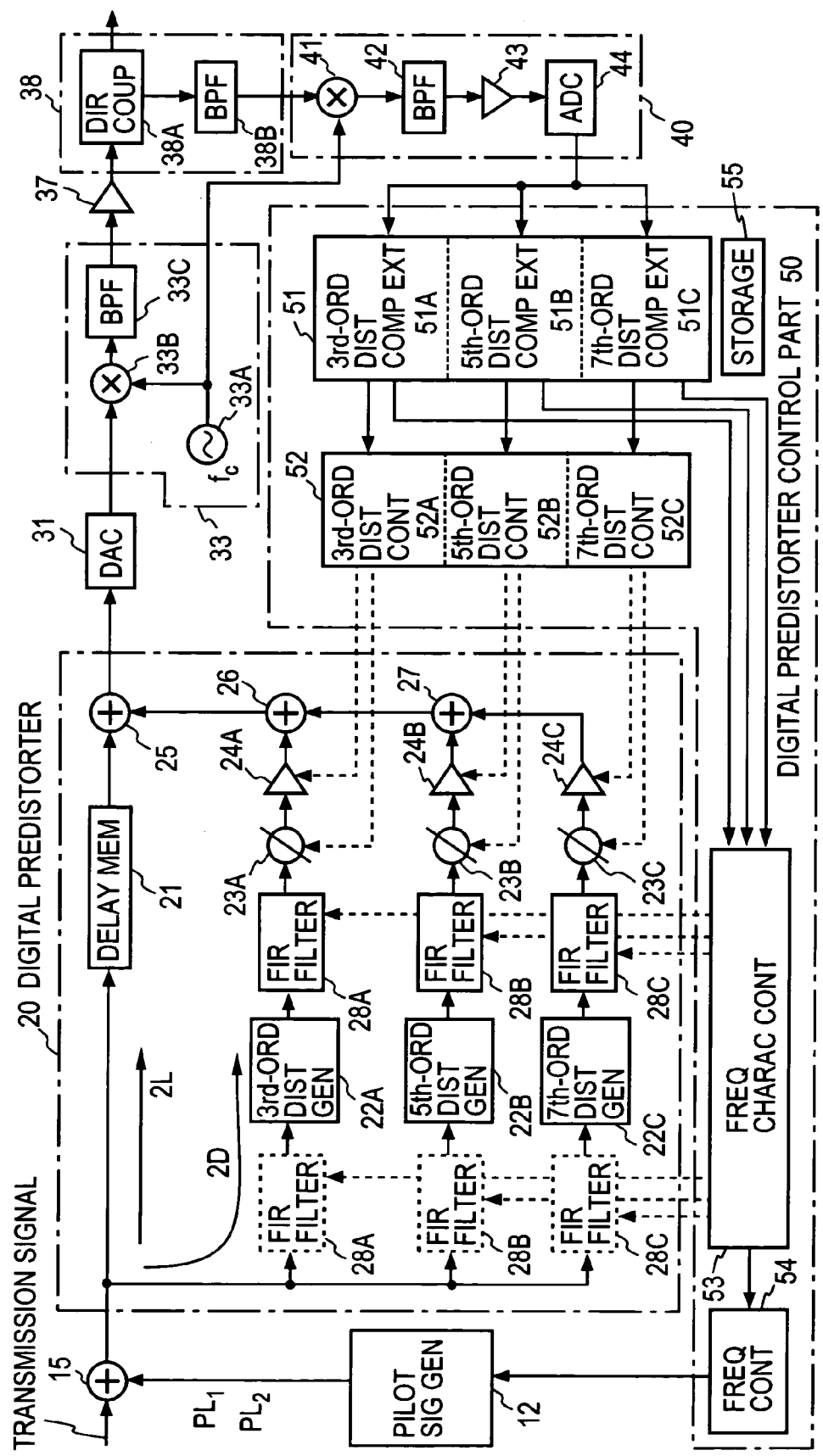
FIG. 30 is a block diagram illustrating the configuration of a ninth embodiment of the present invention.

FIG. 30 illustrates a more specific configuration of the FIG. 23 embodiment, which uses the digital predistorter 20 in which the frequency characteristic compensators 28A, 28B and 28C are formed by FIR filters as in the FIG. 19 embodiment. Let is be assumed that the pilot signal generator 12 generates digital tone signals $PL_1$ and $PL_2$ of variable frequencies expressed by $-f_i/2$ and $+f_i/2$. The digital predistorter control part 50 further includes a frequency controller 54 for controlling the oscillation frequency $f_i$ of the pilot signal generator 12 in correspondence to the control by the frequency characteristic control part 53. This embodiment is identical in construction with the FIG. 19 embodiment except the above.

The two tone signals spaced $f_i$ apart and equal in amplitude are input as the pilot signals $PL_1$ and $PL_2$ to the digital predistorter 20, which outputs a signal with compensation distortions added to the pilot signals. The output signal is converted by the DA converter 31 to an analog signal, which is applied to the frequency upconverting part 33 and upconverted therein to a high-frequency carrier signal of the center frequency $f_c$. The high-frequency signal is amplified by the power amplifier 37. The compensation distortions created by the digital predistorter 20 are so set as to provide distortion compensation throughout the transmission route. Accordingly, the compensation distortions in the input signal to the power amplifier 37 and in the output signals from the digital predistorter may differ from each other. That is, a desired device for changing the phase and amplitude of the signal may be inserted between the output of the digital predistorter 20 and the input of the power amplifier 37.

As is the case with the FIG. 19 embodiment, the intermodulation distortion component is extracted by the directional coupler 38A and the band-pass filter 38B, and down-converted in the frequency downconverting part 40. The input signal to the digital predistorter control part 50 is a digitized signal of the downconverted signal. The compensation for the third-order distortion will be described below by way of example. The third-order distortion component extractor 51A extracts, by upper band-pass filter and a lower band-pass filter, the upper and lower intermodulation distortion signals that are third-order distortion components. The gain adjuster 24A, the phase adjuster 23A and the frequency characteristic compensator 28A use the extracted signals to vary the amplitude and phase of the output from the third-order distortion signal generator until the distortion compensation reaches such a value that the adjacent channel leakage power ratio at the output of the power amplifier 38 goes down below a predetermined value.

The procedure of obtaining these compensation parameters begins with setting the gain G of the gain adjuster 24A and the phase P of the phase adjuster 23A as referred to previously in respect of FIG. 23. These values may be set as desired, but may preferably be set such that the adjacent channel leakage power ratio becomes relatively small.

Next, the gain $G_1$ and the phase $P_1$ of the frequency characteristic compensator 28A at the upper frequency ($f_c+3f_1/2$) and the gain $G_1'$ and the phase $P_1'$ at the lower frequency ($f_c-3f_1/2$) are adjusted so that the adjacent channel leakage power ratio becomes lower than a predetermined value. This can be done by use of various optimization algorithms such as the least square estimation method and the steepest descent method. Next, the frequency interval between the two pilot signals of the same amplitude is changed to $f_2$, and $G_2$, $G_2'$ and $P_2$, $P_2'$ are calculated. This procedure is repeated N times to obtain those gains and phases $G_1$ to $G_N$, $G_1'$ to $G_N'$, $P_1$ to $P_N$ and $P_1'$ to $P_N'$ of the frequency characteristic compensator 28 for the frequencies $f_1$ to $f_N$ which satisfy the requirement that the adjacent channel leakage power ratio be smaller than a predetermined value. The thus obtained gain and phase values can be interpolated using the linear, polynomial, Lagrangean, or spline interpolation scheme. The tap coefficients of the FIR filter are se by the controller such that the gain and frequency characteristics obtained by interpolation are implemented.

While the above description has been given only of the third-order distortion, compensation for fifth- higher-order distortion can also be achieved by the above-described method. In such a case, intermodulation distortion corresponding to the odd-order distortion to be compensated for is extracted. The FIR filters 28A, 28B and 28C may also be disposed at the input sides of the odd-order distortion generators 22A, 22B and 22C.

The amplitude and phase of the distortion component in the output from the power amplifier 37 varies due to temperature or aging. Therefore, to provide high-precision compensation for distortions at all times, it is necessary to adaptively control setting of the gain adjusters 24A, 24B, 24C, the phase adjusters 23A, 23B, 23C and the frequency characteristic compensators 28A, 28B, 28C. In this embodiment the use of two pilot signals enables their adaptive control.

Tenth Embodiment

Figure 31:
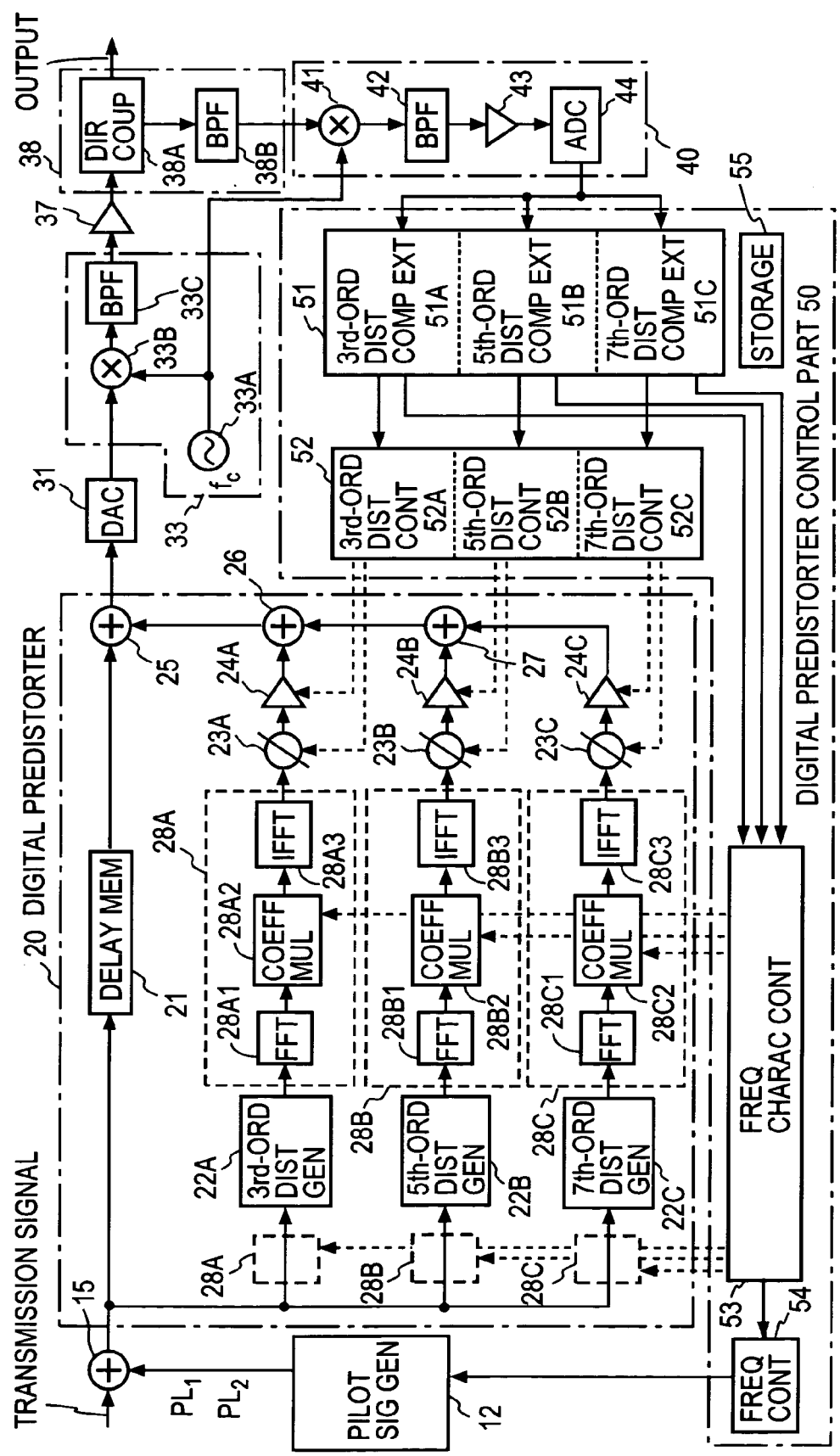
FIG. 31 is a block diagram illustrating the configuration of a tenth embodiment of the present invention.

FIG. 31 illustrates in block form a modified form of the FIG. 30, in which the frequency characteristic compensators 28A, 28B and 28C are formed using the three sets of FFT part, coefficient multiplier and IFFT part 28A1, 28A2, 28A3-28B1, 28B2, 28B3-28C1, 28C2, 28C3 as in the FIG. 20 embodiment, instead of using the FIR filters. As described previously in respect of FIG. 20, the output signals from the distortion generators 22A, 22B and 22C are converted to frequency domain signals by Fourier transform processing in the FFT parts 28A1, 28B1 and 28C1, then the frequency domain signals are multiplied by the frequency compensation characteristics by the coefficient multipliers 28A2, 28B2 and 28C2, and the multiplied output signals are inversely transformed to time domain signals in the IFFT parts 28A3, 28B3 and 28C3. The digital predistorter control part 50 controls gain adjusters 2A, 24B, 24C, and the phase adjusters 23A, 23B, 23C, and the multiplication coefficients of the frequency characteristic compensators 28A, 28B and 28C so that the distortion components in the output from the power amplifier 37 each achieve the predetermined adjacent channel leakage power ratio. The method for setting the coefficients of the frequency characteristic compensators 28A, 28B and 28C by use of the pilot signal is the same as described previously in respect of the FIG. 30 embodiment.

The configuration of the digital predistorter 20 and the digital predistorter control part 50 shown in FIGS. 10 and 20 (or FIGS. 30 and 31) may also be applied to he two digital predistorters $20_1$, $20_2$ and the configuration of the digital predistorter control part 50 in the embodiments of FIGS. 10, 22 and 13. Similarly, the configuration of the digital predistorter 20 and the configuration of the digital predistorter control part 50 shown in FIGS. 19 and 20 (or FIGS. 30 and 31) may also be applied to the digital predistorter 20 and the digital predistorter control part 50 in FIGS. 12 and 14.

While in the above FIR filters have been described to be used as the frequency characteristic compensators, they may be replaced with IIR (Infinite Impulse Response) filters.

Eleventh Embodiment

The embodiment FIG. 23 and the embodiments of FIGS. 30 and 31 are configured to determine the frequency characteristics of the frequency characteristic compensators 28 (29A, 28A, 28C) while sequentially changing the frequency intervals Δf between the two pilot signals $PL_1$ and $PL_2$ of the same amplitude. In the embodiment described below, however, the frequencies of the pilot signals are fixed, and the frequencies of the high-frequency pilot signals are sequentially changed by steps of Δf in the working band of the power amplifier by sequentially changing the upconverting frequency, then intermodulation distortions at the respective frequencies are detected, and the characteristics of the frequency characteristic compensator 28 are determined accordingly.

This embodiment will be described below with reference to FIG. 32.

As is the case with the FIG. 30 embodiment, this embodiment comprises: a pilot signal generator 12; an adder 15; a digital predistolter 20; a DA converter 31; a frequency upconverting part 33; a power amplifier 37; a divider 38; a frequency downconverting part 40; and a digital predistorter control part 50.

This embodiment differs from the FIG. 30 embodiment in that instead of changing the frequencies of the pilot signals, a frequency controller 54 controls the local oscillation frequency of the upconverting part to change so that the frequencies of the pilot signals undergo sequential variations in the operating band of the power amplifier 37 while at the same time the controller 54 correspondingly changes the oscillation frequency of the local oscillator 45 in the frequency downconverting part 40 to convert the distortion components of the pilot signals to the base band. In this embodiment the upconverting part 33 is configured to perform upconversion in two stages. That is, a local oscillator 33A1 of a variable frequency $f_{IF}$, a mixer 33B1 and a band-pass filter 33C1 perform the first-stage upconversion to convert the output from the DA convert 31 to an IF signal. A local oscillator 33A2 of a fixed frequency $f_c'$, a mixer 33B2 and a band-pass filter 33C2 perform the second-stage upconversion to convert the IF signal to a high-frequency signal.

Since the local oscillation frequency $f_{IF}$ for conversion to the IF signal is sufficiently lower than the local oscillation frequency (carrier frequency) $f_c$ for upconversion in the case of FIG. 30, such two-stage upconversion provides increased accuracy in setting the frequency for upconverting the baseband signal that is the output from the DA converter 31. Theoretically, however, the upconverting part 33 may be of a single-stage configuration as in the FIG. 30 embodiment.

Incidentally, in this embodiment a series connection of the phase adjuster 23A the gain adjuster 24A in FIG. 30 is referred to as a vector adjuster 234A in the digital predistorter 20, and also vector adjusters 234B and 234C are each representative of a similar series connection; the same goes for other embodiment.

In this embodiment, too, the frequency characteristic compensators 28A, 28B and 28C may be disposed at the input sides or both of the input and output sides of the third-, fifth- and seventh-order distortion generators 22A, 22B and 22C as indicated by the broken lines.

Figure 32:
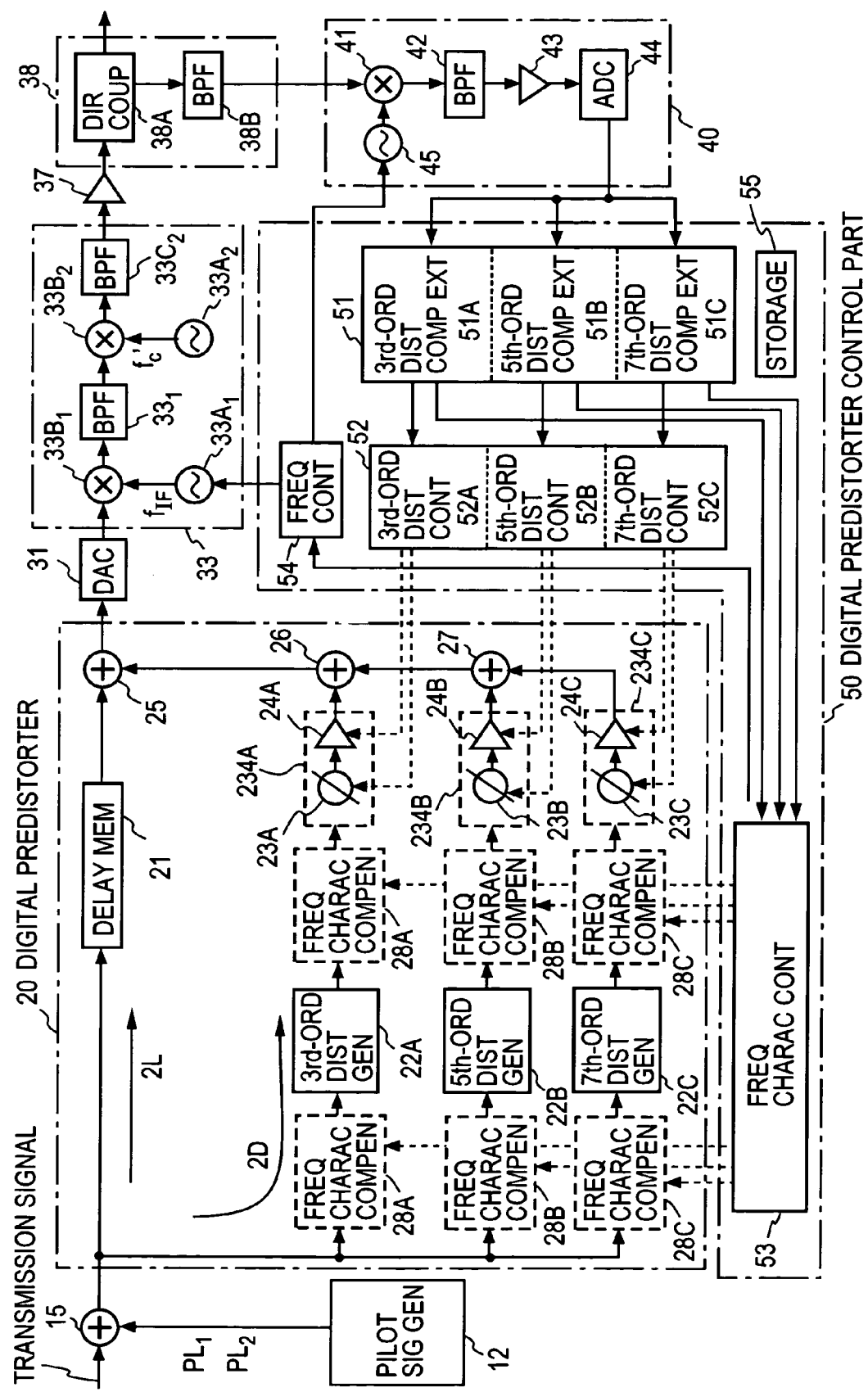
FIG. 32 is a block diagram illustrating the configuration of an eleventh embodiment of the present invention.
Figure 33:
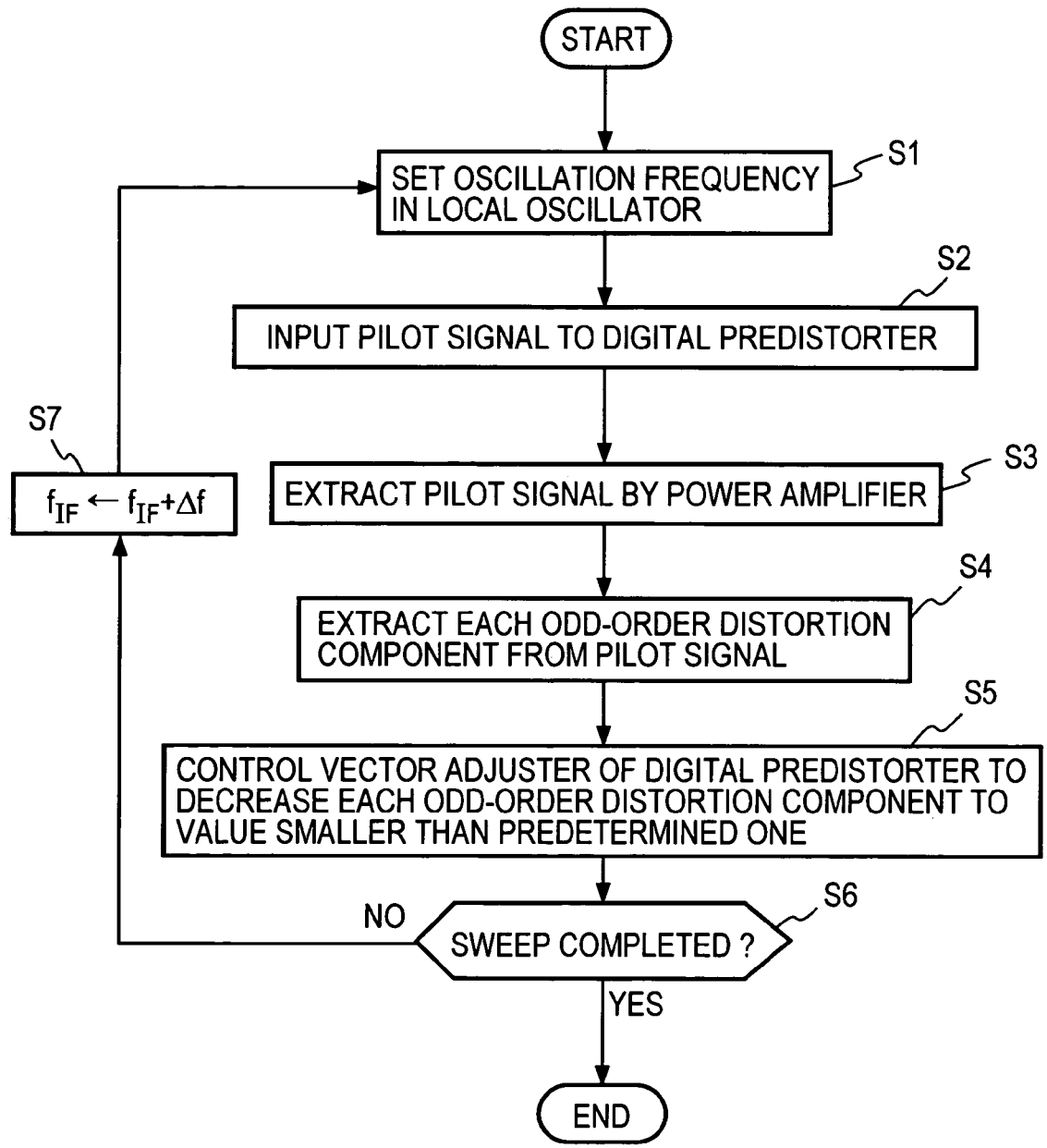
FIG. 33 is a flowchart showing the procedure for setting characteristics of the frequency characteristic compensator in the FIG. 32 embodiment.

FIG. 33 is a flowchart showing a control procedure for determining the characteristics of the frequency characteristic compensators 28A, 28B and 28C in the FIG. 32 embodiment. This determination of the characteristics takes place during a non-signal transmission period.

Step S1: The frequency characteristic control part 53 sets the frequency $f_{IF}$ for converting the pilot signals to an IF signal in the local oscillator 33A1 of the frequency upconverting part 33.

Step S2: The pilot signals $PL_1$ and $PL_2$ are input to the digital predistorter 20. The pilot signals are then provided from the digital predistorter 20 to the DA converter 31 for conversion to analog form, after which they are subjected to the two-stage frequency upconversion in the upconverting part 33, thereafter being input as an RF signal to the power amplifier 37.

Step S3: The output RF signal from the power amplifier 37 is divided into two, one of which is provided to the frequency downconverting part 40 to generate pilot signal components containing distortion components in the baseband are generated.

Step S4: The distortion extractors 52A, 52B and 52C extract respective odd-order distortion components. At this time, the distortion components of each odd order are detected at frequencies upper and lower than the fundamental wave.

Step S5: The odd-order distortion controllers 52A, 52B and 52C control the phases and gains of the odd-order distortions by the vector adjusters 234A, 234B, and 234C of the digital predistorter 20 in manner to minimize the odd-order distortion components being detected. The set values in the frequency characteristic compensators 28A, 28B and 28C to minimize the odd-order distortion components are stored in the storage part 55 in correspondence to the respective odd-order distortion components. The odd-order distortion components may be adjusted to be smaller than a certain set value. And the set values may be set by external setting means like a keyboard.

Step S6: The frequency characteristic control part 53 makes a check to determine whether the repeat count of a series of processing in steps S1 through S5 has reached a predetermined value, that is, whether the frequency sweep has been completed, and if so, ends the setting of the frequency characteristics.

Step S7: If it is determined in step S6 that the frequency sweep is not complete, increment the set frequency $f_{IF}$ to $f_{IF}+\Delta f$, and return to step S1 to repeat the series of steps S1 through S5.

Thus stored values are interpolated to obtain a frequency characteristic, which is set to the frequency characteristic compensator in the same manner as described with the tenth embodiment.

In the FIG. 32 embodiment, too, the frequency characteristic compensators 28A, 28B and 28C may be disposed at the input sides or both of the input and output sides of the respective odd-order distortion generators 22A, 22B and 22C as indicated by the broken lines. When the frequency characteristic compensators 28A, 28B and 28C are disposed at both input and output sides of the odd-order distortion generator 22A, 22B and 22C, the processing of FIG. 33 is performed separately for the input- and output-side frequency characteristic compensators to set their characteristics.

As referred to previously in respect of FIGS. 16A and 16B, the nonlinearity of the power amplifier is determined by the relationship of nonlinearity dependence between the input and output sides. When the gate side (input side) and the drain side (output side) exert different influence on the frequency characteristics of the intermodulation distortions by the power amplifier, the provision of the frequency characteristic compensator only at the input or output side of each odd-order distortion generator may sometimes make it difficult to render the frequency characteristics of the frequency characteristic compensator obtained by the FIG. 3 procedure sufficiently inverse to the frequency characteristics of the intermodulation distortions by the power amplifier. By disposing the frequency characteristic compensator at either side of each odd-order distortion generator and controlling it independently of the others, it is possible to obtain characteristics for flattening the frequency characteristics at either side of the power amplifier, that is, frequency characteristics inverse to those of the intermodulation distortions by the power amplifier.

Figure 34:
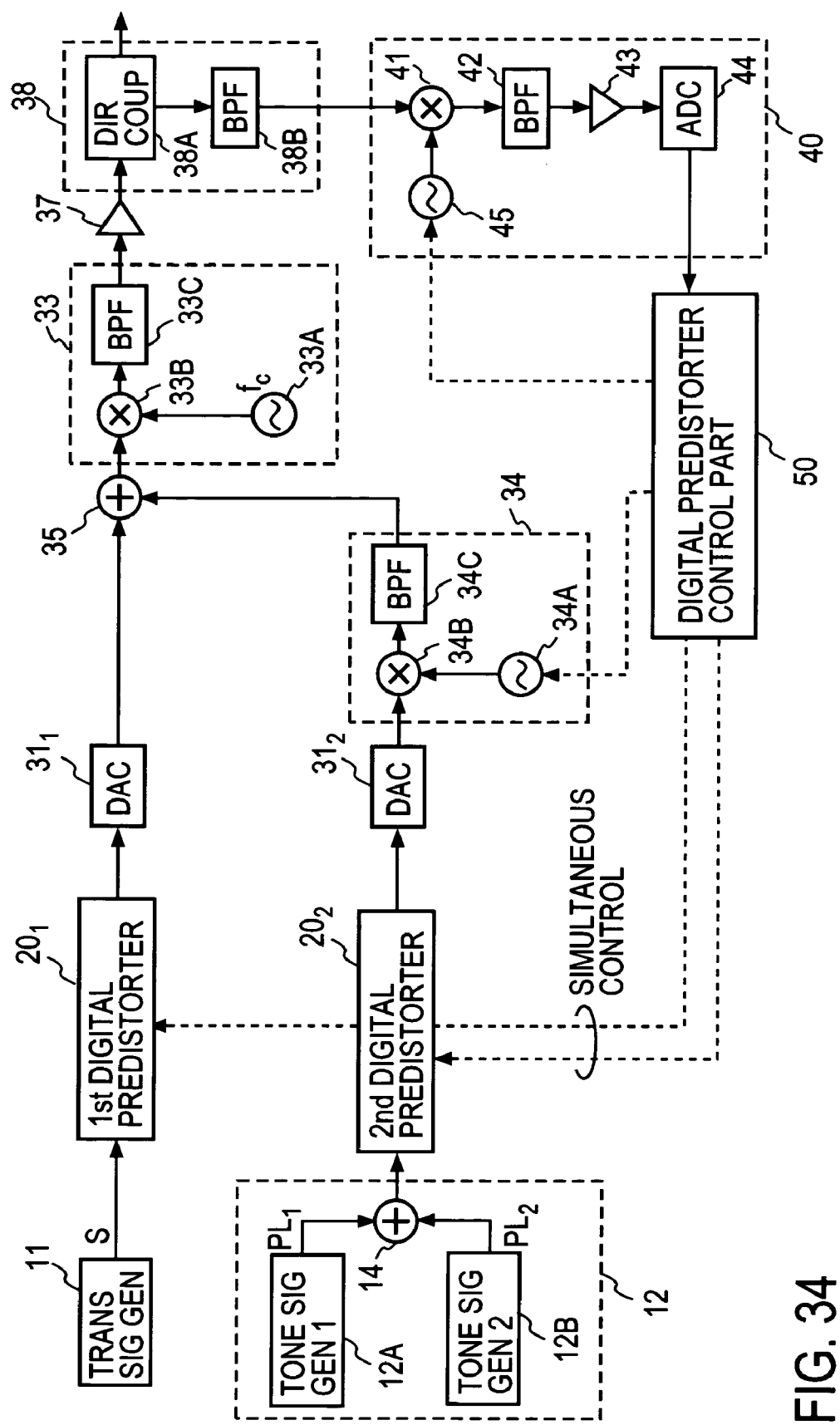
FIG. 34 is a block diagram showing a modified form of the FIG. 32 embodiment.

FIG. 34 illustrates in block form a modified form of the FIG. 32 embodiment. In this embodiment the pilot signals and the transmission signal are predistorted by independent digital predistorters $20_1$ and $20_2$ as in the FIG. 10 embodiment. The digital predistorters $20_1$ and $20_2$ are identical in construction with the predistorter 20 in the FIG. 3 embodiment. The output from the digital predistorter $20_2$ for the pilot signals is converted by a DA converter $31_2$ to an analog signal, which is frequency converted in a first frequency converting part 34 to a frequency band different from that of the transmission signal. By sweep control of the set frequency of the local oscillator 34A of the frequency upconverting part 34 by the digital predistorter control part 50, the pilot signal frequency in the working band of the power amplifier 37 is sweep-controlled. The two digital predistorters $20_1$ and $20_2$ simultaneously control parameters in the digital predistorter control part 50.

In this way, the digital predistorter can be configured taking into account the frequency characteristics of the power amplifier.

EFFECT OF THE INVENTION

As described above, according to the present invention, the pilot signal components are extracted directly from the output of the power amplifier 37 and the odd-order distortion components of a power series model of the digital predistorter are directly feedback-controlled—this permits implementation of a linear power amplifier with small secular and temperature variations.

Moreover, since the odd-order distortions generated by the odd-order distortion generators are compensated for by frequency characteristics inverse to those of the power amplifier, distortions by the power amplifier can be canceled over a wide band.

The present invention produces such effects as listed below.

(1) High-precision distortion compensation can be achieved.

(2) Simple configuration is possible.

(3) A miniature transmitter can be offered.

(4) The distortion compensation can be held optimal for temperature or secular variations.

What is claimed is:

1. A linear power amplifier comprising:
a digital predistorter supplied with a digital transmission signal, for predistorting said digital transmission signal by use of a power series model to generate a predistorted signal;
a DA converter for converting said predistorted signal from said digital predistorter into an analog predistorted signal;
a frequency upconverting part for upconverting said analog predistorted signal to a transmit frequency band;
a power amplifier for power-amplifying said upconverted signal;
a frequency downconverting part for downconverting a portion of the output from said power amplifier to output a downconverted signal; and
a digital predistorter control part for extracting distortion components of the same odd orders as those of said power series model and for controlling coefficients of said digital predistorter in a manner to lower the levels of said odd-order distortion components,
wherein said digital predistorter includes distortion generating paths each containing a series connection of a distortion generator for generating one of distortions based on said power series model and a frequency characteristic compensator, and an adder for adding odd-order distortions from said distortion generating paths to said digital transmission signal and for outputting a combined output as said predistorted signal, said digital predistorter control part includes means for controlling frequency characteristics of said frequency characteristic compensators based on said extracted odd-order distortion components, and said frequency characteristic compensators are formed by FIR filters whose frequency characteristics are controlled by said extracted odd-order components.

2. The linear power amplifier of claim 1, which further comprises a pilot signal generator for generating a digital pilot signal for input to said digital predistorter, and wherein said digital predistorter control part includes means for extracting odd-order distortion components of said digital pilot signal and for controlling the coefficients of said digital predistorter based on said extracted odd-order distortion components.

3. A linear power amplifier comprising:
a first digital predistorter supplied with a digital transmission signal, for predistorting said digital transmission signal by use of a power series model to generate a predistorted signal;
a first DA converter for converting said predistorted signal from said first digital predistorter into an analog predistorted signal;
a first frequency upconverting part for upconverting said analog predistorted signal to a transmit frequency band;
a power amplifier for power-amplifying said upconverted signal; and
a frequency downconverting part for downconverting a portion of the output from said power amplifier to output a downconverted signal,
a pilot signal generator for generating a digital pilot signal;
a second digital predistorter supplied with said digital pilot signal, for predistorting said digital pilot signal by use of a power series model to generate a predistorted pilot signal;
a second DA converter for converting said predistorted pilot signal to an analog predistorted pilot signal;
a second frequency upconverting part for upconverting said analog predistorted pilot signal by use of a predetermined frequency;
a combiner for combining the output from said second frequency upconverting part and said analog predistorted signal, and for inputting said combined signal to said first frequency upconverting part; and
a digital predistorter control part for extracting distortion components of the same odd orders as those of said power series model and for controlling coefficients of said digital predistorter in a manner to lower the levels of said odd-order distortion components.

4. A linear power amplifier comprising:
a first digital predistorter supplied with a digital transmission signal, for predistorting said digital transmission signal by use of a power series model to generate a predistorted signal;
a first DA converter for converting said predistorted signal from said first digital predistorter into an analog predistorted signal;
a first frequency upconverting part for upconverting said analog predistorted signal to a transmit frequency band;
a power amplifier for power-amplifying said upconverted signal;
a frequency downconverting part for downconverting a portion of the output from said power amplifier to output a downconverted signal;
a pilot signal generator for generating a digital pilot signal;

a second digital predistorter supplied with said digital pilot signal, for predistorting said digital pilot signal by use of a power series model to generate a predistorted pilot signal;
a second DA converter for converting said predistorted pilot signal to an analog predistorted pilot signal;
a second frequency upconverting part for upconverting said analog predistorted pilot signal to a send frequency band by use of a predetermined second frequency different from said first frequency;
a combiner for combining the output from said first frequency upconverting part and the output from said second frequency upconverting part, and for inputting said combined output to said power amplifier; and
a digital predistorter control part for extracting distortion components of the same odd orders as those of said power series model and for controlling coefficients of said digital predistorter in a manner to lower the levels of said odd-order distortion components.

5. The linear power amplifier of any one of claims 2, 3 and 4, wherein said first frequency upconverting part converts said digital pilot signal to a frequency different from the frequency of said transmission signal.

6. The linear power amplifier of any one of claims 2, 3 and 4, wherein said digital predistorter includes: delay means for delaying said digital pilot signal and said digital transmission signal; distortion generating means for generating, in said digital pilot signal and said digital transmission signal, one or more predetermined odd-order ones of the distortion components expressed by a power series model; and adding means for combining said odd-order distortion components and the output from said delay means to provide said predistorted signal.

7. The linear power amplifier of any one of claims 2, 3 and 4, wherein said frequency downconverting part includes an AD converter for converting said digital pilot signal component to a digital signal.

8. The linear power amplifier of claim 5, wherein said digital pilot signal is a combined version of two tone signals of different frequencies but of the same level.

9. The linear power amplifier of claim 5, wherein said digital pilot signal is a modulated signal of a band narrower than that of said transmission signal.

10. The linear power amplifier of any one of claims 2, 3 and 4, wherein said digital predistorter control part includes: a distortion component extracting part for detecting said predetermined one or more odd-order ones of the distortion components, expressed by a power series model of said digital pilot signal, from said digital pilot signal component; and odd-order distortion characteristic control part for controlling, based on said detected distortion components, phases and amplitudes of the corresponding one or more predetermined odd-order distortion components to be generated by said digital predistorter.

11. The linear power amplifier of any one of claims 2, 3 and 4, wherein said digital predistorter control part includes:
delay means for generating a delayed digital pilot signal from said digital pilot signal;
distortion generating means for generating distortions of other odd orders than said predetermined odd orders from said digital pilot signal;
subtracting means for subtracting said delayed digital pilot signal and said distortions of said other odd orders from said digital pilot signal component to detect said desired odd-order distortion components; and
an odd-order distortion characteristic control part for controlling, based on said detected odd-order distortion components, phases and amplitudes of the corresponding one or more predetermined odd-order distortion components to be generated by said digital predistorter.

12. A linear power amplifier comprising:
a digital predistorter supplied with a digital transmission signal, for predistorting said digital transmission signal by use of a power series model to generate a predistorted signal;
a DA converter for converting said predistorted signal from said digital predistorter into an analog predistorted signal;
a frequency upconverting part for upconverting said analog predistorted signal to a transmit frequency band;
a power amplifier for power-amplifying said upconverted signal;
a frequency downconverting part for downconverting a portion of the output from said power amplifier to output a downconverted signal;
a digital predistorter control part for extracting distortion components of the same odd orders as those of said power series model and for controlling coefficients of said digital predistorter in a manner to lower the levels of said odd-order distortion components;
a pilot signal generator for generating a digital pilot signal for input to said digital predistorter, and wherein said digital predistorter control part includes means for extracting odd-order distortion components of said digital pilot signal and for controlling the coefficients of said digital predistorter based on said extracted odd-order distortion components;
a band separator for separating a predistorted transmission signal component and a predistorted pilot signal from said predistorted signal, and for inputting said predistorted transmission signal component to said DA converter;
a second DA converter for said predistorted pilot signal component to an analog predistorted pilot signal component;
a second frequency upconverting part for upconverting said analog predistorted pilot signal component to said send frequency band by use of a second frequency different from a frequency used by said frequency upconverting part; and
an adder for combining the output from said DA converter and the output from said second frequency upconverting part, and for inputting said combined output as said predistorted signal to said frequency upconverting part.

13. A linear power amplifier comprising:
a digital predistorter supplied with a digital transmission signal, for predistorting said digital transmission signal by use of a power series model to generate a predistorted signal;
a DA converter for converting said predistorted signal from said digital predistorter into an analog predistorted signal;
a frequency upconverting part for upconverting said analog predistorted signal to a transmit frequency band;
a power amplifier for power-amplifying said upconverted signal;
a frequency downconverting part for downconverting a portion of the output from said power amplifier to output a downconverted signal;
a digital predistorter control part for extracting distortion components of the same odd orders as those of said power series model and for controlling coefficients of said digital predistorter in a manner to lower the levels of said odd-order distortion components;
a pilot signal generator for generating a digital pilot signal for input to said digital predistorter, and wherein said digital predistorter control part includes means for extracting odd-order distortion components of said digital pilot signal and for controlling the coefficients of said digital predistorter based on said extracted odd-order distortion components;
a band separator for separating a predistorted transmission signal component and a predistorted pilot signal from said predistorted signal, and for inputting said predistorted transmission signal component to said DA converter;
a second DA converter for said predistorted pilot signal component to an analog predistorted pilot signal component;
a second frequency upconverting part for upconverting said analog predistorted pilot signal component to said send frequency band by use of a second frequency different from a frequency used by said frequency upconverting part; and
an adder for combining the output from said DA converter and the output from said second frequency upconverting part, and for inputting said combined output as said predistorted signal to said power amplifier,
wherein said frequency downconverting part downconverts said extracted pilot signal by use of said second frequency.

14. A linear power amplifier comprising:
a digital predistorter supplied with a digital transmission signal, for predistorting said digital transmission signal by use of a power series model to generate a predistorted signal;
a DA converter for converting said predistorted signal from said digital predistorter into an analog predistorted signal;
a frequency upconverting part for upconverting said analog predistorted signal to a transmit frequency band;
a power amplifier for power-amplifying said upconverted signal;
a frequency downconverting part for downconverting a portion of the output from said power amplifier to output a downconverted signal; and
a digital predistorter control part for extracting distortion components of the same odd orders as those of said power series model and for controlling coefficients of said digital predistorter in a manner to lower the levels of said odd-order distortion components,
wherein said digital predistorter includes distortion generating paths each containing a series connection of a distortion generator for generating one of distortions based on said power series model and a frequency characteristic compensator, and an adder for adding odd-order distortions from said distortion generating paths to said digital transmission signal and for outputting said combined output as said predistorted signal; an said digital predistorter control part includes means for controlling frequency characteristics of said frequency characteristic compensators based on said extracted odd-order distortion components, and
said frequency characteristic compensators each include: a Fourier transformer for transforming a time domain digital signal to a frequency domain digital signal; a coefficient multiplier for multiplying said frequency domain digital signal by a coefficient based on one of said odd-order distortion components; and an inverse Fourier transformer for transforming the output from said coefficient multiplier to a time domain digital signal.

15. The linear power amplifier of claim 1 or 14, wherein said digital predistorter includes:
   a linear transfer path and said distortion generating path to which said digital transmission signal is divided;
   a gain adjuster and a phase adjuster disposed at the output side of said distortion generator on said distortion generating path, for adjusting amplitudes and phases of said odd-order distortions;
   a delay device disposed in said liner transfer path; and
   a combiner for combining the output from said linear transfer path and the output from said distortion generating path, and for outputting the combined output as said predistorted signal; and
   wherein said digital predistorter control part includes an odd-order distortion characteristic control part for controlling said gain adjuster and said phase adjuster to adjust the amplitudes and phases of said odd-order distortions.

16. The linear power amplifier of claim 1 or 14, further comprising a pilot signal generator for generating a adigital pilot signal of a band different from the band of said transmission signal, and for providing said digital pilot signal to said digital predistorter, wherein said digital predistorter control part extracts odd-order distortions of said digital pilot signal as said odd-order distortion components.

17. The linear power amplifier of claim 1 or 14, further comprising:
   a pilot signal generator for generating a adigital pilot signal;
   another digital predistorter having the same configuration as that of said digital predistorter and supplied with said digital pilot signal;
   another DA converter for converting the output from said another digital predistorter to an analog signal;
   another frequency upconverting part for upconverting the output from said another DA converter to a band different from the band of said transmission signal; and
   a combiner for combining the output from said DA converter and the output from said another frequency upconverting part, and for providing said combined output to said frequency upconverting part; and
   wherein said digital predistorter control part extracts odd-order distortion components of said digital pilot signal as said odd-order distortion components.

18. The linear power amplifier of claim 16, wherein said digital pilot signal is a combined version of two tone signals of different frequencies but of the same level.

19. The linear power amplifier of claim 16, wherein said digital pilot signal is a modulated signal of a band narrower than the band of said transmission signal.

20. The linear power amplifier of claims 1 or 14, further comprising a pilot signal generator for generating a digital pilot signal and a second digital pilot signal each having the same amplitude, said two digital pilot signals being input to said digital predistorter and thence to said power amplifier via said DA converter and said frequency upconverting part, and wherein said digital predistorter control part includes: a distortion component detecting part for detecting, as said odd-order distortion components, intermodulation distortion components resulting from amplification of said two digital pilot signals by said power amplifier; and a frequency characteristic control part for estimating frequency characteristics of a transmission route from said intermodulation distortion components detected by said distortion component detecting part, and for controlling frequency characteristics of said frequency characteristic compensators.

21. The linear power amplifier of claim 20, wherein said digital predistorter control part includes a frequency controller for controlling said digital pilot signal generator to change the frequency interval between said two digital pilot signals.

22. The linear power amplifier of claim 20, wherein said frequency upconverting part includes a local oscillator for generating a variable frequency local signal for upconverting said analog predistorted signal by a variable frequency, and said digital predistorter control part includes a frequency controller for causing said two digital pilot signals to perform discontinuous frequency sweep in the operating band of said power amplifier by discontinuous frequency sweep of the oscillation frequency of said local oscillator.

23. The linear power amplifier of claim 14, wherein said frequency characteristic compensators are each disposed at the input and/or output side of the corresponding distortion generator.

24. A digital predistortion method using the linear amplifier recited in any one of claims 2, 3 and 4, said method comprising the steps of:
   (a) generating said digital pilot signal;
   (b) combining said digital pilot signal and said digital transmission signal, generating distortion components of a predetermined number of odd-orders based on a power series model, and adding said odd-order distortion components to generate a predistorted signal;
   (c) converting said predistorted signal to an analog predistorted signal;
   (d) upconverting said analog predistorted signal to the send frequency band by a predetermined carrier frequency;
   (e) power amplifying said upconverted signal;
   (f) downconverting a portion of said power-amplified output signal and outputting a pilot signal component; and
   (g) controlling coefficients of said digital predistorter based on said digital pilot signal component so that levels of said odd-order distortion components by said power series model become lower.

25. The method of claim 24, wherein said step (g) includes a step of repeatedly adjusting the coefficients of said digital predistorter so that the level ratios of said odd-order distortion components to said transmission signal becomes smaller go down below a predetermined value.

26. The method of claim 24, wherein said step (a) includes a step of generating, as said digital pilot signal, two digital tone signals of the same level but of different frequencies.

27. A predistortion method using the linear power amplifier of claim 20, said method comprising the steps of:
   (a) setting the frequency interval between said two digital pilot signals;
   (b) measuring upper- and lower-side distortion components of said two digital pilot signals from the output from said power amplifier;
   (c) comparing said upper- and lower-side distortion components with preset reference values, determining gains and phases of the corresponding frequencies of said frequency characteristic compensators so that said upper- and lower-side distortion components become smaller than said reference values, and storing values of said determined gains and phases in storage means;
   (d) repeating said steps (a), (b) and (c) a plurality of times while changing said frequency interval between said two digital pilot signals for each round of steps;

(e) obtaining frequency characteristics of gains and phases by interpolation from said values of the gains and phases for respective frequencies stored in said storage means; and (f) setting said frequency characteristics of said gain and phases in said frequency characteristic compensators provided in said distortion generating paths.

28. A predistortion method using the linear power amplifier of claim 20, said method comprising the steps of:
(a) setting local oscillation frequency of said frequency upconverting part;
(b) measuring distortion components of said two digital pilot signals from the output from said power amplifier;
(c) comparing said measured distortion components with preset reference values, determining gains and phases of the corresponding frequencies of frequency characteristic compensators so that said distortion components become smaller than said reference values, and storing said values of the determined gains and phases in storage means;
(d) repeating said steps (a), (b) and (c) a plurality of times while changing said frequency interval between said two digital pilot signals for each round of steps;
(e) obtaining frequency characteristics of gains and phases by interpolation from said values of the gains and phases for respective frequencies stored in said storage means; and
(f) setting said frequency characteristics of said gain and phases in said frequency characteristic compensators.

29. The predistortion method of claim 27, further comprising a step of setting phase adjusters and gain adjusters on said distortion generating path so that said measured distortion components become smaller than predetermined fixed values.

30. A linear power amplification method comprising the steps of:
(a) inputting a digital signal and a digital pilot signal to a digital predistorter, and adding said digital signal and said digital pilot signal with a predetermined number of odd-order distortion components based on a power series model to generate a predistorted signal;
(b) converting said predistorted signal to an analog predistorted signal;
(c) upconverting said analog predistorted signal to a send frequency band by use of a predetermined carrier frequency;
(d) power amplifying said upconverted signal;
(e) downconverting a portion of said power-amplified output signal to extract odd-order distortion components; and
(f) controlling coefficients of said digital predistorter so that the level ratios of said odd-order distortion components to a transmission signal each become smaller than a predetermined value,
wherein said step (a) includes the steps of: generating said digital pilot signal; and combining said digital pilot signal and a digital transmission signal, and outputting said combined output as said digital signal, and
said step (a) is the step of combining two digital tones signals of different frequencies but of the same level to generate said digital pilot signal, and said step (e) is a step of extracting odd-order distortion components of said digital pilot signal.

31. A linear power amplification method comprising the steps of:

(a) inputting a digital signal and a digital pilot signal to a digital predistorter, and adding said digital signal and said digital pilot signal with a predetermined number of odd-order distortion components based on a power series model to generate a predistorted signal;
(b) converting said predistorted signal to an analog predistorted signal;
(c) upconverting said analog predistorted signal to a send frequency band by use of a predetermined carrier frequency;
(d) power amplifying said upconverted signal;
(e) downconverting a portion of said power-amplified output signal to extract odd-order distortion components; and
(f) controlling coefficients of said digital predistorter so that the level ratios of said odd-order distortion components to a transmission signal each become smaller than a predetermined value,
wherein said step (a) includes the step of controlling frequency characteristics of said odd-order distortion components by frequency characteristic compensators, and said step (f) includes the step of repeatedly adjusting coefficients of said frequency characteristic compensators so that the level ratio of said extracted odd-order distortion components to said transmission signal level become smaller than predetermined values.

32. A linear power amplification method comprising the steps of:
(a) inputting a digital signal and a digital pilot signal to a digital predistorter, and adding said digital signal and said digital pilot signal with a predetermined number of odd-order distortion components based on a power series model to generate a predistorted signal;
(b) converting said predistorted signal to an analog predistorted signal;
(c) upconverting said analog predistorted signal to a send frequency band by use of a predetermined carrier frequency;
(d) power amplifying said upconverted signal;
(e) downconverting a portion of said power-amplified output signal to extract odd-order distortion components; and
(f) controlling coefficients of said digital predistorter so that the level ratios of said odd-order distortion components to a transmission signal each become smaller than a predetermined value,
wherein said step (f) further includes the step of repeatedly controlling gains and phases of said odd-order distortion components by said digital predistorter in a manner to decrease the levels of said extracted odd-order distortion components.

33. The linear power amplifier of claim 17, wherein said digital pilot signal is a combined version of two tone signals of different frequencies but of the same level.

34. The linear power amplifier of claim 17, wherein said digital pilot signal is a modulated signal of a band narrower than the band of said transmission signal.

35. The predistortion method of claim 28, further comprising a step of setting phase adjusters and gain adjusters on said distortion generating path so that said measured distortion components become smaller than predetermined fixed values.

* * * * *